US009491385B2

(12) United States Patent
Tokunaga

(10) Patent No.: US 9,491,385 B2
(45) Date of Patent: Nov. 8, 2016

(54) SWITCHED CAPACITOR CIRCUIT AND METHOD FOR DRIVING THE SAME

(71) Applicant: Panasonic Corporation, Osaka (JP)

(72) Inventor: Yusuke Tokunaga, Hyogo (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/749,951

(22) Filed: Jun. 25, 2015

(65) Prior Publication Data

US 2016/0037108 A1 Feb. 4, 2016

Related U.S. Application Data

(63) Continuation of application No. PCT/JP2014/003335, filed on Jun. 20, 2014.

(30) Foreign Application Priority Data

Jul. 9, 2013 (JP) .................................. 2013-143994

(51) Int. Cl.
*H04N 3/14* (2006.01)
*H04N 5/335* (2011.01)
(Continued)

(52) U.S. Cl.
CPC ................ *H04N 5/374* (2013.01); *G01K 1/00* (2013.01); *G06G 7/186* (2013.01); *H03H 19/004* (2013.01);
(Continued)

(58) Field of Classification Search
CPC ........ H04N 5/374; G01K 1/00; G06G 7/186; H03K 3/356104; H03K 19/018521; H03M 1/1245

USPC ......... 348/300; 341/108–117, 122–125, 172, 341/139, 150, 155
See application file for complete search history.

(56) References Cited

U.S. PATENT DOCUMENTS 7,800,427 B2 9/2010 Chae et al.
7,924,206 B2 4/2011 Sano
(Continued)

FOREIGN PATENT DOCUMENTS

| JP | 2011-205540 | 10/2011 |
|---|---|---|
| JP | 2013-504920 | 2/2013 |
| WO | 2011/031003 | 3/2011 |

OTHER PUBLICATIONS

International Search Report issued in International Application No. PCT/JP2014/003335.
(Continued)

*Primary Examiner* — Tuan Ho
*Assistant Examiner* — Zhenzhen Wu
(74) *Attorney, Agent, or Firm* — Wenderoth, Lind & Ponack, L.L.P.

(57) ABSTRACT

A switched capacitor circuit includes: a capacitor including a first terminal to which the input voltage is applied and a second terminal; an inverting amplifier including a second input terminal connected to the second terminal; a capacitor including a third terminal, a fourth terminal, and a fifth terminal which is connected to an output terminal; a capacitor including a seventh terminal, a sixth terminal connected to the second output terminal, and an eighth terminal connected to the third terminal; a capacitor connected in series between the second terminal and the output terminal; and an offset compensation unit which outputs an offset voltage having a value of a short-circuit voltage of the inverting amplifier to the fourth terminal and the seventh terminal.

35 Claims, 37 Drawing Sheets

(51) Int. Cl.

| | | |
|---|---|---|
| *H04N 5/374* | (2011.01) | |
| *G06G 7/186* | (2006.01) | |
| *H03H 19/00* | (2006.01) | |
| *G01K 1/00* | (2006.01) | |
| *H03K 3/356* | (2006.01) | |
| *H03M 1/12* | (2006.01) | |
| *H03K 19/0185* | (2006.01) | |
| *H04N 5/378* | (2011.01) | |

(52) U.S. Cl.
CPC ..... *H03K 3/356104* (2013.01); *H03K 19/018521* (2013.01); *H03M 1/1245* (2013.01); *H04N 5/378* (2013.01)

(56) References Cited

U.S. PATENT DOCUMENTS

| 8,723,597 | B2 | 5/2014 | Han et al. | |
|---|---|---|---|---|
| 2009/0244335 | A1* | 10/2009 | Chou | H04N 5/2173 348/294 |
| 2010/0045495 | A1* | 2/2010 | Sano | G11C 27/026 341/110 |
| 2012/0068766 | A1 | 3/2012 | Buter et al. | |
| 2012/0229204 | A1 | 9/2012 | Han et al. | |
| 2012/0249237 | A1 | 10/2012 | Garrity et al. | |
| 2014/0009316 | A1* | 1/2014 | Chou | H03F 3/005 341/110 |
| 2014/0070976 | A1* | 3/2014 | Hurrell | G11C 27/02 341/172 |

OTHER PUBLICATIONS

Y. Chae, et al., "A 2. 1 M Pixels, 120 Frames/s CMOS Image Sensor With Column-Parallel Δ Σ ADC Architecture", IEEE J. Solid-State Circuits, vol. 46, No. 1, pp. 236-247, Jan. 2011.

B.R. Gregoire, et al., "An Over-60 dB True Rail-to-Rail Performance Using Correlated Level Shifting and an Opamp With Only 30 dB Loop Gain", IEEE J. Solid-State Circuits, vol. 43, No. 12, pp. 2620-2630, Dec. 2008.

M.A.P. Pertijs, et al., "A CMOS Smart Temperature Sensor with a 3σ Inaccuracy of ±O. 1° C. From—55° C. to 125° C.", IEEE J. Solid-State Circuits, vol. 40, No. 12, pp. 2805-2815, Dec. 2005.

* cited by examiner

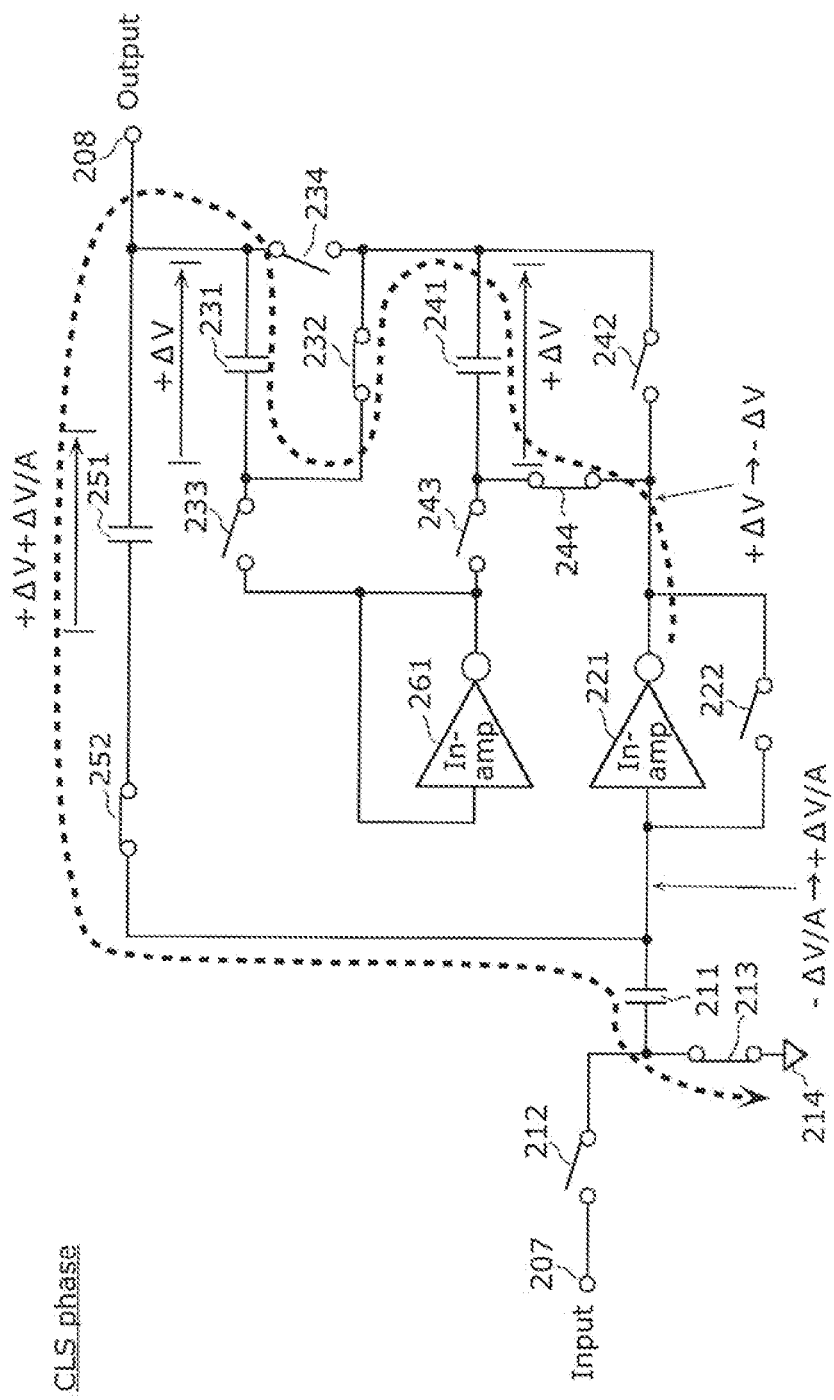

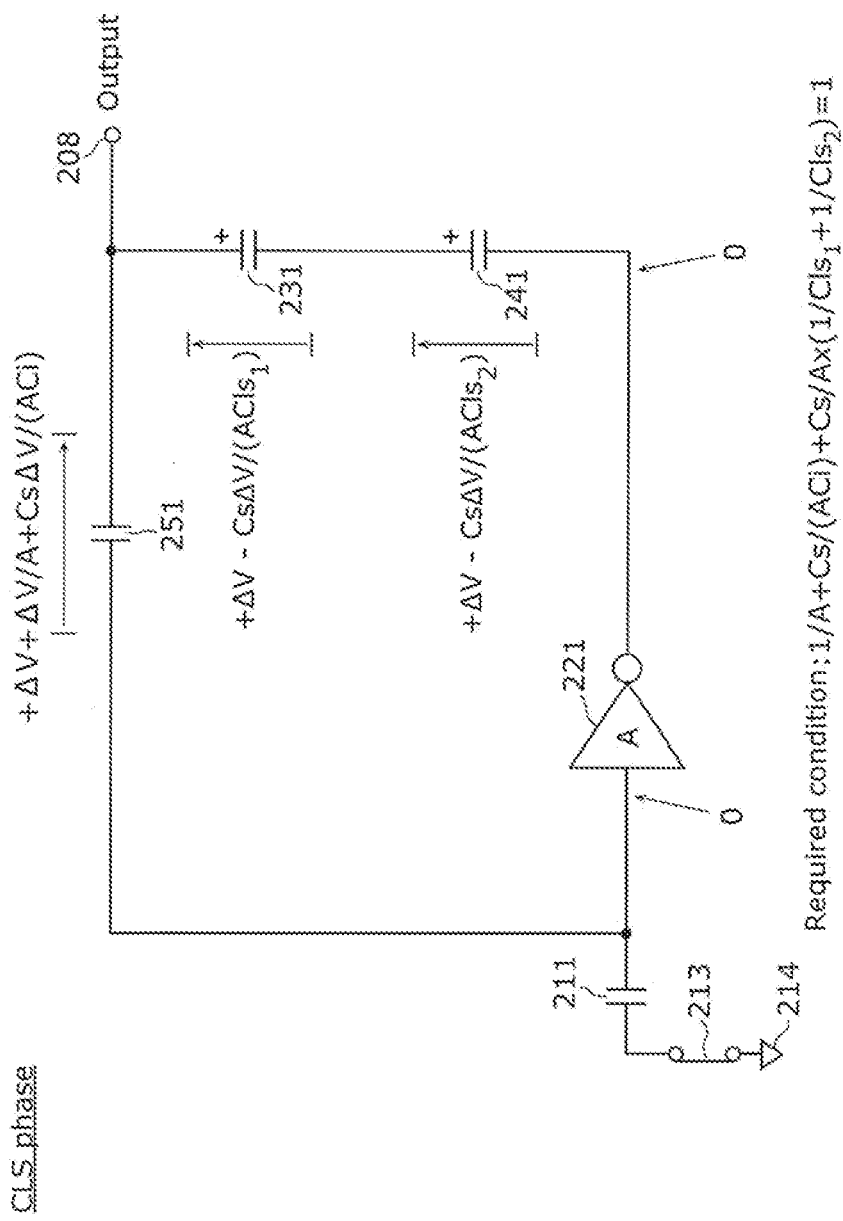

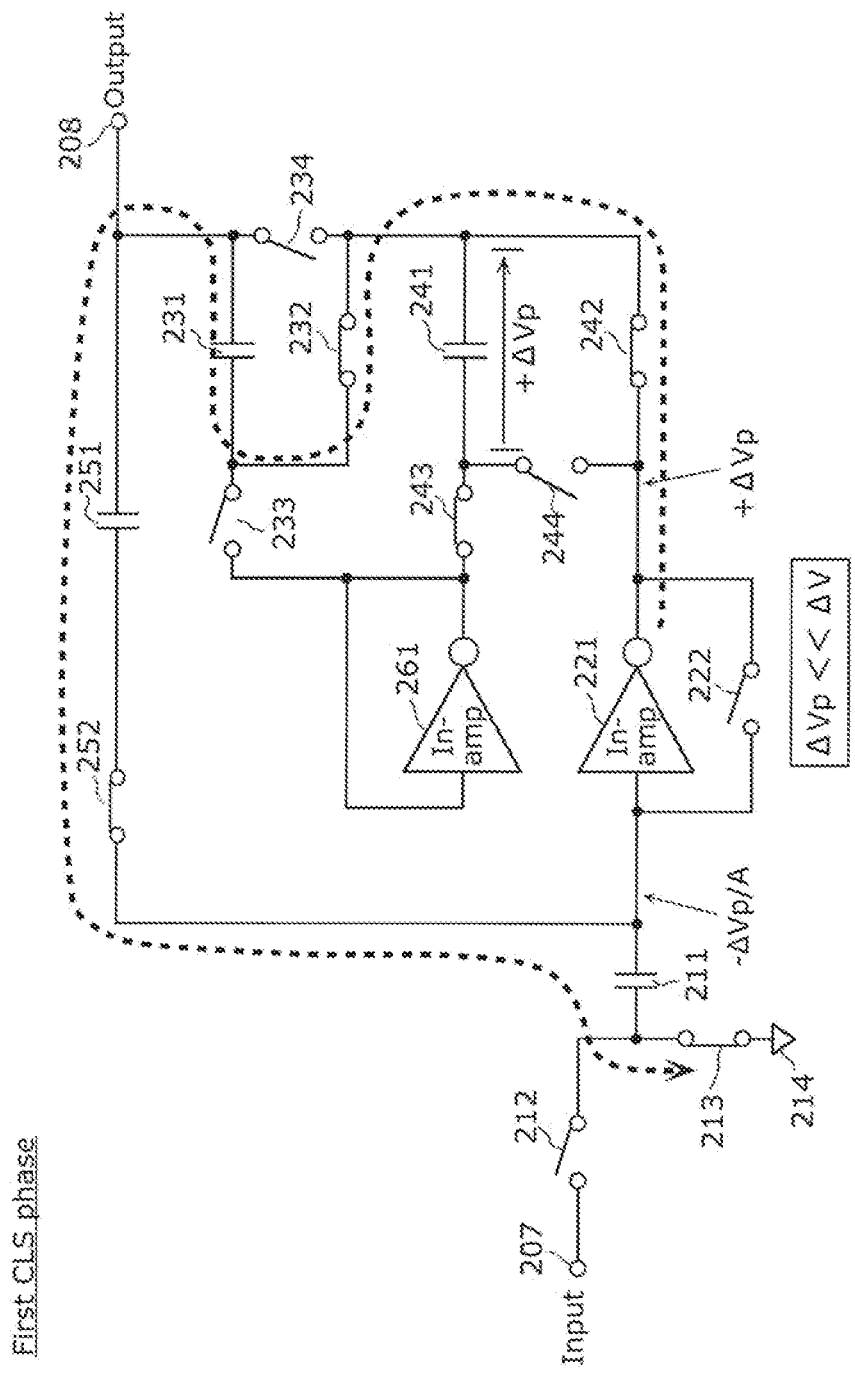

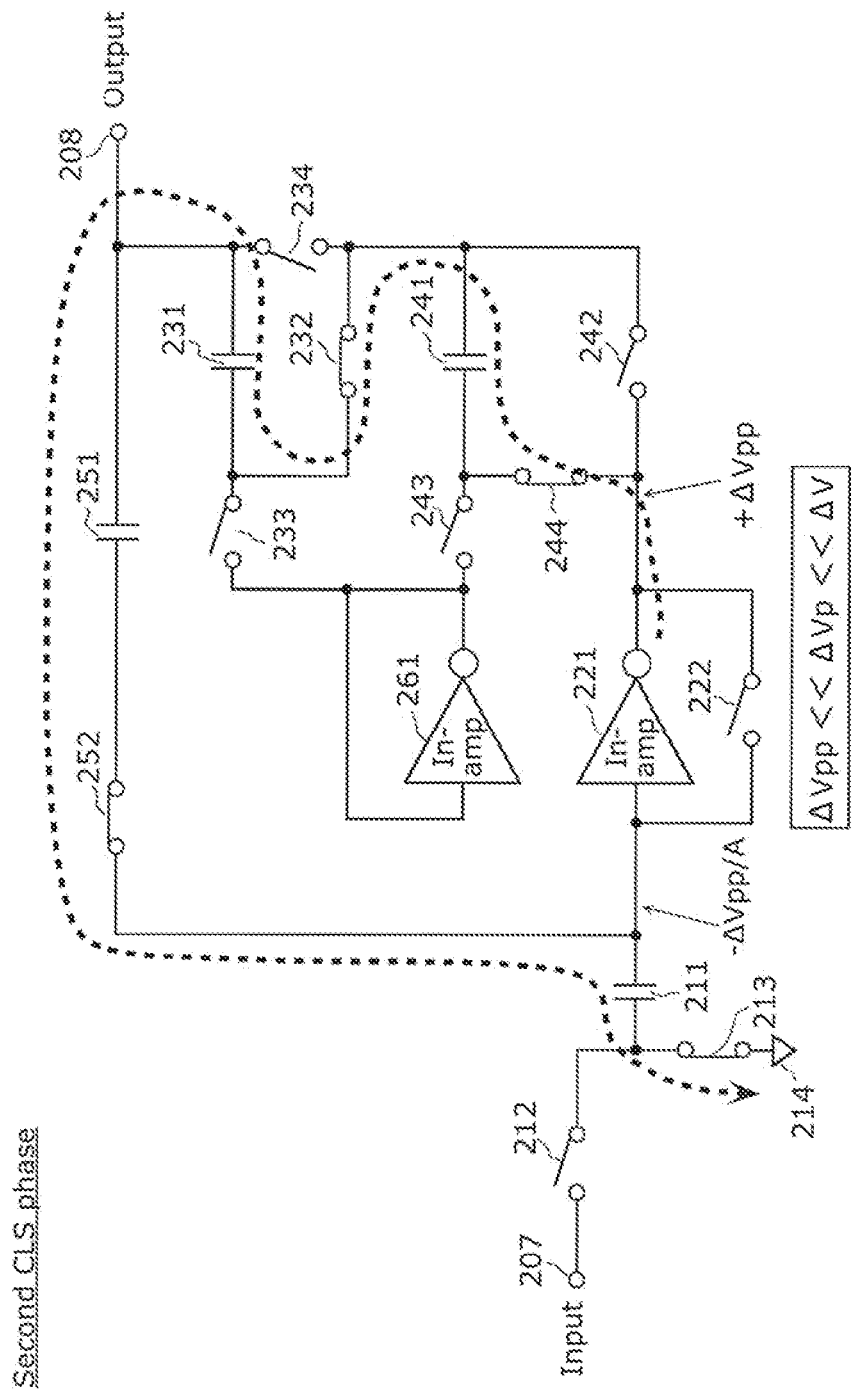

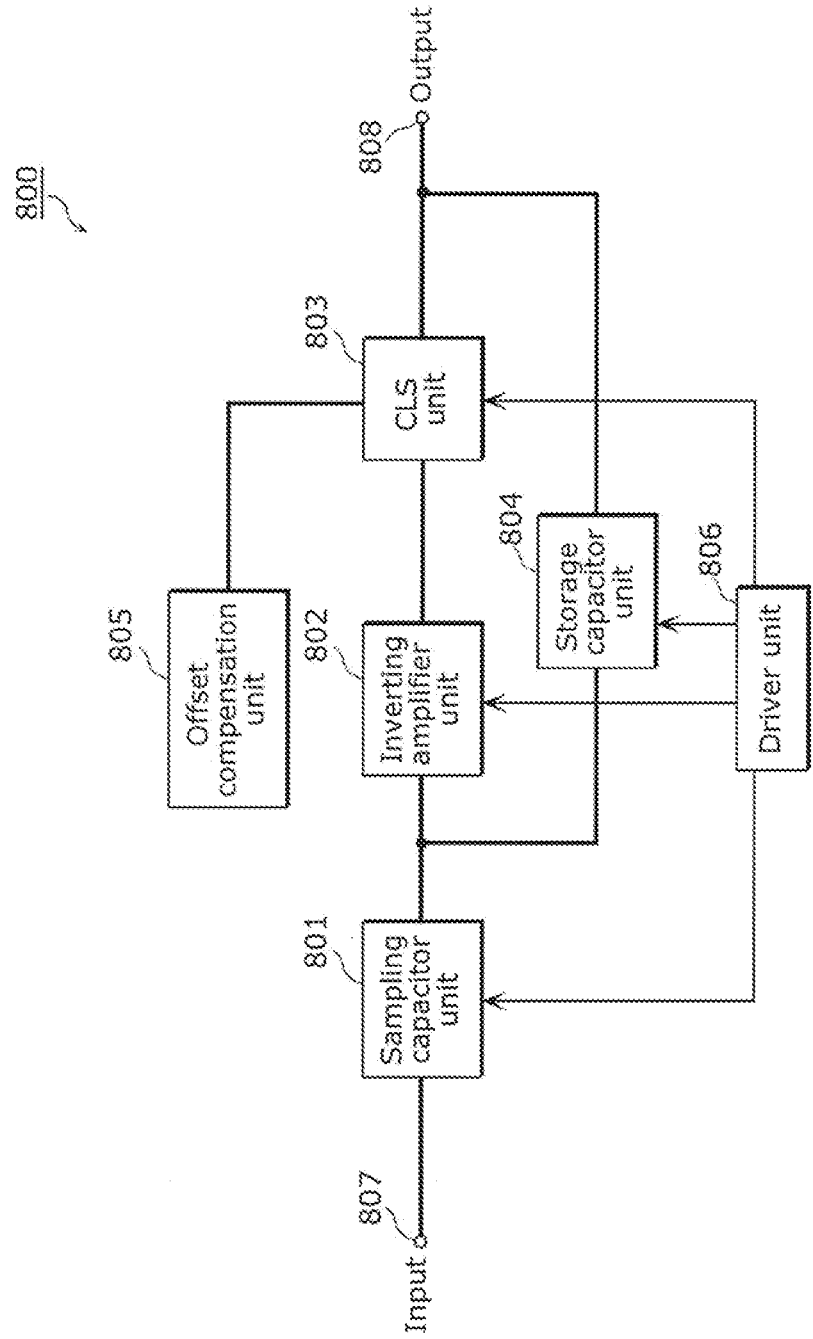

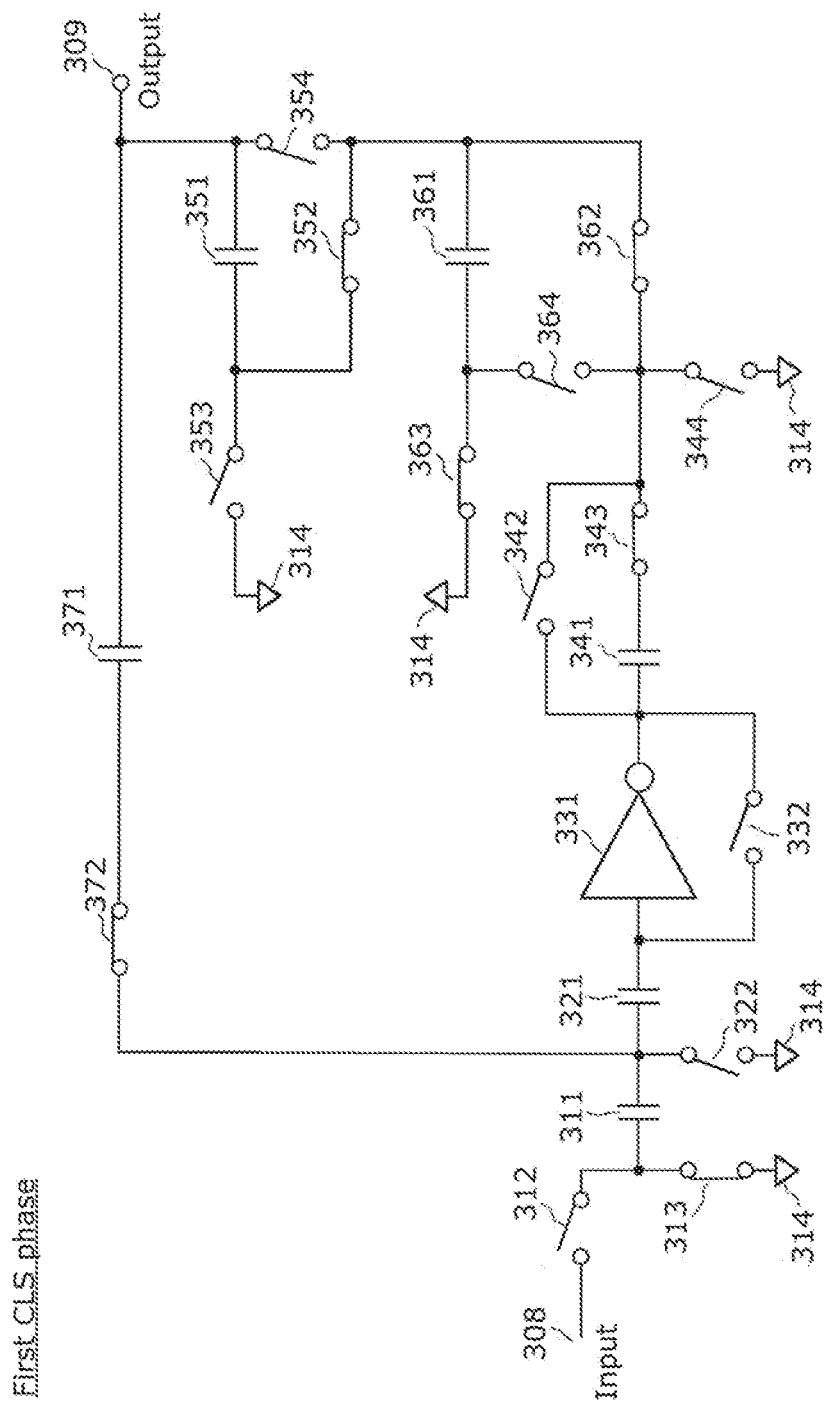

Second CLS phase

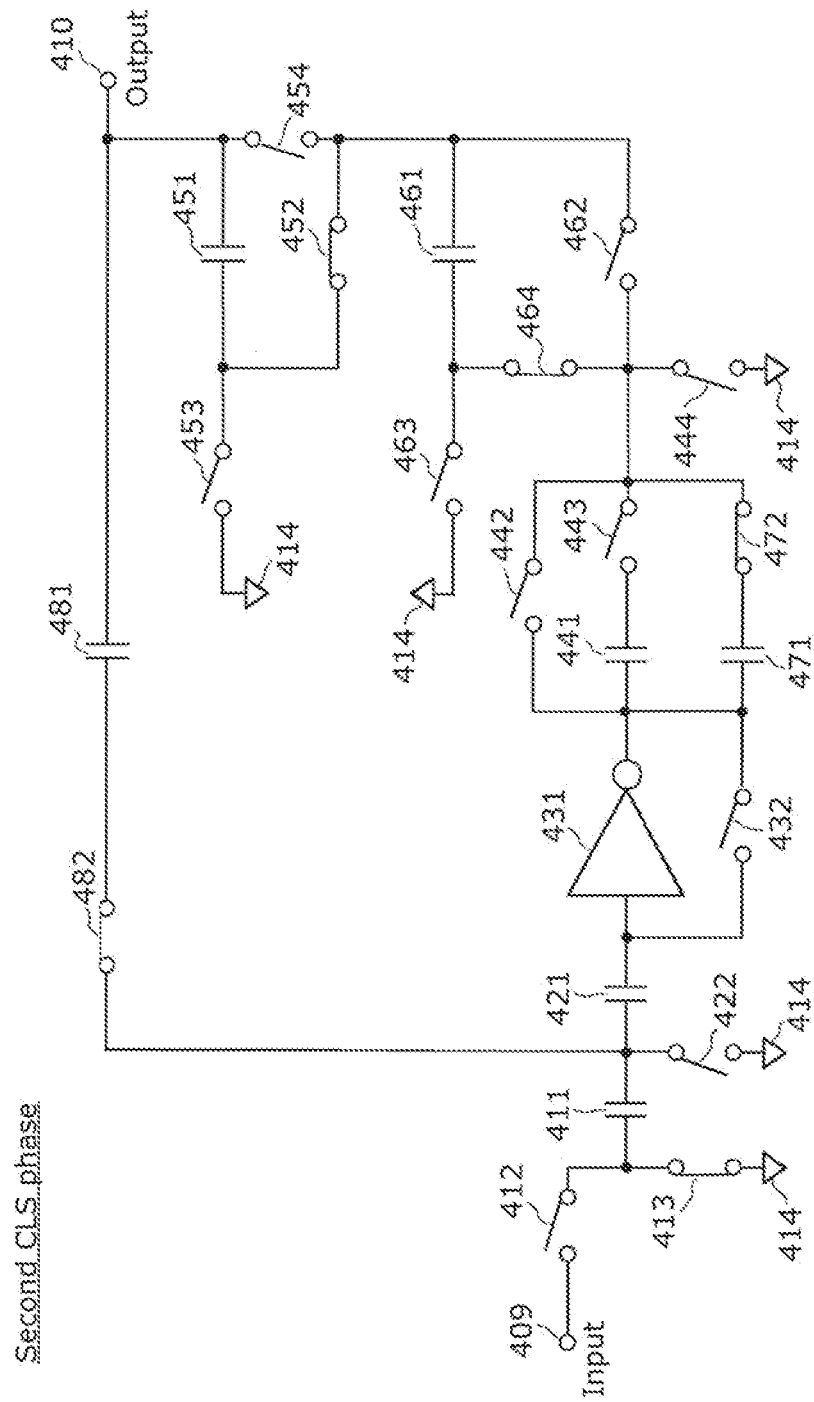

SWITCHED CAPACITOR CIRCUIT AND METHOD FOR DRIVING THE SAME

CROSS REFERENCE TO RELATED APPLICATIONS

This is a continuation application of PCT International Application No. PCT/JP2014/003335 filed on Jun. 20, 2014, designating the United States of America, which is based on and claims priority of Japanese Patent Application No. 2013-143994 filed on Jul. 9, 2013. The entire disclosures of the above-identified applications, including the specifications, drawings and claims are incorporated herein by reference in their entirety.

FIELD

One or more exemplary embodiments disclosed herein relate generally to relates to a switched capacitor circuit and a method of driving the switched capacitor circuit, and particularly to a switched capacitor circuit which performs correlated level shifting.

BACKGROUND

Accuracy of integrators and sample-and-hold circuits including conventional switched capacitor circuits depends on gain of inverting amplifiers included in the switched capacitor circuits. However, since high gain amplifiers generally have the drawbacks of high current consumption and low operation speed, power consumption and operation speed problems are involved in using such high gain amplifiers to increase accuracy of integrators and sample-and-hold circuits.

There has been proposed a technique to provide a high-speed inverting amplifier which includes an inverter as an amplifier in Non-Patent Literature (NPL) 1. An inverter amplifier is capable of driving at a large current during nonlinear operation, and is therefore suitable as a high speed inverting amplifier. However, the gain of the inverter amplifier is 30 dB at most. An integrator or a sample-and-hold circuit including the inverter amplifier cannot achieve high accuracy alone.

In NPL 2, a technique of correlated level shifting (hereinafter referred to as CLS) is proposed to address the problem. For example, in an integration circuit or a sample-and-hold circuit to which the technique of CLS is applied, a compensation capacitor connected in parallel with a storage capacitor is charged, and is then connected in series between an amplifier output terminal and an integration capacitor, so that the output voltage of the integration circuit or the sample-and-hold circuit has a "raised level" (upward level shift). In this case, the bottom level of the voltage (shifted upward) at an output terminal of the amplifier is substantially equal to the voltage level in an autofeedback state, so that input-referred offset due to output fluctuation is minimized. Accordingly, the proposed integrator with a low gain amplifier using the technique of CLS operates as accurate as an integrator with a high gain amplifier.

FIG. 26 illustrates a configuration of a conventional switched capacitor circuit disclosed in NPL 2. The switched capacitor circuit disclosed in FIG. 26 functions as a two-fold amplifier in which the technique of CLS is used. The switched capacitor circuit includes capacitors 1001, 1002, and 1004, an operational amplifier 1003, switches 1005, 1006, 1007, and 1008, a reference voltage source 1009, an input terminal 1010, and an output terminal 1011. The switched capacitor circuit in operation transits from a sampling phase to a transfer phase to a CLS phase in this order according to ON-OFF control of the switches. These phases of the switched capacitor circuit never overlap each other at any time. The following describes operation of the switched capacitor circuit in each of the phases.

FIG. 27A, FIG. 27B, and FIG. 27C are circuit diagrams illustrating connection in the switched capacitor circuit disclosed in NPL 2 in the sampling phase, transfer phase, and CLS phase, respectively.

As illustrated in FIG. 27A, in the sampling phase, the switches 1005 and 1006 are connected to the input terminal 1010, the switch 1007 is closed, one of the switches 1008 connects the reference voltage source 1009 and the capacitor 1004, and the other of the switches 1008 connects the output port of the operational amplifier 1003 and the output terminal 1011. With this connection, the capacitor 1001 stores a charge of C·Vin [C] with an electrode on the left side in FIG. 27A being a positive electrode, where the voltage at the input terminal 1010 is Vin [V] and the reference voltage of the reference voltage source 1009 is 0 [V]. At the same time, the capacitor 1002 stores a charge of C·Vin [C] with an electrode on the right side in FIG. 27A being a positive electrode.

In the transfer phase following the sampling phase, as illustrated in FIG. 27B, the switch 1005 is connected to the reference voltage source 1009, the switch 1006 is connected to the output terminal 1011, the switch 1007 is open, and the connection of the switches 1008 are maintained. With this connection, transfer of the charge stored in the capacitor 1001 to the capacitor 1002 starts. In other words, the voltage across the capacitor 1002 increases toward 2 Vin [V]. Furthermore, the operational amplifier 1003 drives the capacitor 1004, so that the voltage across the capacitor 1004 also increases toward 2 Vin [V].

However, when the gain of the operational amplifier 1003 is insufficient, the voltage at the negative input terminal of the operational amplifier 1003 (that is, the virtual ground voltage of the system) floats. Thus, not the whole charge of the capacitor 1001 is transferred to the capacitor 1002, and the voltage at the output terminal 1011 does not reach 2 Vin [V]. Such insufficient increase of the voltage at the output terminal 1011 is caused by a large difference of voltage at the output port of the operational amplifier 1003 (approximately 2 Vin [V]) from the virtual ground voltage (equal to the voltage of the reference voltage source 1009).

In the CLS phase following the transfer phase, as illustrated in FIG. 27C, the connection or disconnection of each of the switches 1005, 1006, and 1007 is maintained, and the one of the switches 1008 connects the output port of the operational amplifier 1003 and the capacitor 1004, and the other of the switches 1008 is open. With this connection, the capacitor 1004 is connected between the output port of the operational amplifier 1003 and the output terminal 1011. The voltage across the capacitor 1004 is approximately 2 Vin [V], which produces the "level-raising" effect (level-shifting effect) and thereby the voltage at the output port of the operational amplifier 1003 changes from approximately 2 Vin [V] to a level substantially equal to the voltage of the reference voltage source 1009 (=0 V). With this, the floating of the voltage at the negative input port of the operational amplifier 1003 (equal to the virtual ground voltage of the system) is significantly reduced, so that the charge of the capacitor 1001 is substantially completely transferred to the capacitor 1002. As a result, the voltage across the capacitor 1002 becomes substantially equal to 2 Vin, so that the switched capacitor circuit achieves accurate two-fold amplification even where the gain of the operational amplifier included in the switched capacitor circuit is low.

CITATION LIST

Non Patent Literature

[NPL 1] Y. Chae, et al, "A 2.1 M Pixels, 120 Frame/s CMOS Image Sensor With Column-Parallel ΔΣ ADC Architecture," IEEE Journal of Solid-State Circuits, vol. 46, no. 1, pp. 236 to 247, January 2011

[NPL 2] B. R. Gregoire, et al., "An Over-60 dB True Rail-to-Rail Performance Using Correlated Level Shifting and an Opamp With Only 30 dB Loop Gain," IEEE Journal of Solid-State Circuits, vol, 43, no. 12, pp. 2620 to 2630, December 2008

SUMMARY

Technical Problem

However, the operational amplifier included in the switched capacitor circuit disclosed in NPL 2 is a differential operational amplifier, and therefore the switched capacitor circuit has difficulties in speeding up of circuit operation, lowering of power consumption, and reduction of circuit area.

One non-limiting and exemplary embodiment provides a switched capacitor circuit capable of faster and accurate circuit operation with lower power consumption in a smaller circuit area, and a method of driving the switched capacitor circuit.

Solution to Problem

In one general aspect, the techniques disclosed here feature a switched capacitor circuit including: a first input terminal to which an input voltage is input; a first output terminal from which an output voltage is output; a sampling capacitor including a first terminal to which the input voltage is applied and a second terminal; an inverting amplifier including a second input terminal and a second output terminal, the second input terminal being connected to the second terminal; a first level-shifting capacitor including a fifth terminal which is a capacitor electrode, a fourth terminal which is another capacitor electrode, and a third terminal which is switchable between being connected to the fifth terminal and being connected to the fourth terminal, the fifth terminal being connected to the first output terminal; a second level-shifting capacitor including an eighth terminal which is a capacitor electrode, a seventh terminal which is another capacitor electrode, and a sixth terminal which is switchable between being connected to the eighth terminal and being connected to the seventh terminal, the eighth terminal being connected to the third terminal, the sixth terminal being connected to the second output terminal; a storage capacitor including a ninth terminal, and a tenth terminal, the ninth terminal being connected to the second terminal, the tenth terminal being connected to the first output terminal; and an offset compensation circuit including an eleventh terminal which is switchable between being short-circuited with and disconnected from the fourth terminal and the seventh terminal, and outputs an offset voltage from the eleventh terminal, the offset voltage having the same value as a short-circuit voltage of the inverting amplifier with the second input terminal and the second output terminal being short-circuited.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

One or more exemplary embodiments or features disclosed herein provide a switched capacitor circuit which is driven using the method according to the present disclosure and includes not a differential operational amplifier but a single-ended inverting amplifier, and is therefore capable of fast operation with low power consumption and requires a smaller circuit area. In addition, the switched capacitor circuit performs integration operation and sample-and-hold operation with accuracy, outputting a voltage free from application of offset voltage.

BRIEF DESCRIPTION OF DRAWINGS

These and other advantages and features will become apparent from the following description thereof taken in conjunction with the accompanying drawings, by way of non-limiting examples of embodiments disclosed herein.

FIG. 5C is a circuit diagram illustrating connection in the switched capacitor circuit according to Embodiment 1 in a CLS phase.

FIG. 5D is a diagram of an equivalent circuit of a current path in the switched capacitor circuit according to Embodiment 1 in transition from the transfer phase to the CLS phase.

FIG. 6A is a circuit diagram illustrating connection in a switched capacitor circuit according to Embodiment 2 in a first CLS phase.

FIG. 6B is a circuit diagram illustrating connection in the switched capacitor circuit according to Embodiment 2 in a second CLS phase.

FIG. 7 is a functional block diagram of a switched capacitor circuit according to a comparative example.

FIG. 13C is a circuit diagram illustrating connection in the switched capacitor circuit according to Embodiment 3 in a first CLS phase.

FIG. 16D is a circuit diagram illustrating connection in the switched capacitor circuit according to Embodiment 4 in a second CLS phase.

DESCRIPTION OF EMBODIMENTS

Underlying Knowledge Forming Basis of the Present Disclosure

In relation to the switched capacitor circuit disclosed in the Background section, the inventor has found the following problem.

NPL 2 discloses only an example of two-fold amplification performed by a conventional switched capacitor circuit. The following describes the problem solved by an exemplary embodiment disclosed herein, using, as an example, an integration circuit generalized from the disclosed conventional technique.

Figure 1:
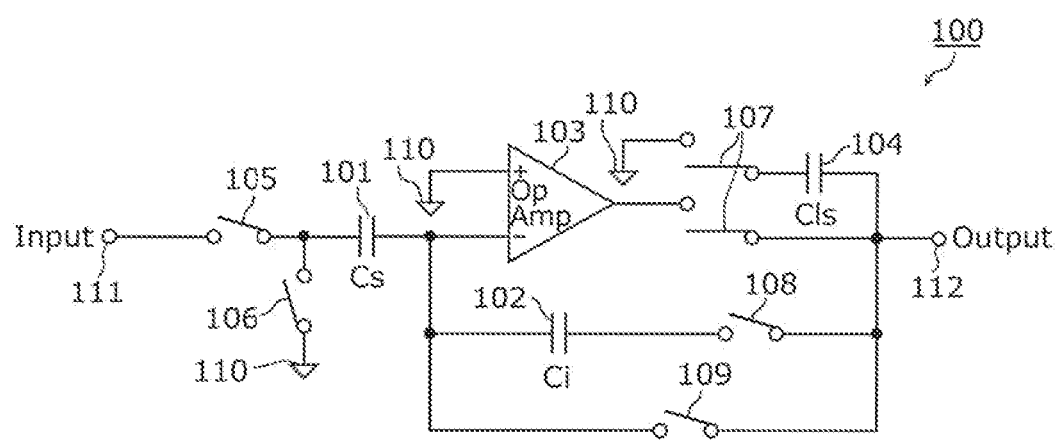
FIG. 1 illustrates an example of a circuit configuration of an integrator to which a switched capacitor including a two-fold amplifier is applied.

FIG. 1 illustrates an example of a circuit configuration of an integrator to which a switched capacitor including a two-fold amplifier is applied. As illustrated in FIG. 1, an integrator 100 includes capacitors 101, 102, and 104, an operational amplifier 103, switches 105, 106, 107, 108, and 109, a reference voltage source 110, an input terminal 111, and an output terminal 112. The integrator 100 in operation transits from a sampling phase to a transfer phase to a CLS phase in this order according to ON-OFF control of the switches. The integrator 100 operates based on operation of a switched capacitor circuit, and thus these phases never overlap each other at any time. The following describes operation of the integrator 100 in each of the phases.

Figure 2A:
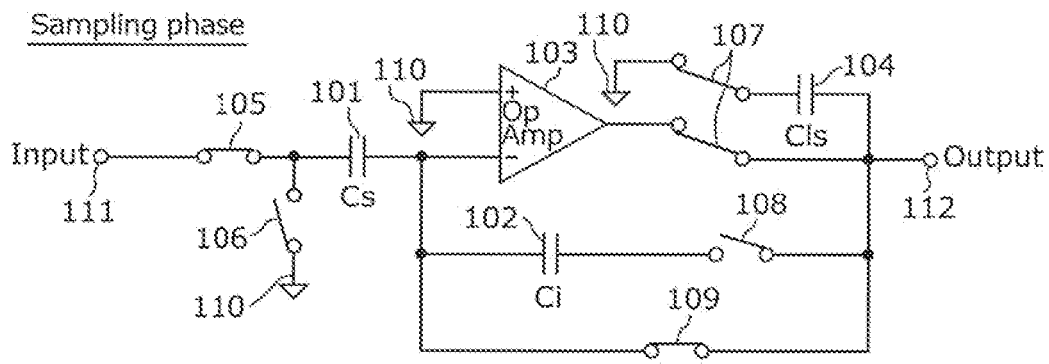
FIG. 2A is a circuit diagram illustrating connection in the integrator to which a switched capacitor including a two-fold amplifier is applied in a sampling phase.
Figure 2B:
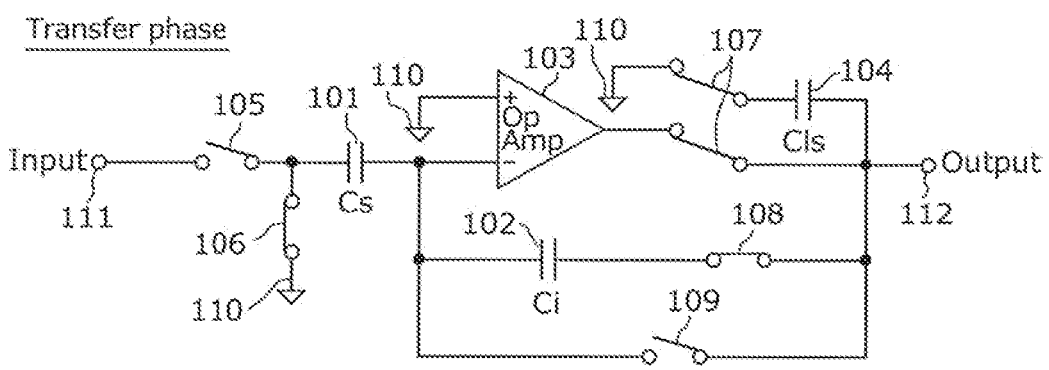
FIG. 2B is a circuit diagram illustrating connection in the integrator to which a switched capacitor including a two-fold amplifier is applied in a transfer phase.
Figure 2C:
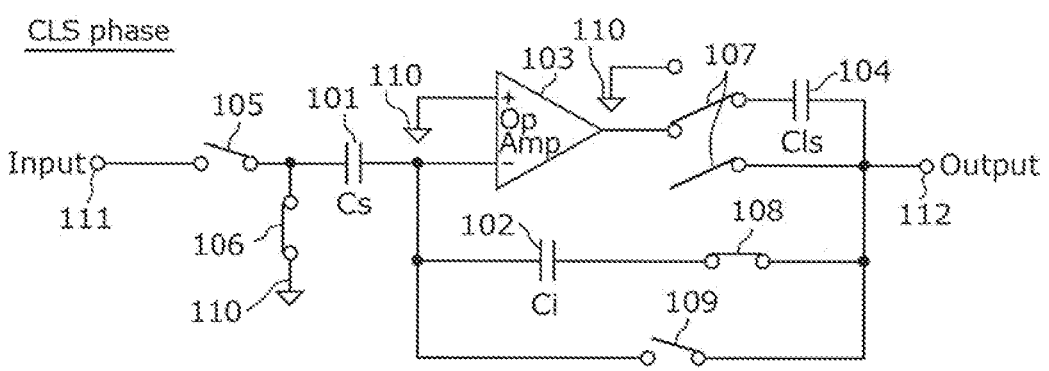
FIG. 2C is a circuit diagram illustrating connection in the integrator to which a switched capacitor including a two-fold amplifier is applied in a CLS phase.

FIG. 2A, FIG. 2B, and FIG. 2C are circuit diagrams illustrating connection in the integrator to which the switched capacitors including a two-fold amplifier is applied in the sampling phase, transfer phase, and CLS phase, respectively.

As illustrated in FIG. 2A, in the sampling phase, the switches 105 and 109 are closed, the switches 106 and 108 are open, one of the switches 107 connects the reference voltage source 110 and the capacitor 104, and the other of the switches 107 connects the output port of the operational amplifier 103 and the output terminal 112. With this connection, the capacitor 101 stores a charge of Cs·Vin [C] with an electrode on the left side in FIG. 2A being a positive electrode, where the voltage at the input terminal 111 is Vin [V] and the reference voltage of the reference voltage source 110 is 0 V. Meanwhile, the capacitor 102 remains unchanged. The initial charge of the capacitor 102 is assumed to be 0 [C] for ease of explanation.

In the transfer phase following the sampling phase, as illustrated in FIG. 2B, the switches 105 and 109 are open, the switches 106 and 108 are closed, and the connection of the switches 107 is maintained. With this connection, transfer of the charge stored in the capacitor 101 to the capacitor 102 starts. In other words, the voltage across the capacitor 102 increases toward Cs·Vin/Ci [V]. Furthermore, the operational amplifier 103 drives the capacitor 104, so that the voltage across the capacitor 104 also increases toward Cs·Vin/Ci [V].

However, when the gain of the operational amplifier 103 is insufficient, the voltage at the negative input terminal of the operational amplifier 103 (that is, the virtual ground voltage of the system) floats. Thus, not the whole charge of the capacitor 101 is transferred to the capacitor 102, and the voltage at the output terminal 112 does not reach Cs·Vin/Ci [V]. Such insufficient increase of the voltage at the output terminal is caused by a large difference of voltage at the negative input terminal of the operational amplifier 103 from the voltage of the reference voltage source 110. This difference is due to the voltage at the output port of the operational amplifier 103 (approximately Cs·Vin/Ci [V]).

In the CLS phase following the transfer phase, as illustrated in FIG. 2C, the connection of the switches 105 and 109 remain open, the switches 106 and 108 each remain short-circuited, and the one of the switches 107 connects the output port of the operational amplifier 103 and the capacitor 104, and the other of the switches 107 is open. With this connection, the capacitor 104 is connected between the output port of the operational amplifier 103 and the output terminal 112. The voltage across the capacitor 104 is approximately Cs·Vin/Ci [V], which produces the "level-raising" effect (level-shifting effect) and thereby the voltage at the output port of the operational amplifier 103 changes from approximately Cs·Vin/Ci [V] to a level substantially equal to the voltage of the reference voltage source 110 (0 V). With this, the floating of the voltage at the negative input port of the operational amplifier 103 (equal to the virtual ground voltage of the system) is significantly reduced, so that the charge of the capacitor 101 is substantially completely transferred to the capacitor 102. As a result, the voltage across the capacitor 102 becomes substantially equal to Cs·Vin/Ci [V], so that the integrator achieves accurate charge transfer even where the gain of the operational amplifier included in the integrator is low.

Subsequently, the operation cycle from the sampling phase through the CLS phase is repeated, so that integration operation is performed accurately despite the low gain of the operational amplifier included in the switched capacitor circuit.

However, the operational amplifier 103 used in the integrator 100 illustrated in FIG. 1 is a differential operational amplifier, and therefore operation speed, power saving, and space saving of the integrator 100 are insufficient. An integrator including a single-ended inverting amplifier surpasses the integrator 100 in terms of operation speed, power saving, and space saving.

Conceived to address the above-described problem, an object of the present disclosure is to provide a switched capacitor circuit which is capable of faster and accurate operation with lower power consumption in a smaller circuit area, a method of driving the switched capacitor circuit, and an integrator including the switched capacitor circuit.

According to an exemplary embodiment disclosed herein a switched capacitor circuit includes: a first input terminal to which an input voltage is input; a first output terminal from which an output voltage is output; a sampling capacitor including a first terminal to which the input voltage is applied and a second terminal; an inverting amplifier including a second input terminal and a second output terminal, the second input terminal being connected to the second terminal; a first level-shifting capacitor including a fifth terminal which is a capacitor electrode, a fourth terminal which is another capacitor electrode, and a third terminal which is switchable between being connected to the fifth terminal and being connected to the fourth terminal, the fifth terminal being connected to the first output terminal; a second level-shifting capacitor including an eighth terminal which is a capacitor electrode, a seventh terminal which is another capacitor electrode, and a sixth terminal which is switchable between being connected to the eighth terminal and being connected to the seventh terminal, the eighth terminal being connected to the third terminal, the sixth terminal being connected to the second output terminal; a storage capacitor including a ninth terminal and a tenth terminal, the ninth terminal being connected to the second terminal, the tenth terminal being connected to the first output terminal; and an offset compensation circuit including an eleventh terminal which is switchable between being short-circuited with and disconnected from the fourth terminal and the seventh terminal, and outputs an offset voltage from the eleventh terminal, the offset voltage having the same value as a short-circuit voltage of the inverting amplifier with the second input terminal and the second output terminal being short-circuited.

In this configuration, the switched capacitor circuit includes not a differential operational amplifier but a single-ended inverting amplifier instead, and thus is capable of faster operation with lower power consumption in a smaller circuit area, and is of high accuracy, outputting a voltage free from application of offset voltage.

Furthermore, in a sampling phase: the inverting amplifier with the second input terminal and the second output terminal being short-circuited generates the short-circuit voltage; and the sampling capacitor samples a potential difference between the input voltage and the short-circuit voltage, and in a transfer phase in which a charge stored in the sampling capacitor is transferred: disconnection between the second input terminal and the second output terminal causes the charge to be transferred to the storage capacitor; and the first level-shifting capacitor with the third terminal and the fifth terminal being short-circuited and the second level-shifting capacitor with the sixth terminal and the eighth terminal being short-circuited each sample a potential difference between the eleventh terminal and the first output terminal.

Furthermore, in the level-shifting phase in which a voltage level of the second output terminal shifts, disconnection between the third terminal and the fifth terminal, disconnection between the sixth terminal and the eighth terminal, in-series electrical connection of the first level-shifting capacitor, the third terminal, the fourth terminal, and the fifth terminal, and in-series electrical connection of the second level-shifting capacitor, the sixth terminal, the seventh terminal, and the eighth terminal cause the first level-shifting capacitor and the second level-shifting capacitor to form a series capacitor between the first output terminal and the second output terminal, the first level-shifting capacitor being connected between the fourth terminal and the fifth terminal, the second level-shifting capacitor being connected between the seventh terminal and the eighth terminal.

In the above-described configuration, in the level-shifting phase, the first level-shifting capacitor and the second level-shifting capacitor are electrically connected in series between the first output germinal and the second output terminal. Whenever the circuit proceeds to a new balanced status as a whole, the voltage level at the second output terminal of the inverting amplifier crosses the virtual ground voltage. By taking advantage of operation, the circuit can be balanced in a state were the second input terminal voltage and the second output terminal voltage of the inverting amplifier are equal to the virtual ground voltage by setting the storage capacitor, the first level-shifting capacitor, and the second level-shifting capacitor, appropriately. Floating of the virtual ground terminal of the system is thereby significantly reduced, so that the charge of the sampling 11 is substantially completely transferred to the storage capacitor. Therefore, charge transfer can be performed with accuracy even when the gain of the inverting amplifier included in the switched capacitor circuit is low.

Furthermore, the level-shifting phase in which a voltage level of the second output terminal shifts includes a first level-shifting phase and a second level-shifting phase, in the first level-shifting phase, the third terminal and the fifth terminal are disconnected, and the first level-shifting capacitor is electrically connected in series with the third terminal, the fourth terminal, and the fifth terminal, the first level-shifting capacitor being connected between the fourth terminal and the fifth terminal, and in the second level-shifting phase, the sixth terminal and the eighth terminal are disconnected, and the second level-shifting capacitor is electrically connected in series with the sixth terminal, the seventh terminal, and the eighth terminal, the second level-shifting capacitor being connected between the seventh terminal and the eighth terminal.

With this, the level of voltage held in the first level-shifting capacitor is raised (level-raising effect (or level-shifting effect)) in the first level-shifting phase, so that the voltage of the second output terminal of the inverting amplifier becomes substantially equal to the voltage across the second level-shifting capacitor. Accordingly, floating of the voltage at the second input terminal of the inverting amplifier (equal to the virtual ground voltage of the system) is reduced. Furthermore, the level of voltage held in the second level-shifting capacitor is raised (level-raising effect (or level-shifting effect)) in the second level-shifting phase, so that the voltage of the second output terminal of the inverting amplifier becomes lower than the voltage across the second level-shifting capacitor. Accordingly, floating of the voltage at the second input terminal of the inverting amplifier (equal to the virtual ground voltage of the system) is reduced. Therefore, charge transfer can be performed with accuracy even when the gain of the inverting amplifier included in the switched capacitor circuit is low.

Furthermore, a switched capacitor circuit according to an exemplary embodiment disclosed herein includes: a first input terminal to which an input voltage is input; a first output terminal from which an output voltage is output; a sampling capacitor including a first terminal to which the input voltage is applied and a second terminal; a first clamping capacitor including a third terminal and a fourth terminal, the third terminal being connected to the second terminal; an inverting amplifier including a second input terminal and a second output terminal, the second input terminal being connected to the fourth terminal; a second clamping capacitor including a fifth terminal and a sixth terminal, the fifth terminal being connected to the second output terminal; a first level-shifting capacitor including a seventh terminal which is a capacitor electrode and an eighth terminal which is switchable between being connected to the seventh terminal and being connected to another capacitor electrode of the first level-shifting capacitor, the seventh terminal being connected to the first output terminal; a second level-shifting capacitor including a ninth terminal which is a capacitor electrode and a tenth terminal which is switchable between being connected to the ninth terminal and being connected to another capacitor electrode of the second level-shifting capacitor, the ninth terminal being connected to the eighth terminal, the tenth terminal being switchable between being short-circuited with and being disconnected from the sixth terminal; and a storage capacitor including an eleventh terminal and a twelfth terminal, the eleventh terminal being connected to the second terminal, the twelfth terminal being connected to the first output terminal.

In this configuration, the switched capacitor circuit includes not a differential operational amplifier but one single-ended inverting amplifier instead, and thus is capable of faster operation with lower power consumption in a smaller circuit area, and is of high accuracy, outputting a voltage free from application of offset voltage.

Furthermore, in a sampling phase: the inverting amplifier with the second input terminal and the second output terminal being short-circuited generates short-circuit voltage; and the first clamping capacitor and the second clamping capacitor sample a potential difference between the short-circuit voltage and a reference voltage, in a transfer phase in which a charge stored in the sampling capacitor is transferred: disconnection between the second input terminal and the second output terminal causes the charge to be transferred to the storage capacitor; in-series electrical connection of the first clamping capacitor, the second terminal, and the second input terminal, the first clamping capacitor being connected between the second terminal and the second input terminal, an open state of one of the fifth terminal and the sixth terminal of the second clamping capacitor, short-circuit of the seventh terminal and the eighth terminal, and short-circuit of the ninth terminal and the tenth terminal cause the first level-shifting capacitor to sample a potential difference between the reference voltage and a voltage at the first output terminal, in a first level-shifting phase in which a voltage level of the second output terminal shifts: the second clamping capacitor is electrically connected in series between the second output terminal and the tenth terminal; and the second level-shifting capacitor samples a potential difference between a voltage at the ninth terminal and the reference voltage at a moment when the seventh terminal and the eighth terminal are disconnected and the first level-shifting capacitor is electrically connected in series between the eighth terminal and the first output terminal, and the ninth terminal and the tenth terminal are disconnected, and the second level-shifting capacitor is electrically connected in series between the ninth terminal and the sixth terminal.

With this, the levee of voltage held in the first level-shifting capacitor is raised (level-raising effect (or level-shifting effect)) in the first level-shifting phase, so that the voltage of the second output terminal of the inverting amplifier becomes substantially equal to the voltage across the second level-shifting capacitor. Accordingly, floating of the voltage at the second input terminal of the inverting amplifier is reduced. Furthermore, the level of voltage held in the second level-shifting capacitor is raised (level-raising effect (or level-shifting effect)) in the second level-shifting phase, so that the voltage of the second output terminal of the inverting amplifier becomes lower than the voltage across the second level-shifting capacitor. Accordingly, floating of the voltage at the second input terminal of the inverting amplifier is reduced. Therefore, charge transfer can be performed with accuracy even when the gain of the inverting amplifier included in the switched capacitor circuit is low.

Furthermore, the switched capacitor circuit further includes a third clamping capacitor including a thirteenth terminal and a fourteenth terminal, the thirteenth terminal being connected to the second output terminal, the fourteenth terminal being switchable between being short-circuited with and being disconnected from the sixth terminal and the tenth terminal.

Furthermore, in the sampling phase: the inverting amplifier with the second input terminal and the second output terminal being short-circuited generates the short-circuit voltage; and the first clamping capacitor, the second clamping capacitor, and the third clamping capacitor sample the potential difference between the short-circuit voltage and a reference voltage, in the transfer phase in which the charge stored in the sampling capacitor is transferred: disconnection between the second input terminal and the second output terminal causes the charge to be transferred to the storage capacitor; and in-series electrical connection of the first clamping capacitor, the second terminal, and the second input terminal, the first clamping capacitor being connected between the second terminal and the second input terminal, an open state of one of the fifth terminal and the sixth terminal of the second clamping capacitor, an open state of one of the thirteenth terminal and the fourteenth terminal of the third clamping capacitor, short-circuit of the seventh terminal and the eighth terminal, and short-circuit of the ninth terminal and the tenth terminal cause the first level-shifting capacitor to sample the potential difference between the reference voltage and the voltage at the first output terminal, in the first level-shifting phase in which the voltage level of the second output terminal shifts: the second clamping capacitor is electrically connected in series between the second output terminal and the tenth terminal; and the second level-shifting capacitor samples the potential difference between the voltage at the ninth terminal and the reference voltage at a moment when the seventh terminal and the eighth terminal are disconnected and the first level-shifting capacitor is electrically connected in series between the eighth terminal and the first output terminal, in the second level-shifting phase in which the voltage level of the second output terminal shifts: one of the fifth terminal and the sixth terminal of the second clamping capacitor is open; the third clamping capacitor is electrically connected in series between the second output terminal and the tenth terminal; and the seventh terminal and the eighth terminal are disconnected, and the second level-shifting capacitor is electrically connected in series between the ninth terminal and the sixth terminal.

In the second level-shifting phase following the first level-shifting phase in which the charge stored in the second clamping capacitor changes, the third clamping capacitor performs the clamping of the output voltage of the inverting amplifier in turn. The change stored in the third clamping capacitor does not change in the first level-shifting phase. With this, the voltage of the second input terminal of the inverting amplifier is low compared to the configuration in which the second clamping capacitor works in the second level-shifting phase. Therefore, charge transfer can be performed with further higher accuracy even when the gain of the inverting amplifier included in the switched capacitor circuit is low.

Furthermore, the inverting amplifier includes an inverter circuit.

With this, the inverting amplifier is an element having one input and one output, so that the circuit operates fast with low power consumption and requires a small area despite the low gain of the inverting amplifier.

Furthermore, the inverter circuit includes a switched-current bias circuit.

With this, fluctuation of current to flow into the inverting amplifier is reduced.

Furthermore, the inverter circuit is a circuit which operates with a dynamic current.

With this, the amount of current flowing into the inverting amplifier can be change according to the phase so that inverter operation can be performed in which a large current is provided only in the beginning of the sampling phase and the transfer phase in which a large current for the beginning of settling is necessary, and afterward the current is gradually reduced. This allows both reduction of power consumption while keeing the settling speed unchanged.

Furthermore, the specific and general aspects may be implemented as a variety of devices including such switched capacitor circuits. For example, the specific and general aspects may be implemented as an integrator, a sample-and-hold circuit, a sensor circuit, an analog-digital converter, or an analog-digital converter including the above-described switched capacitor circuit, an imaging device including the analog-digital converter, and a digital camera including the imaging device.

Furthermore, the specific and general aspects may be implemented not only as such a switched capacitor circuit but also as a method of driving a switched capacitor circuit. The method includes operations of the features of the switched capacitor circuit as process steps.

Hereinafter, certain exemplary embodiments are described in greater detail with reference to the accompanying drawings. The same or equivalent components in the drawings are denoted by the same reference sign, and description thereof is not repeated.

Each of the exemplary embodiments described below shows a general or specific example. The present invention is defined by the claims. Therefore, among the structural elements in the following exemplary embodiments, structural elements not recited in any one of the independent claims are described as arbitrary structural elements.

Embodiment 1

Figure 3:
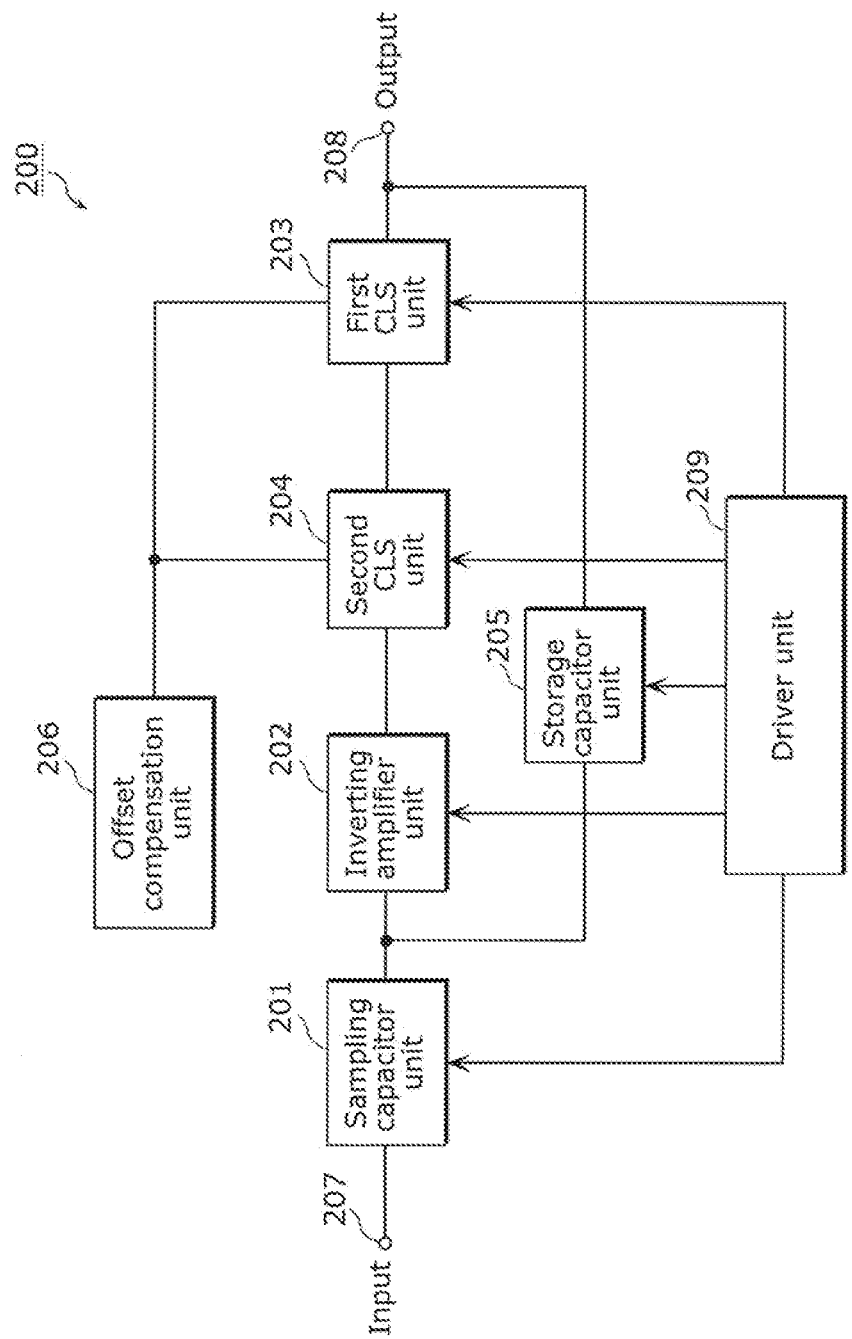
FIG. 3 is a functional block diagram of a snitched capacitor circuit according to Embodiment 1.

FIG. 3 is a functional block diagram of a switched capacitor circuit according to Embodiment 1. A switched capacitor circuit 200 illustrated in FIG. 3 includes a sampling capacitor unit 201, an inverting amplifier unit 202, a first CLS unit 203, a second CLS unit 204, a storage capacitor unit 205, an offset compensation unit 206, an input terminal 207, an output terminal 208, and a driver unit 209. The driver unit 209 controls these units so that the switched capacitor circuit 200 in operation transits from a sampling phase to a transfer phase to a CLS phase in this order. These phases of the switched capacitor circuit 200 never overlap each other at any time.

The sampling capacitor unit 201 includes an input port and an output port. In the sampling phase, the input port is connected to the input terminal 207, and the sampling capacitor unit 201 samples a potential difference between a first reference voltage and an input voltage applied to the input terminal 207. In the transfer phase and the CLS phase, the input port of the sampling capacitor unit 201 is unconnected with the input terminal 207 and connected to the reference voltage source 214, so that the first reference voltage is applied to the input port.

The inverting amplifier unit 202 includes an input port and an output port. The input port and output port of the inverting amplifier 202 are short-circuited in the sampling phase, and disconnected in the transfer phase and the CLS phase.

The offset compensation unit 206 includes an input port and an output port which are short-circuited. In the sampling phase and the transfer phase, the short-circuit voltage is applied to the first CLS unit 203 and the second CLS unit 204.

The first CLS unit 203 includes an input port and an output port. In the sampling phase and the transfer phase, the first CLS unit 203 samples a potential difference between a short-circuit voltage of the offset compensation unit 206 and a voltage at the output port of the inverting amplifier unit 202. In the CLS phase, a capacitor holding the potential difference is connected between the output port of the second CLS unit 204 and the output terminal 208.

The second CLS unit 204 includes an input port and an output port. In the sampling phase and the transfer phase, the second CLS unit 204 samples a potential difference between a short-circuit voltage of the offset compensation unit 206 and a voltage at the output port of the inverting amplifier unit 202. In the CLS phase, a capacitor holding the potential difference is connected between the output port of the inverting amplifier unit 202 and the input port of the first CLS unit 203.

In the sampling phase, a path from the output port of the sampling capacitor 201 to the output terminal 208 via the storage capacitor unit 205 is broken. In the transfer phase and the CLS phase, the path is made.

The driver unit 209 controls connection and disconnection between the above-described terminals and connection and disconnection of the capacitors with the other elements of the switched capacitor circuit 200.

Figure 4:
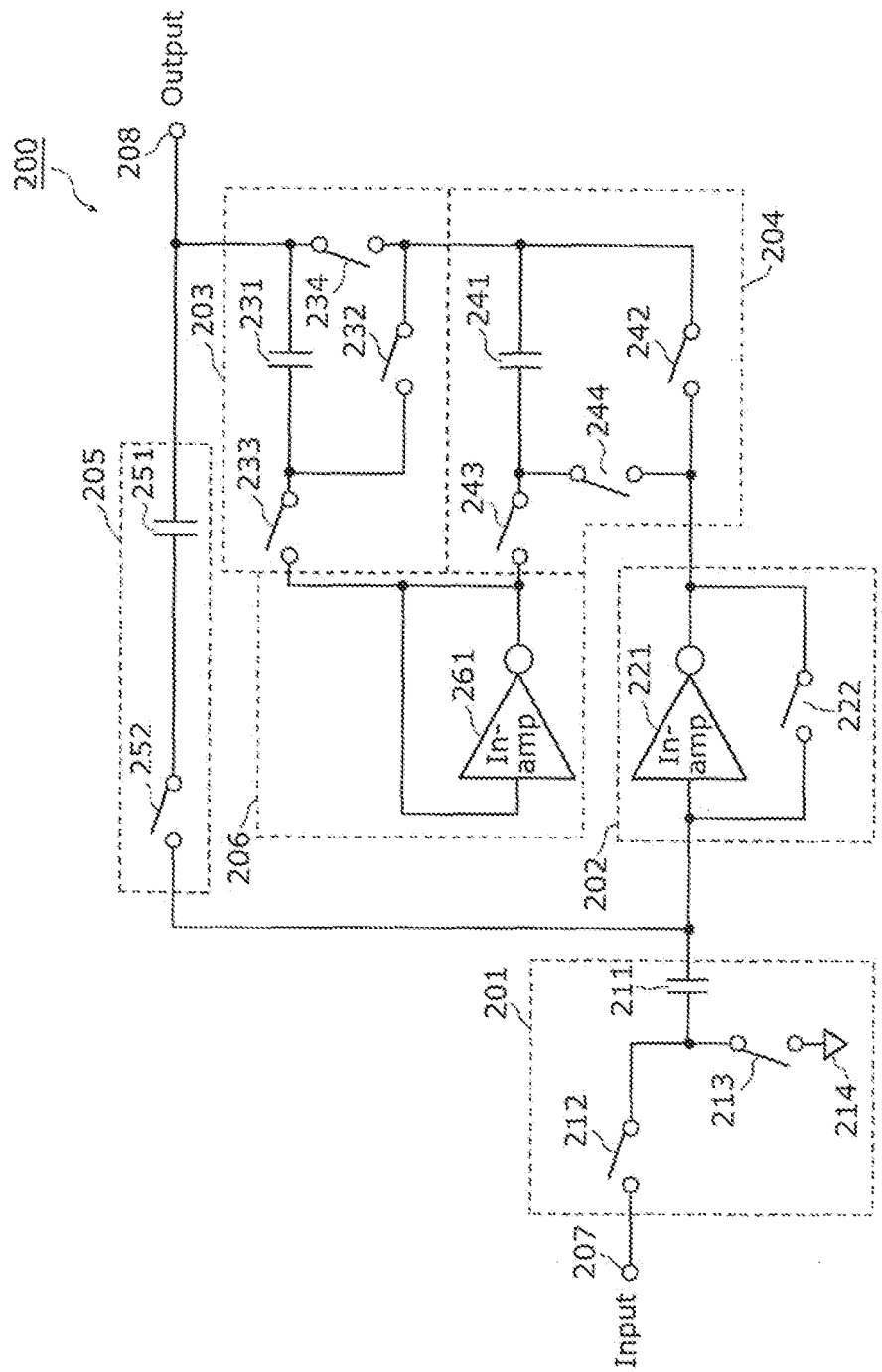
FIG. 4 is a circuit configuration diagram of the switched capacitor circuit according to Embodiment 1.

FIG. 4 is a circuit configuration diagram of the switched capacitor circuit according to Embodiment 1. The circuit configuration of the switched capacitor circuit 200 illustrated in FIG. 3 is an example of the units (except the driver unit 209) of the switched capacitor circuit 200 illustrated in FIG. 3. The input terminal 207 is a first input terminal, and the output terminal 208 is a first output terminal.

The sampling capacitor unit 201 includes a capacitor 211, switch 212 which connects and disconnects the input terminal 207 and a first electrode of the capacitor 211, and a switch 213 which connects and disconnects the first electrode of the capacitor 211 and a reference voltage source 214. The reference voltage source 214 is set to a reference voltage, and the reference voltage in Embodiment 1 is 0 V. The capacitor 211 is a sampling capacitor including a first terminal and a second terminal, and is connected so that an input voltage is applied to the first terminal.

The inverting amplifier unit 202 includes a single-ended inverting, amplifier 221 and a switch 222 which connects and disconnects an input port and an output port of the inverting amplifier 221. The inverting amplifier 221 includes a second input terminal and a second output terminal, and the second input terminal is connected to the second terminal.

The first CLS unit 203 includes a capacitor 231, a switch 232, a switch 233, and a switch 234. The switch 232 connects and disconnects a first electrode of the capacitor 231 and an output port of the second CLS unit 204. The switch 233 connects and disconnects the first electrode of the capacitor 231 and an output port of the offset compensation unit 206, The switch 234 connects and disconnects an input port and an output port of the first CLS unit 203. The first CLS unit 203 is a first level-shifting capacitor including a fifth terminal connected to the first output terminal, a fourth terminal, and a third terminal. The fifth terminal is a second electrode and the fourth terminal is a first electrode. The third terminal is switchable between being connected to the fifth terminal and being connected to the fourth terminal.

The second CLS unit 204 includes a capacitor 241, a switch 242, a switch 243, and a switch 244. The switch 242 connects and disconnects a second electrode of the capacitor 241 and the output port of the inverting amplifier 221. The switch 243 connects and disconnects a first electrode of the capacitor 241 and the output port of the offset compensation unit 206. The switch 244 connects and disconnects the first electrode of the capacitor 241 and an output port of the inverting amplifier 221. The second CLS unit 204 is a second level-shifting capacitor including an eighth terminal connected to the third terminal, a seventh terminal, and a sixth terminal connected to the second output terminal. The eighth terminal is a second electrode and the seventh terminal is a first electrode. The sixth terminal is switchable between being connected to the eighth terminal and being connected to the seventh terminal The second CLS unit 204 shifts the level of the voltage at the second output terminal when the capacitor 231 and the capacitor 241 is connected in series between the output port of the inverting amplifier 221 and the output terminal 208.

The storage capacitor unit 205 includes a capacitor 251 and a switch 252 which connects and disconnects a first electrode of the capacitor 251 and the input terminal of the inverting amplifier 221. The storage capacitor unit 205 is a storage capacitor including a ninth terminal and a tenth terminal, and is connected so that the ninth terminal and the tenth terminal are connected to the second terminal and the first output terminal, respectively.

The offset compensation unit 206 includes an inverting amplifier 261 which outputs autofeedback voltage as with the inverting amplifier 221. More specifically, the input port and output port of the offset compensation unit 206 are short-circuited so that the offset compensation unit 206 outputs autofeedback voltage. The offset compensation unit 206 is an offset compensation circuit including an eleventh terminal which can be connected to and disconnected from the fourth terminal and the seventh terminal. The offset compensation unit 206 outputs, from the eleventh terminal, an offset voltage having the same voltage value as the short-circuit voltage of the inverting amplifier 221 with the second input terminal and the second output terminal being short-circuited.

The driver unit 209 in FIG. 3, not shown in the circuit configuration illustrated in FIG. 4, controls operation of the switches 212, 213, 222, 232 to 234, 242 to 244, and 252 in the other units included in the switched capacitor circuit 200.

The switched capacitor circuit 200 in operation transits from a sampling phase to a transfer phase to a CLS phase in this order according to ON-OFF control of the switches. These phases of the switched capacitor circuit never overlap each other at any time. The following describes operation of the switched capacitor circuit 200 in each of the phases. The inverting amplifier 261 itself is identical to the inverting amplifier 221. The input port and output port of the inverting amplifier 261 are short-circuited, and the short-circuit voltage Vx [V] of the inverting amplifier 261 is a bias voltage of the capacitor 231 and the capacitor 241. The short-circuit voltage Vx [V] is also a virtual ground voltage of the inverting amplifier 221, so that the voltage at the output terminal 208 is a voltage to which an offset of the Vx [V] is already added. The following describes operation of the switched capacitor circuit 200 in each of the phases.

Figure 5A:
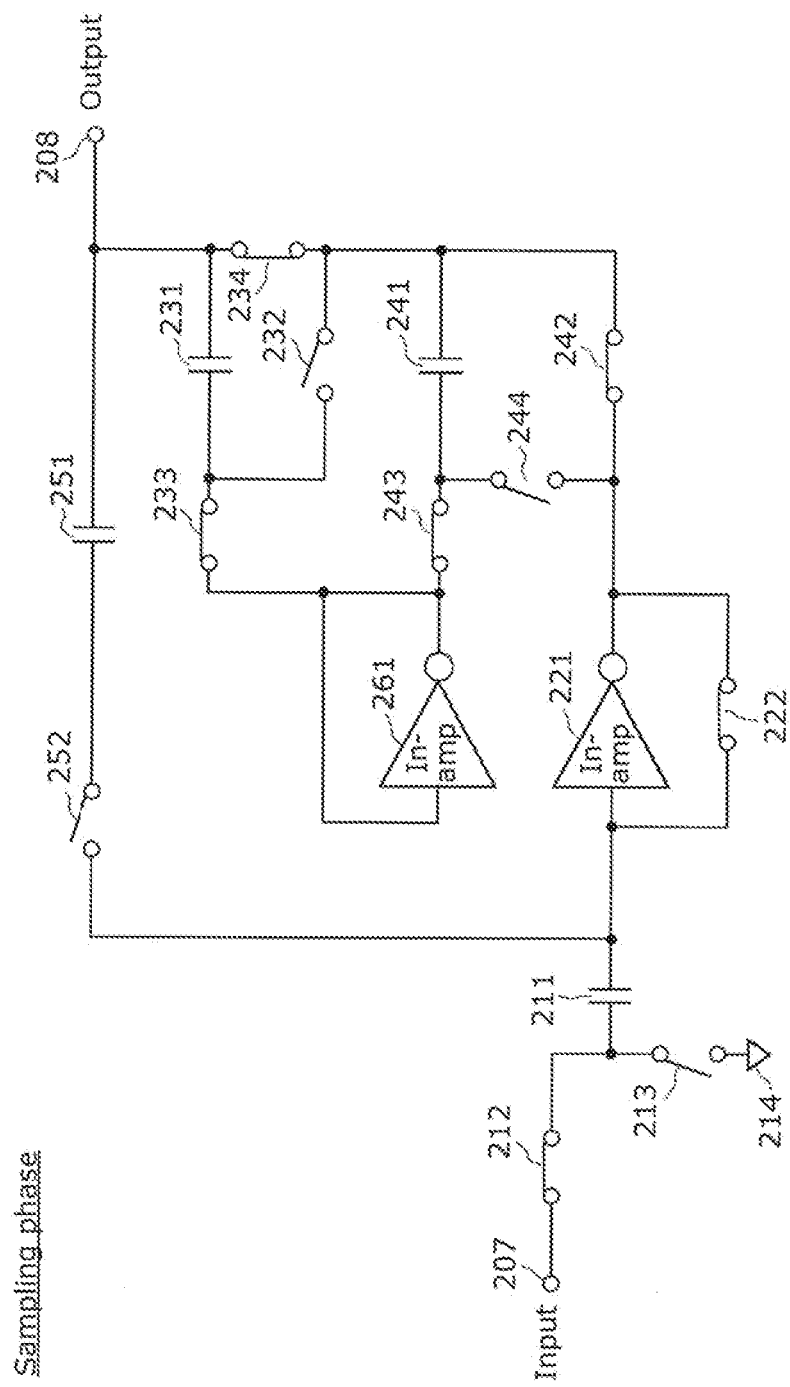
FIG. 5A is a circuit diagram illustrating connection in the switched capacitor circuit according to Embodiment 1 in a sampling phase.
Figure 5B:
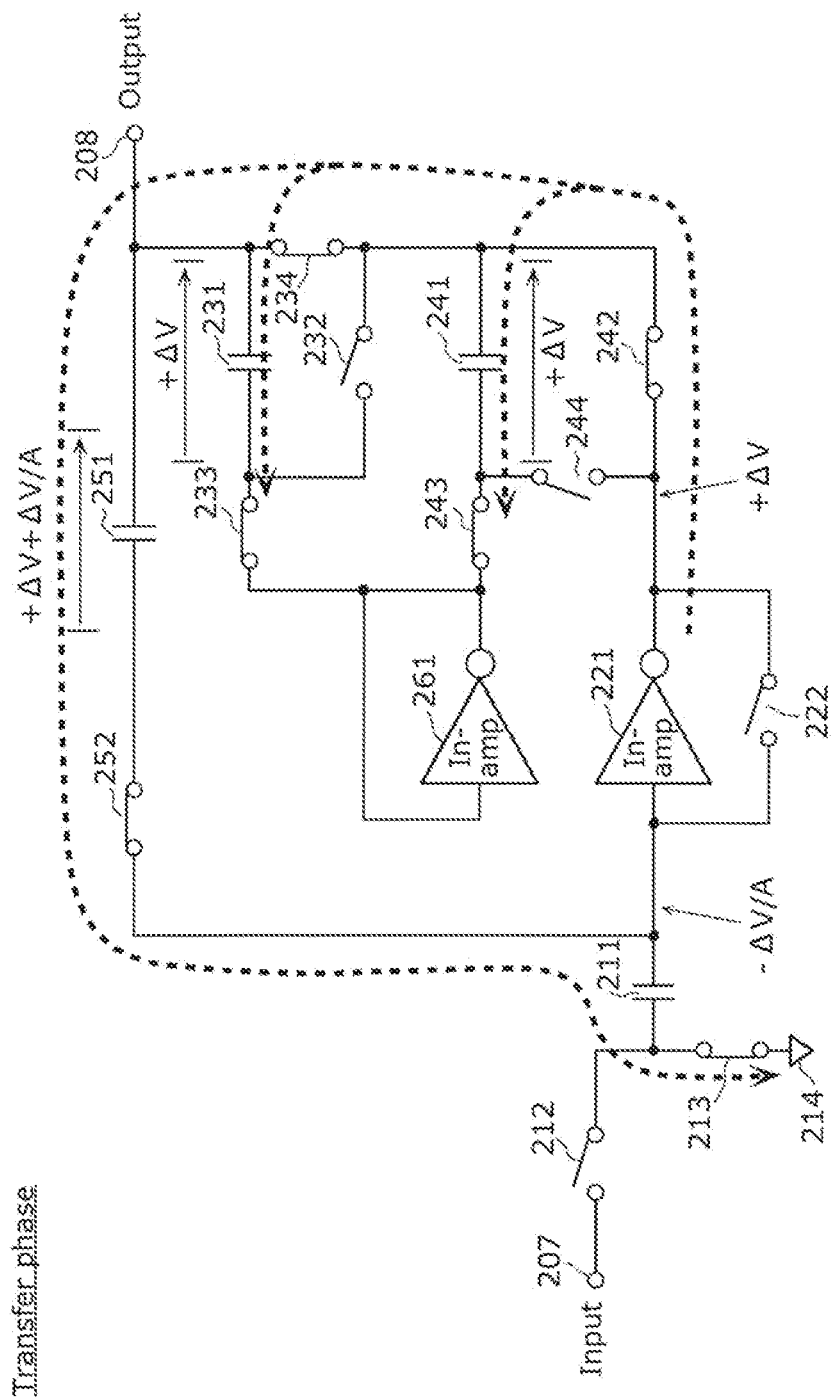
FIG. 5B is a circuit diagram illustrating connection in the switched capacitor circuit according to Embodiment 1 in a transfer phase.

FIG. 5A, FIG. 5B, and FIG. 5C are circuit diagrams illustrating connection in the switched capacitor circuit according to Embodiment 1 in which the switched capacitor circuit is in the sampling phase, transfer phase, and CLS phase, respectively.

First, in the sampling phase, the switches 212, 222, 233, 234, 242, and 243 are closed, and the switches 213, 232, 244, and 252 are open as illustrated in FIG. 5A.

At this time, the input port and output port of the inverting amplifier 221 are short-circuited, and the short-circuit voltage of the inverting amplifier 221 is equal to the virtual ground voltage Vx [V]. With this connection, the capacitor 211 stores a charge of Cs(Vin−Vx) [C] with an electrode on the left side in FIG. 5A being positive, where the voltage at the input terminal 207 is Vin [V]. Cs denotes capacitance of the capacitor 211. Meanwhile, the charge stored in the capacitor 251 remains unchanged. The initial charge of the capacitor 251 is assumed to be 0 [C] for ease of explanation. In this case, the switches 233, 234, 242, and 243 may be either closed or open, but are preferably closed for the purpose of securing initialization of the capacitors 231 and 241.

In the transfer phase following the sampling phase, the switches 212, 222, 232, and 244 are open, and the switches 213, 233, 234, 242, 243, and 252 are dosed as illustrated in FIG. 5B.

When the voltage of the reference voltage source 214 is 0 [V] with this connection, transfer of the charge stored in the capacitor 211, which is equivalent to CsVin [C], to the capacitor 251 by the inverting amplifier 221 starts. At this time, the input port voltage of the inverting amplifier 221 is −ΔV/A, where A denotes the gain of the inverting amplifier 221 and ΔV denotes the difference of the output voltage of the inverting amplifier 221 from the virtual ground voltage. Thus, the potential difference across the capacitor 251 is ΔV+ΔV/A with the second electrode (right one in FIG. 5B) being positive, and the potential difference across each of the capacitor 231 and the capacitor 241 is ΔV with the second electrode (right one in FIG. 5B) being positive.

In the CLS phase following the transfer phase, the switches 212, 222, 233, 234, 242, and 243 are open, and the switches 213, 232, 244, and 252 are closed as illustrated in FIG. 5C. The inverting amplifier 221 is not responsive upon the establishment of this connection, so that the output voltage of the inverting amplifier 221 instantaneously shifts to −ΔV. Thus, the input voltage of the inverting amplifier 221 begins state transition to approach a new virtual ground voltage of +ΔV/A. At this time, the current flowing along the current path illustrated in FIG. 5C causes the voltage across the capacitor 251 to increase and the voltage across the capacitor 231 and the voltage across the capacitor 241 to decrease.

An important suggestion can be derived from this operation. More specifically, whenever the circuit proceeds to a new balanced status as a whole, the voltage level at the output port of the inverting amplifier 221 crosses the virtual ground voltage. This suggests that the circuit can be balanced in a state where the voltage at the output port and the voltage at the input port of the inverting amplifier 221 are made equal to the virtual ground voltage by setting the capacities 251, 231, and 241 appropriately.

FIG. 5D is a diagram of an equivalent circuit of a current path in the switched capacitor circuit according to Embodiment 1 in transition from the transfer phase to the CLS phase. This diagram shows only requisite minimum circuit elements for ease of explanation.

When the voltage at the input port of the inverting amplifier 221 is equal to the virtual ground voltage (that is, when the difference of the voltage at the input port of the inverting amplifier 221 from the virtual ground voltage is zero), the voltage across the capacitor 251 remains at ΔV+ΔV/A+CsΔV/(Aci) with the second electrode (right one in FIG. 5D) being positive. Cs denotes capacitance of the capacitor 211, and Ci denotes capacitance of the capacitor 251.

The voltage across the capacitor 231 remains at ΔV−CsΔV/(ACls$_1$) with the second electrode (upper one in FIG. 5D) being positive, and the voltage across the capacitor 241 remains at ΔV−CsΔV/(ACls$_2$) with the second electrode (upper one in FIG. 5D) being positive. Cls$_1$ denotes capacitance of the capacitor 231, and Cls$_2$ denotes capacitance of the capacitor 241. At this time, since the voltage of the capacitor 251 equals the sum of the voltage of the capacitor 231 and the voltage of the capacitor 241, the condition for a zero difference between the output voltage of the inverting amplifier 221 and the virtual ground voltage can be expressed as Eq. 1 below.

[Math. 1]

$$\Delta V + \frac{\Delta V}{A} + \frac{Cs}{ACi}\Delta V = \Delta V - \frac{Cs}{ACls_1}\Delta V + \Delta V - \frac{Cs}{ACls_2}\Delta V \quad \text{(Eq. 1)}$$

Eq. 1 is expanded and factored as Eq. 2.

[Math. 2]

$$\frac{1}{A} + \frac{Cs}{ACi} + \frac{Cs}{A}\left(\frac{1}{Cls_1} + \frac{1}{Cls_2}\right) = 1 \quad \text{(Eq. 2)}$$

In the CLS phase in which the voltage level at the output port of the inverting amplifier 221 shifts from ΔV to −ΔV, the driver unit 209 connects the capacitor 231 and the capacitor 241 electrically in series between the output terminal 208 and the output port of the inverting amplifier 221. With this connection, whenever the circuit proceeds to a new balanced status as a whole, the voltage level at the output port of the inverting amplifier 221 crosses the virtual ground voltage. Such crossing is beneficially utilized: the circuit is balanced in the state where the voltage at the output port and the voltage at the input port of the inverting amplifier 221 are made equal to the virtual ground voltage Vx [V] by setting the capacities 251, 231, and 241 so that the condition expressed by Eq. 2 is satisfied. With this, floating of the virtual ground voltage of the system is significantly reduced, so that the charge of the capacitor 211 is substantially completely transferred to the capacitor 251. As a result, the voltage across the capacitor 251 becomes substantially equal to Cs·Vin/Ci [V], so that the switched capacitor circuit 200 achieves accurate charge transfer even when the gain of the inverting amplifier included in the switched capacitor circuit 200 is low.

In the above-described configuration, the switched capacitor circuit includes not a differential operational amplifier but a single single-ended inverting amplifier instead, and thus is capable of faster operation with lower power consumption in a smaller circuit area and is of high accuracy, outputting a voltage free from application of offset voltage.

The control operation in Embodiment 1 is not limited to the control method in which the driver unit 209 synchronously sends control signals to the other units of the switched capacitor circuit 200 illustrated in FIG. 4 so that the switched capacitor circuit 200 transits from the sampling phase to the transfer phase to the CLS phase. For example, each of the switches included in the units may asynchronously and autonomously switches upon or in conjunction with switching of the other switches between ON and OFF.

Embodiment 2

In Embodiment 2, the switched capacitor circuit 200 having the circuit configuration according to Embodiment 1 achieves accurate charge transfer by operation using a control method different from that used in Embodiment 1. More specifically, in the switched capacitor circuit 200 according to Embodiment 2, the driver unit 209 opens and closes the switches at timing different from the timing in Embodiment 1. In Embodiment 2, the driver unit 209 in operation transits from a sampling phase to a transfer phase to a first CLS phase to a second CLS phase. As in Embodiment 1, these phases never overlap each other at any time.

In the sampling phase, the driver unit 209 operates in the same manner as in the sampling phase in Embodiment 1. More specifically, the switches 212, 222, 233, 234, 242, and 243 are closed, and the switches 213, 232, 244, and 252 are open as illustrated in FIG. 5A.

At this time, the input port and output port of the inverting amplifier 221 are short-circuited, and the short-circuit voltage of the inverting amplifier 221 is equal to the virtual ground voltage Vx [V]. With this connection, the capacitor 211 stores a charge of Cs(Vin−Vx) [C] with an electrode on the left side in FIG. 5A being positive. Meanwhile, the capacitor 251 remains unchanged. The initial charge of the capacitor 251 is assumed to be 0 [C] for ease of explanation. In this case, the switches 233, 234, 242, and 243 are closed for the purpose of securing initialization of the capacitors 231 and 241.

In the transfer phase following the sampling phase, the driver unit 209 operates in the same manner as in the transfer phase in Embodiment 1. More specifically, the switches 212, 222, 232, and 244 are open, and the switches 213, 233, 234, 242, 243, and 252 are closed as illustrated in FIG. 5B.

With this connection, transfer of the charge stored in the capacitor 211, which is equivalent to CsVin [C], to the capacitor 251 by the inverting amplifier 221 starts. At this time, the input port voltage of the inverting amplifier 221 is −ΔV/A, where A denotes the gain of the inverting amplifier 221 and ΔV denotes the difference of the output voltage of the inverting amplifier 221 from the virtual ground voltage. Thus, the potential difference across the capacitor 251 is ΔV+ΔV/A with the second electrode (right one in FIG. 5B) being positive, and the potential difference across each of the capacitor 231 and the capacitor 241 is ΔV with the second electrode (right one in FIG. 5B) being positive.

However, when the gain of the inverting amplifier 221 is insufficient, the voltage at the input terminal of the inverting amplifier 221 (that is, the virtual ground voltage of the system) floats above Vx [V]. Thus, not the whole charge of the capacitor 211 is transferred to the capacitor 251, and the voltage at the output terminal 208 does not reach Cs·Vin/Ci+Vx [V]. Such insufficient increase of the voltage at the output terminal is caused by a large difference of the voltage at the output port of the inverting amplifier 221 from the virtual ground voltage Vx [V].

FIG. 6A and FIG. 6B are each a circuit diagram illustrating connection in the switched capacitor according to Embodiment 2 in the first transfer phase and the second transfer phase, respectively.

In the first CLS phase following the transfer phase, the switches 212, 222, 233, 234, and 244 are open, and the switches 213, 232, 242, 243, and 252 are closed.

With this connection, the capacitor 231 is connected between the output port of the inverting amplifier 221 and the output terminal 208. The voltage across of the capacitor 231 is held at ΔV, which produces the "level-raising" effect (level-shifting effect) and thereby the voltage at the output port of the inverting amplifier 221 changes from ΔV to a level substantially equal to the voltage across the capacitor 241 ΔVp (<<ΔV). With this, floating of the voltage at the input port of the inverting amplifier 221 (equal to the virtual ground voltage of the system) is reduced.

In the second CLS phase following the first CLS phase, the switches 212, 222, 233, 234, 242, and 243 are open, and the switches 213, 232, 244, and 252 are closed.

With this connection, the capacitor 241 is connected between the first electrode of the capacitor 231 and the output port of the inverting amplifier 221. This is a change in the connection from the connection in first CLS phase. The voltage across of the capacitor 241 is held at ΔVp, which produces the "level-raising" effect (level-shifting effect) and thereby the voltage at the output port of the inverting amplifier 221 changes from ΔVp to a further lower level of ΔVpp (<<ΔVp). At this time, the voltage at the input port of the inverting amplifier 221 is −ΔVpp/A, which is substantially low compared to −Vp/A. With this, the switched capacitor circuit according to Embodiment 2 operates more accurately than when a CLS technique is used in a comparative example, which will be described later. Accordingly, floating of the voltage at the input port of the inverting amplifier 221 (equal to the virtual ground voltage of the system) is reduced.

Furthermore, the switched capacitor circuit performs iterations of the operation cycle from the sampling phase through the second CLS phase, and thereby performs integration operation accurately despite the low gain of the operational amplifier included in the switched capacitor circuit.

In the above-described configuration, the switched capacitor circuit includes not a differential operational amplifier but a single-ended inverting amplifier instead, and thus is capable of faster operation and is of high accuracy.

The CLS technique can achieve higher accuracy when a switched capacitor circuit includes more cascaded capacitors each having a circuit configuration as with the capacitors 231 and 241 and operates in an operation cycle which further includes a third CLS phase and a fourth CLS phase subsequent to the second CLS phase.

Comparative Example

The following describes a switched capacitor circuit according to a comparative example. This comparative example is given in order compare the switched capacitor circuit according to Embodiment 1 and the switched capacitor circuit according to Embodiment 2.

FIG. 7 is a functional block diagram of a switched capacitor circuit according to the present comparative example. A switched capacitor circuit 800 illustrated in FIG. 7 includes a sampling capacitor 801, an inverting amplifier unit 802, a CLS unit 803, a storage capacitor 804, an offset compensation unit 805, an input terminal 807, an output terminal 808, and a driver unit 806. The driver unit 806 controls these units so that the switched capacitor circuit 800 in operation transits from a sampling phase to a transfer phase to a CLS phase in this order.

Figure 8:
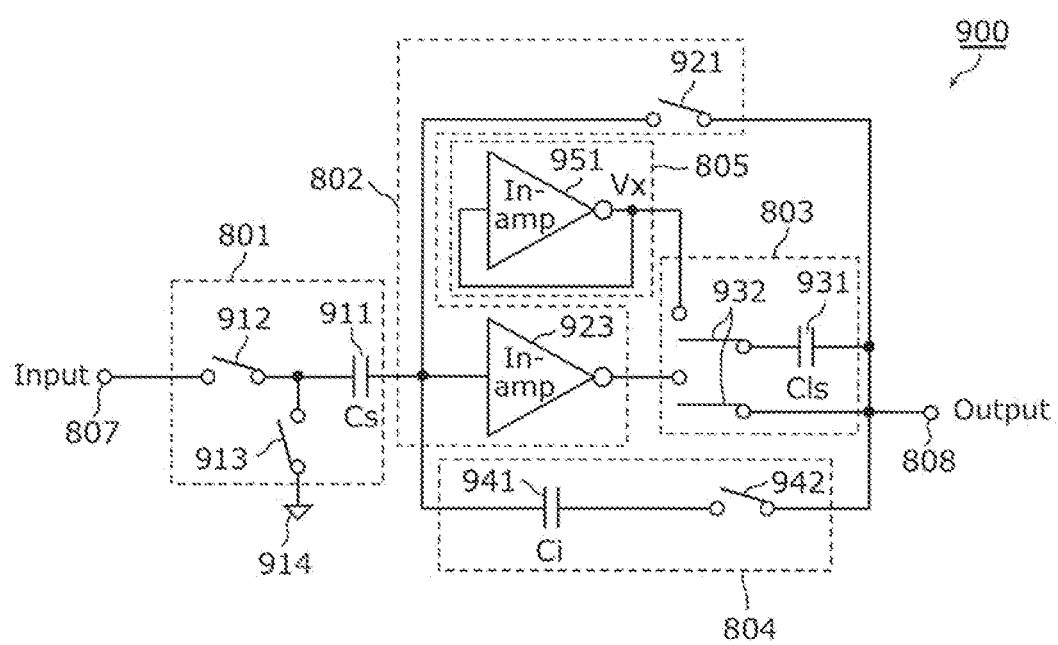
FIG. 8 is a circuit configuration diagram of the switched capacitor circuit according to the comparative example.

FIG. 8 is a circuit configuration diagram of the switched capacitor circuit according to the present comparative example. The circuit configuration of the switched capacitor circuit 900 illustrated in FIG. 8 is an example of the units (except the driver unit 806) of the switched capacitor circuit 800 illustrated in FIG. 7. The switched capacitor circuit 900 includes capacitors 911, 932, and 941, inverting amplifiers 923 and 951, switches 912, 913, 921, 932, and 942, a reference voltage source 914, an input terminal 807, and an output terminal 808.

The sampling capacitor unit 801 includes a capacitor 911, a switch 912 which connects and disconnects the input terminal 807 and a first electrode of the capacitor 911, and a switch 913 which connects and disconnects the first electrode of the capacitor 911 and a reference voltage source 914.

The inverting amplifier unit 802 includes a single-ended inverting amplifier 923 and a switch 921 which connects and disconnects an input port and an output terminal 808 of the inverting amplifier 923.

The CLS unit 803 includes a capacitor 931 and switches 932 which connect and disconnect a first electrode of the capacitor 931 to and from the output port of the inverting amplifier 923 and to and from the output port of the inverting amplifier 951.

The storage capacitor unit 804 includes a capacitor 941 and a switch 942 which connects and disconnects a second electrode of the capacitor 941 and the output terminal 808.

The offset compensation unit 805 includes an inverting amplifier 951 which outputs autofeedback voltage as with the inverting amplifier 923. More specifically, the input port and output port of the offset compensation unit 805 are short-circuited so that the offset compensation unit 206 outputs autofeedback voltage.

The driver unit 806 in FIG. 7, not shown in the circuit configuration illustrated in FIG. 8, controls operation of the switches 912, 913, 921, 932, and 942 in the other units included in the switched capacitor circuit 800.

The switched capacitor circuit 900 in operation transits from a sampling phase to a transfer phase to a CLS phase in this order according to ON-OFF control of the switches. The following describes operation of the switched capacitor circuit 900 in each of the phases.

Figure 9A:
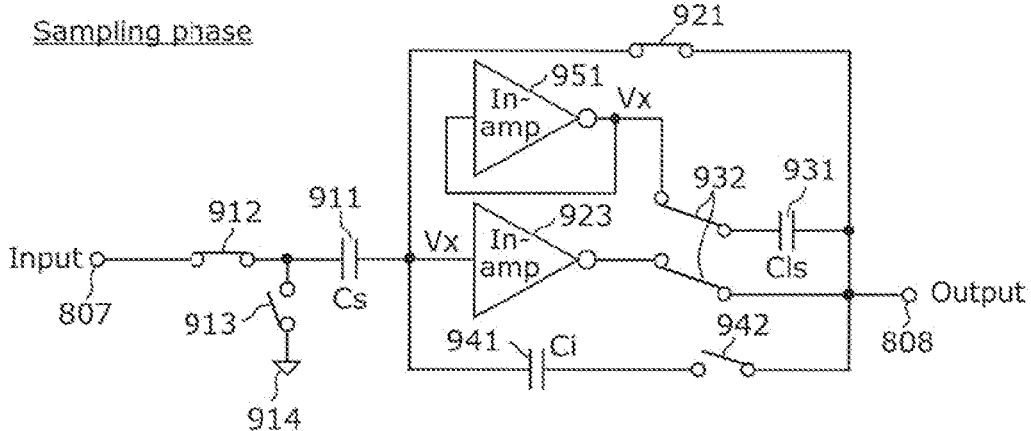
FIG. 9A is a circuit diagram illustrating connection in the switched capacitor circuit according to a comparative example in a sampling phase.
Figure 9B:
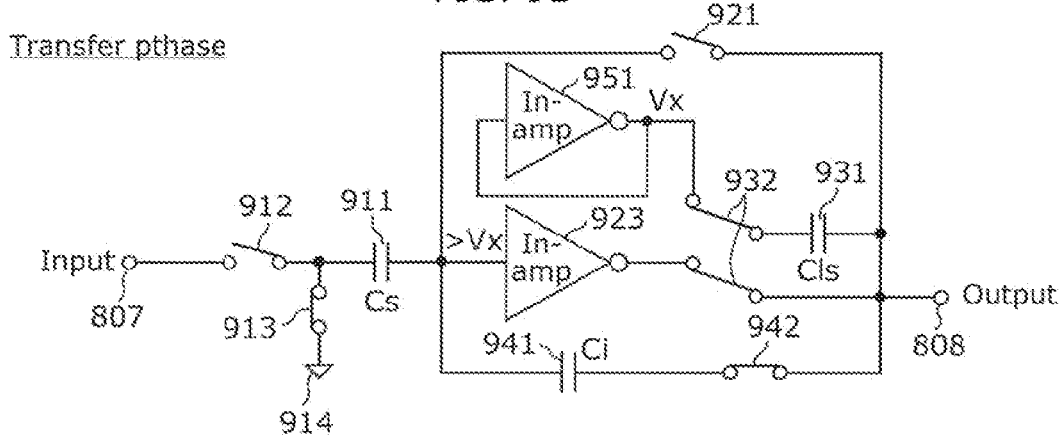
FIG. 9B is a circuit diagram illustrating connection in the switched capacitor circuit according to the comparative example in a transfer phase.
Figure 9C:
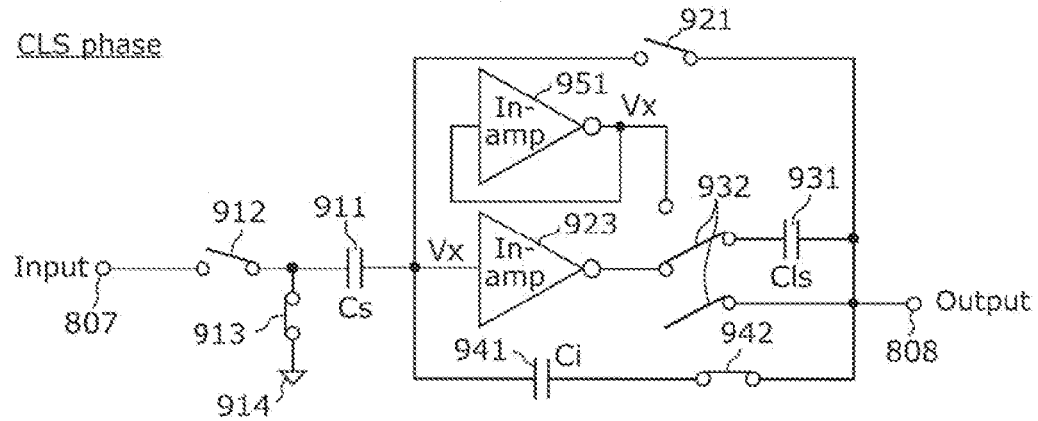
FIG. 9C is a circuit diagram illustrating connection in the switched capacitor circuit according to the comparative example in a CLS phase.

FIG. 9A, FIG. 9B, and FIG. 9C are circuit diagrams illustrating connection in the switched capacitor circuit according to the present comparative example in which the switched capacitor circuit is in the sampling phase, transfer phase, and CLS phase, respectively.

As illustrated in FIG. 9A, in the sampling phase, the switches 912 and 921 are closed, the switches 913 and 942 are open, one of the switches 932 connects the output port of the inverting amplifier 951 and the capacitor 931, and the other of the switches 932 connects the second output terminal of the inverting amplifier 923 and the output terminal 808. At this time, the input terminal and output terminal of the inverting amplifier 923 are short-circuited, and the short-circuit voltage of the inverting amplifier 923 is equal to Vx [V]. The capacitor 911 stores a charge of Cs(Vin−Vx) [C] with the first electrode (left one in FIG. 9A) being a positive electrode, where the voltage at the input terminal 807 is Vin [V] and the reference voltage of the reference voltage source 914 is 0 [V]. Meanwhile, the capacitor 941 remains unchanged. The initial charge of the capacitor 941 is assumed to be 0 [C] for ease of explanation.

In the transfer phase following the sampling phase, the switches 912 and 921 are open, the switches 913 and 942 are closed, and the connection of the switches 932 is maintained as illustrated in FIG. 9B. With this connection, transfer of the charge stored in the capacitor 911, which is equivalent to Cs·Vin [C], to the capacitor 941 starts. In other words, the voltage across the capacitor 941 increases toward Cs·Vin/Ci [V]. Furthermore, the inverting amplifier 923 also drives the capacitor 931, so that the voltage across the capacitor 931 also increases toward Cs·Vin/Ci [V].

However, when the gain of the inverting amplifier 923 is insufficient, the voltage at the input terminal of the inverting amplifier 923 (that is, the virtual ground voltage of the system) floats above Vx [V]. Thus, not the whole charge of the capacitor 911 is transferred to the capacitor 941, and the voltage at the output terminal 808 does not reach Cs·Vin/Ci+Vx [V]. Such insufficient increase of the voltage at the output terminal 808 is caused by a large difference of the voltage at the output terminal of the inverting amplifier 923 (approximately Cs·Vin/Ci+Vx [V]) from the virtual ground voltage Vx [V].

In the CLS phase following the transfer phase, the connection of the switches 912 and 921 remain open, the switches 913 and 942 each remain short-circuited, and the one of the switches 932 connects the output port of the inverting amplifier 923 and the capacitor 931, and the other of the switches 932 is open as illustrated in FIG. 9C. With this connection, the capacitor 931 is connected between the output terminal of the inverting amplifier 923 and the output terminal 808. The voltage across the capacitor 931 remains approximately at Cs·Vin/Ci [V]. This produces the "level-raising" effect (level-shifting effect) and thereby the voltage at the output terminal of the inverting amplifier 923 changes from approximately Cs·Vin/Ci+Vx [V] to a level substantially equal to the virtual ground voltage Vx [V]. With this, floating of the voltage at the input terminal of the inverting amplifier 923 (equal to the virtual ground voltage of the system) is significantly reduced, so that the charge of the capacitor 911 is substantially completely transferred to the capacitor 941. As a result, the voltage across the capacitor 941 becomes substantially equal to Cs·Vin/Ci [V], so that the switched capacitor circuit 900 achieves accurate charge transfer even when the gain of the inverting amplifier included in the switched capacitor circuit 900 is low.

(Performance Comparison)

The following describes performance comparison of an integrator including the switched capacitor circuit 200 according to Embodiment 1 (hereinafter also referred to as CLS 1.0), an integrator including the switched capacitor circuit 200 according to Embodiment 2 (hereinafter also referred to as CLS 2.0), and an integrator including the switched capacitor circuit 900 according to the present comparative example.

Figure 10A:
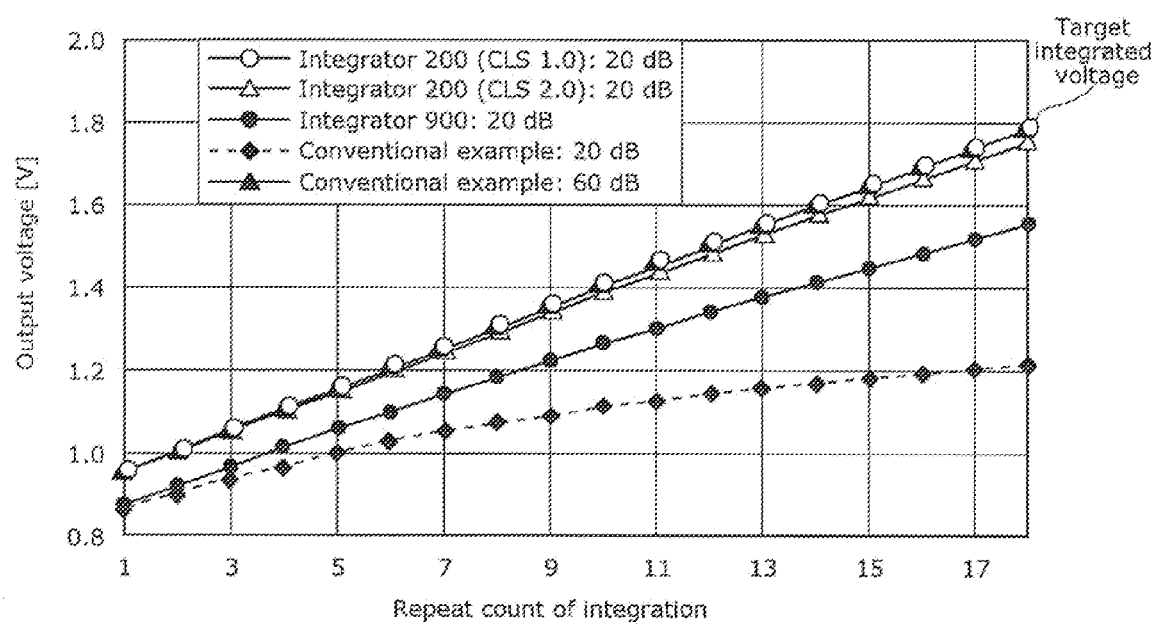
FIG. 10A is a chart comparing integration characteristics of the switched capacitor circuit to which the CLS technique is applied according to Embodiment 1 and integration characteristics of the switched capacitor circuit to which the CLS technique is applied according to Embodiment 2.
Figure 10B:
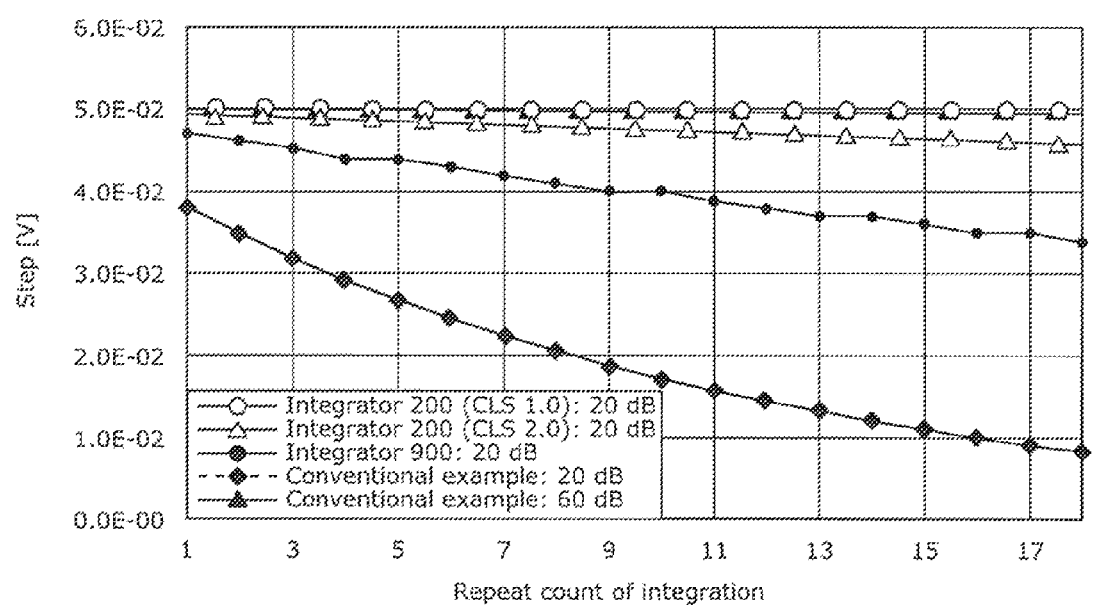
FIG. 10B is a chart comparing output voltage for each integration operation of the switched capacitor circuit to which the CLS technique is applied according to Embodiment 1 and output voltage for each integration operation of the switched capacitor circuit to which the CLS technique is applied according to Embodiment 2.

FIG. 10A is a chart comparing integration characteristics of the switched capacitor circuit to which the CLS technique is applied according to Embodiment 1 and the integration characteristics of the switched capacitor circuit to which the CLS technique is applied according to Embodiment 2. FIG. 10B is a chart comparing voltage output by each integration operation of the switched capacitor circuit to which the CLS technique is applied according to Embodiment 1 and output voltage for each integration operation of the switched capacitor circuit to which the CLS technique is applied according to Embodiment 2.

FIGS. 10A and 10B show that a conventional integrator including an inverting amplifier having a gain of 60 dB yields such a highly accurate value of integral by each integration operation that the relationship between the repeat count of integration and the value of integral is substantially linear. Compared to this, in the case of a conventional integrator including an inverting amplifier having a gain of 20 dB, such a linear relationship between the repeat count of integration and the value of integral is not present, and the value of integral obtained as a result of 18 times of integration operation deviates from the target integrated voltage (LB V).

In contrast, when the switched capacitor circuit 200 to which the CLS technique is applied according to Embodiment 1 (CLS 1.0) includes an inverting amplifier having a gain of 20 dB, the switched capacitor circuit 200 yields such a highly accurate value of integral by each integration operation that the relationship between the repeat count of integration and the value of integral is substantially linear. Compared to the conventional integrators including inverting amplifier having the lower gain, the CLS 1.0 including an inverting amplifier having a gain as low as 30 dB or lower exhibits significantly improved characteristics.

When the switched capacitor circuit 200 to which the CLS technique is applied according to Embodiment 2 (CLS 2.0) includes an inverting amplifier having a gain of 20 dB, the switched capacitor circuit 200 is inferior to CLS 1.0 in integration characteristics. In principle, CLS 2.0 falls short of CLS 1.0 in viewpoint of accuracy because the voltage at the output port of the inverting amplifier 221 cannot be zero ($\Delta$Vpp). However, CLS 2.0 still yields accurate values of integral compared to the switched capacitor circuit 900 which includes a conventional integrator having a gain of 20 dB and to which the CLS technique is applied according to the present comparative example, so that the relationship between the repeat count of integration and the value of integral is substantially linear. Compared to the conventional integrators including inverting amplifier having the lower gain, CLS 2.0 including an inverting amplifier having a gain as low as 30 dB or lower also exhibits significantly improved characteristics.

In the case of CLS 2.0 according to Embodiment 2, the driver unit 209 requires a four-phase clock signal to control open and close of the switches in the sampling phase, the transfer phase, the first CLS phase, and the second CLS phase. In contrast, CLS 1.0 according to Embodiment 1, the driver unit 209 requires a three-phase clock signal to control open and close of the switches in the sampling phase, the transfer phase, and the CLS phase. Therefore, power saved by CLS 1.0 according to Embodiment 1 is larger than power saved by CLS 2.0.

On the other hand, in the case of CLS 1.0 according to Embodiment 1, setting of an optimal condition is difficult because above-described Eq. 2 includes gain A of the inverting amplifier. Therefore, CLS 1.0 is susceptible to effects of variations which arise in the process of manufacturing the switched capacitor circuit 200. In contrast, CLS 2.0 according to Embodiment 2 does not involve adjustment of gain A of the inverting amplifier for application of the CLS technique. Therefore, mass-production of CLS 2.0 having like characteristics is more easily than that of CLS 1.0.

Embodiment 3

Embodiment 3 is different from Embodiment 2 in that a switched capacitor circuit according to Embodiment 3 includes a first clamping circuit and a second clamping circuit instead of the offset compensation unit included in the switched capacitor circuit 200. With this, the problem with the conventional technique is overcome also in Embodiment 3 as in Embodiments 1 and 2.

Figure 11:
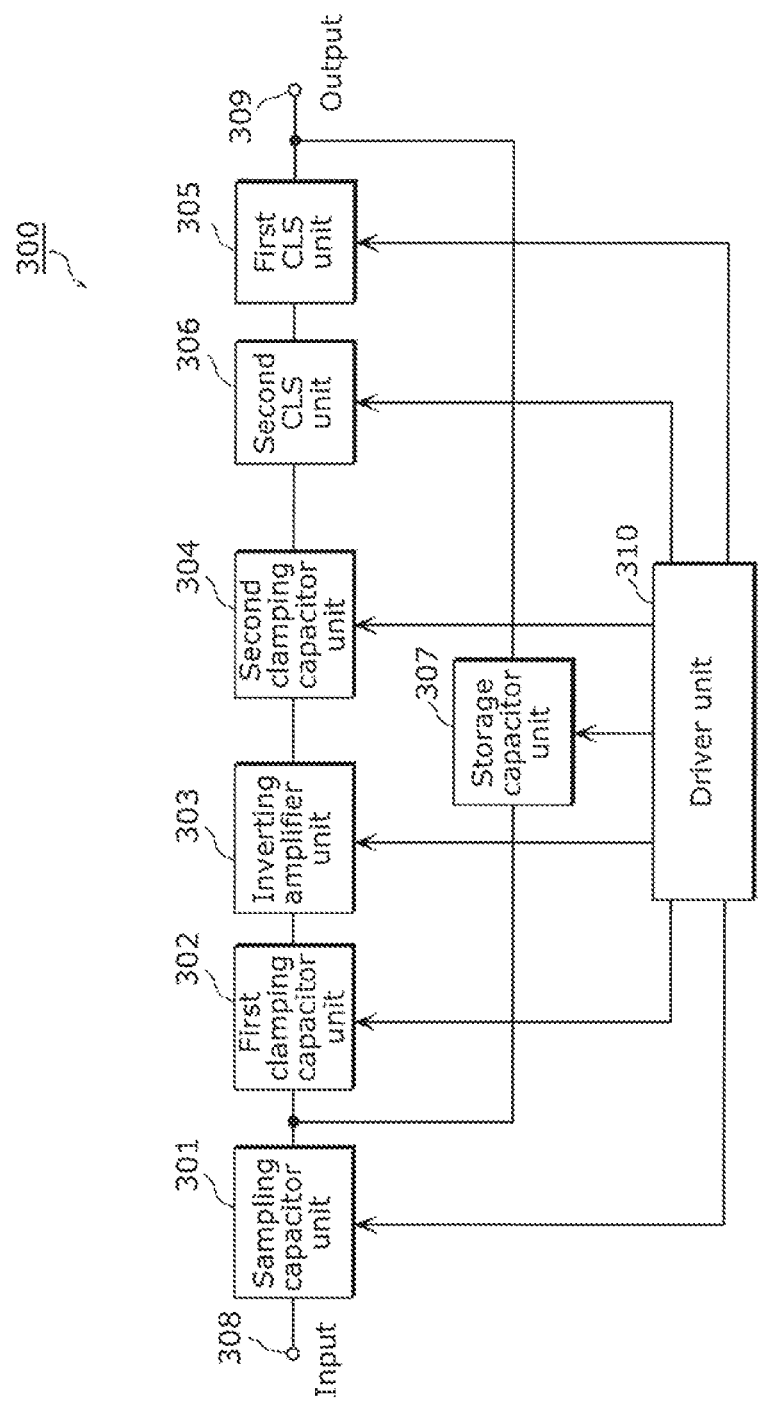
FIG. 11 is a functional block diagram of a switched capacitor circuit according to Embodiment 3.

FIG. 11 is a functional block diagram of a switched capacitor circuit according to Embodiment 3. A switched capacitor circuit 300 illustrated in FIG. 11 includes a sampling capacitor unit 301, a first clamping capacitor unit 302, an inverting amplifier unit 303, a second clamping capacitor unit 304, a first CLS unit 305, a second CLS unit 306, a storage capacitor unit 307, an input terminal 308, an output terminal 309, and a driver unit 310. The driver unit 310 controls these units so that the switched capacitor circuit 300 in operation transits from a sampling phase to a transfer phase to a first CLS phase to a second CLS phase in this order. These phases of the switched capacitor circuit 300 never overlap each other at any time.

The sampling capacitor unit 301 includes an input port and an output port. In the sampling phase, the input port is connected to the input terminal 308, and the sampling capacitor unit 301 samples a potential difference between a first reference voltage and an input voltage applied to the input terminal 308. In the transfer phase, the first CLS phase, and the second CLS phase, the input port of the sampling capacitor 301 is unconnected with the input terminal 308, so that the first reference voltage is applied to the input port.

In the sampling phase, the first clamping capacitor unit 3032 samples a potential difference between the first reference voltage and a voltage at an input port of the inverting amplifier unit 303. In the transfer phase, the first CLS phase, and the second CLS phase, a capacitor holding the potential difference is connected in series between the output port of the sampling capacitor unit 301 and the input port of the inverting amplifier unit 303.

The inverting amplifier unit 303 includes an input port and an output port. The input port and output port of the inverting amplifier unit 303 are short-circuited in the sampling phase and open in the transfer phase, the first CLS phase, and the second CLS phase.

In the sampling phase, the second clamping capacitor unit 304 samples a potential difference between a voltage at the output port of the inverting amplifier unit 303 and the first reference voltage. In the transfer phase, the second clamping capacitor unit 304 holds the potential difference at the moment when the output port of the inverting amplifier unit 303 and an input port of the second CLS unit 306 are short-circuited. In the first CLS phase, a capacitor holding the potential difference is connected in series between the output port of the inverting amplifier unit 303 and the input port of the first CLS unit 305. In the second CLS phase, the capacitor is connected in series between the output port of the inverting amplifier unit 303 and the input port of the second CLS unit 306.

The first CLS unit 305 includes an input port and an output port. In the sampling phase and the transfer phase, the first CLS unit 305 samples a potential difference between a voltage at the output port of the inverting amplifier unit 303 and the first reference voltage. In the first CLS phase, a capacitor holding the potential difference is connected between the output port of the second CLS unit 306 and the output terminal 309.

The second CLS unit 306 includes an input port and an output port. In the sampling phase and the transfer phase, the second CLS unit 306 samples a potential difference between a voltage at the output port of the inverting amplifier unit 202 and the first reference voltage. In the second CLS phase, a capacitor holding the potential difference is connected in series between the output port of the inverting amplifier unit 303 and the input port of the first CLS unit 305.

In the sampling phase, a path from the output port of the sampling capacitor 301 to the output terminal 309 via the storage capacitor unit 307 is broken. In the transfer phase, the first CLS phase, and the second CLS phase, the path is made.

The driver unit 310 controls connection and disconnection between the terminals and connection and disconnection of the capacitors with the other elements of the switched capacitor circuit 300.

Figure 12:
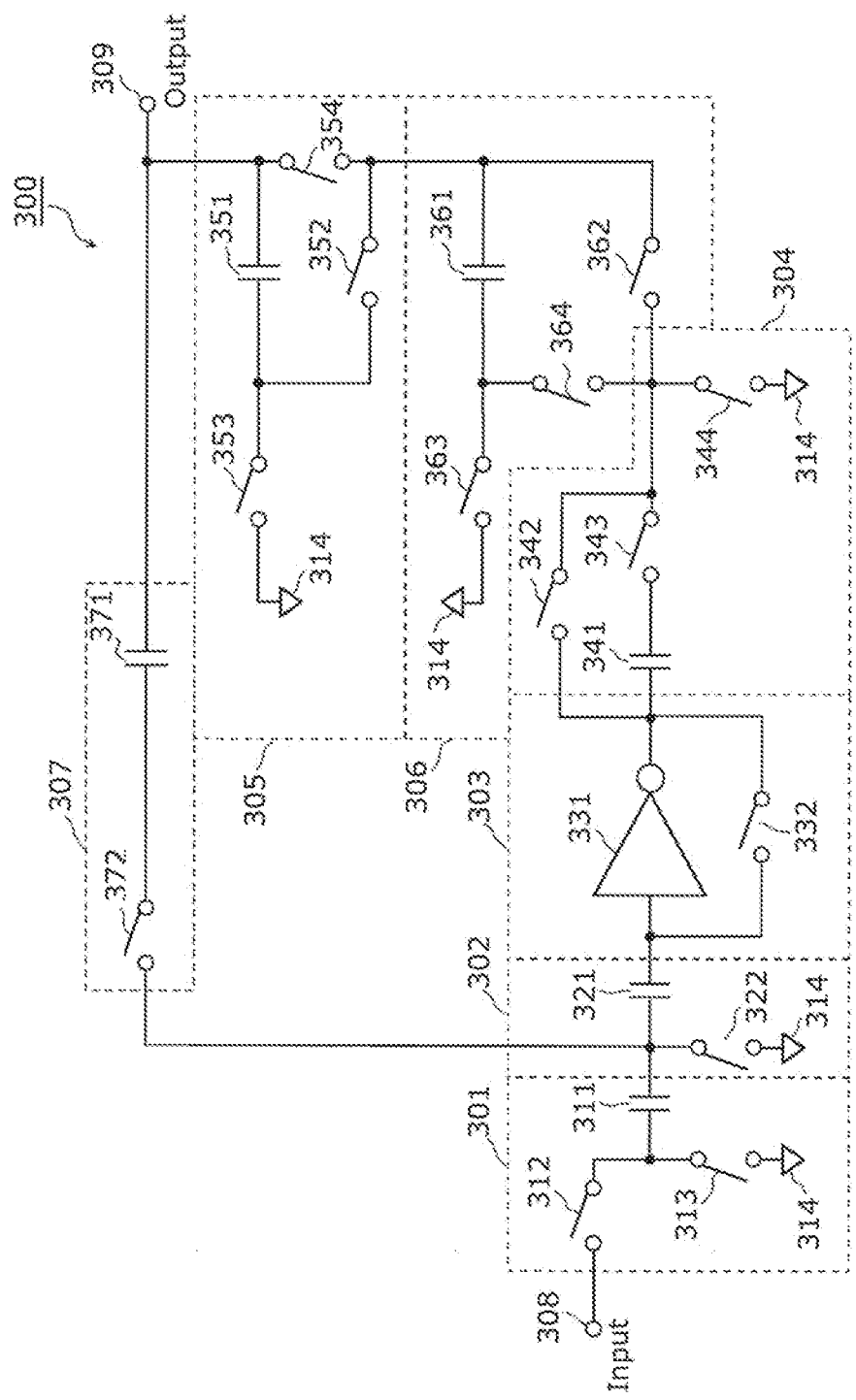
FIG. 12 is a circuit configuration diagram of the switched capacitor circuit according to Embodiment 3.

FIG. 12 is a circuit configuration diagram of the switched capacitor circuit according to Embodiment 3. The circuit configuration of the switched capacitor circuit 300 illustrated in FIG. 12 is an example of the units (except the driver unit 310) of the switched capacitor circuit 300 illustrated in FIG. 11. The input terminal 308 is a first input terminal, and the output terminal 309 is a first output terminal.

The sampling capacitor unit 301 includes a capacitor 311, a switch 312 which connects and disconnects the input terminal 308 and a first electrode of the capacitor 311, and a switch 312 which connects and disconnects the first electrode of the capacitor 311 and a reference voltage source 314. The reference voltage source 314 is set at a reference voltage, and the reference voltage in Embodiment 3 is 0 V. The capacitor 311 is a sampling capacitor including a first terminal and a second terminal, and is connected so that an input voltage is applied to the first terminal.

The first clamping capacitor unit 302 includes a capacitor 321 and a switch 322 which connects and disconnects a first electrode of the capacitor 321 and the reference voltage source 314. The capacitor 321 is a first clamping capacitor including a third terminal and a fourth terminal, and the third terminal is connected to the second terminal.

The inverting amplifier unit 303 includes a single-ended inverting amplifier 331 and a switch 332 which connects and disconnects an input port and an output port of the inverting amplifier 331. The inverting amplifier 331 includes a second input terminal and a second output terminal, and the second input terminal is connected to the fourth terminal.

The second clamping capacitor unit 304 includes a capacitor 341 and switches 342 and 343 which connect and disconnect a second electrode of the capacitor 341 and the input port of the second CLS unit 306, and a switch 344 which connects and disconnects the input port of the second CLS unit 306 and the reference voltage source 314. The capacitor 341 is a second clamping capacitor including a fifth terminal and a sixth terminal, and the fifth terminal is connected to the second output terminal. The capacitor 341 samples a potential difference between the short-circuit voltage of the inverting amplifier 331 and the reference voltage when the capacitor 341 is short-circuited with the second input terminal and the second output terminal being connected.

The first CLS unit 305 includes a capacitor 351, a switch 352, a switch 353, and a switch 354. The switch 352 connects and disconnects a first electrode of the capacitor 351 and an output port of the second CLS unit 306. The switch 353 connects and disconnects the first electrode of the capacitor 351 and the reference voltage source 314. The switch 354 connects and disconnects the output port of the second CLS unit 306 and the output terminal 309. The first CLS unit 305 is a first level-shifting capacitor including a seventh terminal and an eighth terminal. The seventh terminal is a second electrode. The eighth terminal is switchable between connected to the seventh terminal and being connected to the first electrode. The capacitor 351 shifts the level of the voltage at the second output terminal when the capacitor 351 is electrically connected in series between the second electrode of the capacitor 361 and the first output terminal.

The second CLS unit 306 includes a capacitor 361, a switch 362, a switch 363, and a switch 364. The switch 362 connects and disconnects the output port of the second clamping capacitor unit 304 and the input port of the first CLS unit 305. The switch 363 connects and disconnects a first electrode of the capacitor 361 and the reference voltage source 314. The switch 364 connects and disconnects the first electrode of the capacitor 361 and the output port of the second clamping capacitor unit 304. The second CLS unit 306 is a second level-shifting capacitor including a ninth terminal and a tenth terminal. The ninth terminal is a second electrode and is connected to the eighth terminal. The tenth terminal is switchable between being connected to the ninth terminal and being connected to the first electrode. The tenth terminal is switchable between being short-circuited with and being disconnected from the sixth terminal. The capacitor 361 shifts the level of the voltage at the second output terminal when capacitor 351 is electrically connected in series between the eighth terminal of the capacitor 351 and the sixth terminal.

The storage capacitor unit 307 includes a capacitor 371 and a switch 372 which connects and disconnects a first electrode of the capacitor 371 and a first electrode of the capacitor 321 The capacitor 371 is a storage capacitor including an eleventh terminal and a twelfth terminal, and is connected so that the eleventh terminal and the twelfth terminal are connected to the second terminal and the first output terminal, respectively.

The driver unit 310 in FIG. 11, not shown in the circuit configuration illustrated in FIG. 12, controls operation of the switches 312, 313, 322, 332, 342 to 344, 352 to 354, 362 to 364, and 372 in the other units included in the switched capacitor circuit 300.

The switched capacitor circuit 300 in operation transits from a sampling phase to a transfer phase to a first CLS phase to a second CLS phase in this order according to ON-OFF control of the switches. The following describes operation of the switched capacitor circuit 300 in each of the phases.

FIG. 13A, FIG. 13B, FIG. 13C, and FIG. 13D are circuit diagrams illustrating connection in the switched capacitor circuit according to Embodiment 3 in the sampling phase, transfer phase, first CLS phase, and second CLS phase, respectively.

Figure 13A:
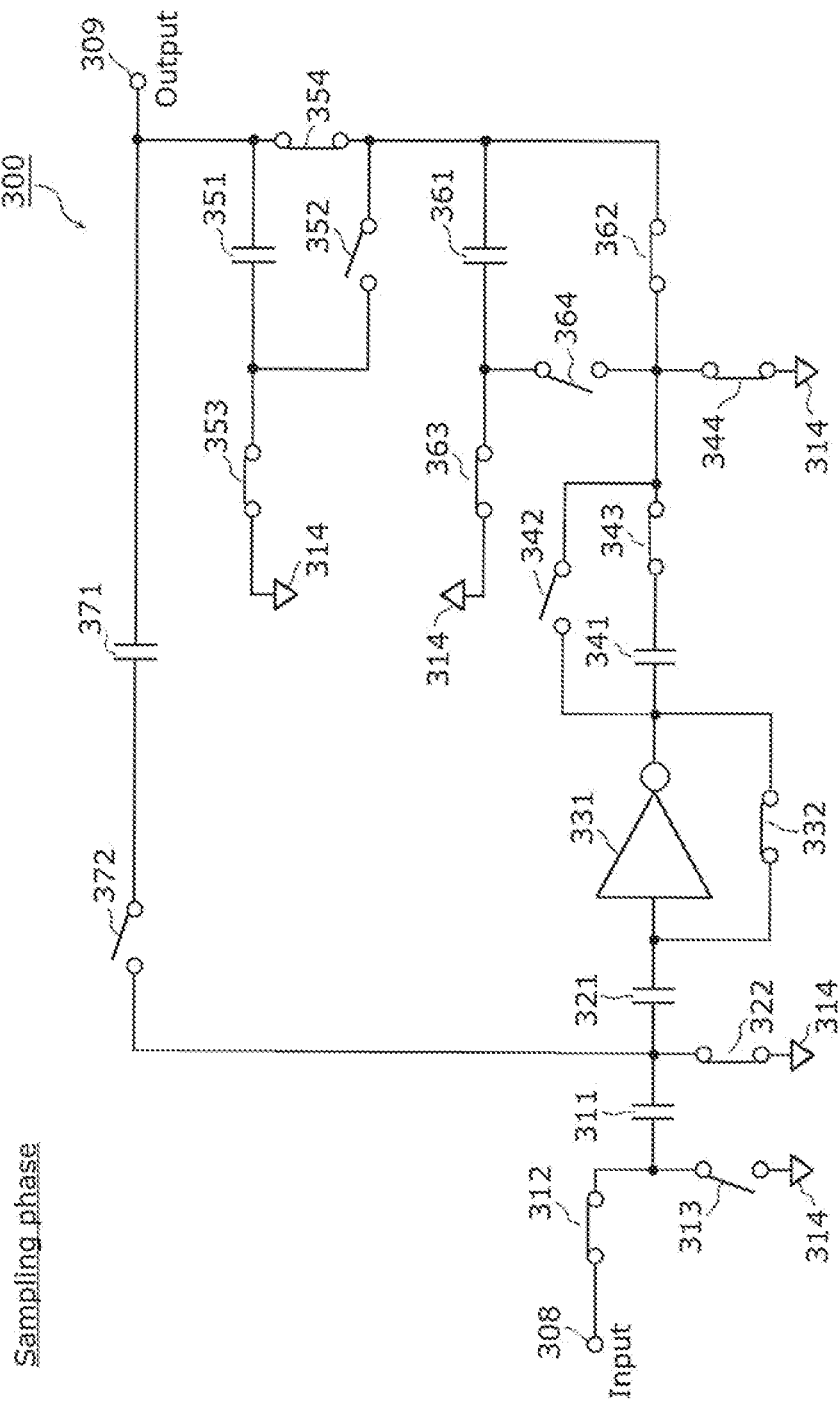
FIG. 13A is a circuit diagram illustrating connection in the switched capacitor circuit according to Embodiment 3 in a sampling phase.

First, in the sampling phase, the switches 312, 322, 332, 343, 353, 354, 362, and 363 are closed, and the switches 313, 342, 352, 364, and 372 are open as illustrated in FIG. 13A.

At this time the input port and output port of the inverting amplifier 331 are short-circuited, and the short-circuit voltage of the inverting amplifier 331 is equal to the virtual ground voltage Vx [V]. Thus, when the voltage of the reference voltage source 314 is 0 [V], the voltage across the capacitor 321 with an electrode on the right side in FIG. 13A being positive is Vx [V]. At the same time, the voltage across the capacitor 341 with an electrode on the left side in FIG. 13A being positive is Vx [V]. The capacitor 311 stores, a charge of Cs(Vin−Vx) [C] with an electrode on the left side in FIG. 13A being positive, where the voltage at the input terminal 308 is Vin [V]. Cs denotes capacitance of the capacitor 311. Meanwhile, the charge stored in the capacitor 371 remains unchanged. The initial charge of the capacitor 371 is assumed to be 0 [C] for ease of explanation. In this case, the switches 353, 354, 362, and 363 may be dosed or open, but are preferably dosed for the purpose of securing initialization of the capacitors 351 and 361.

Figure 13B:
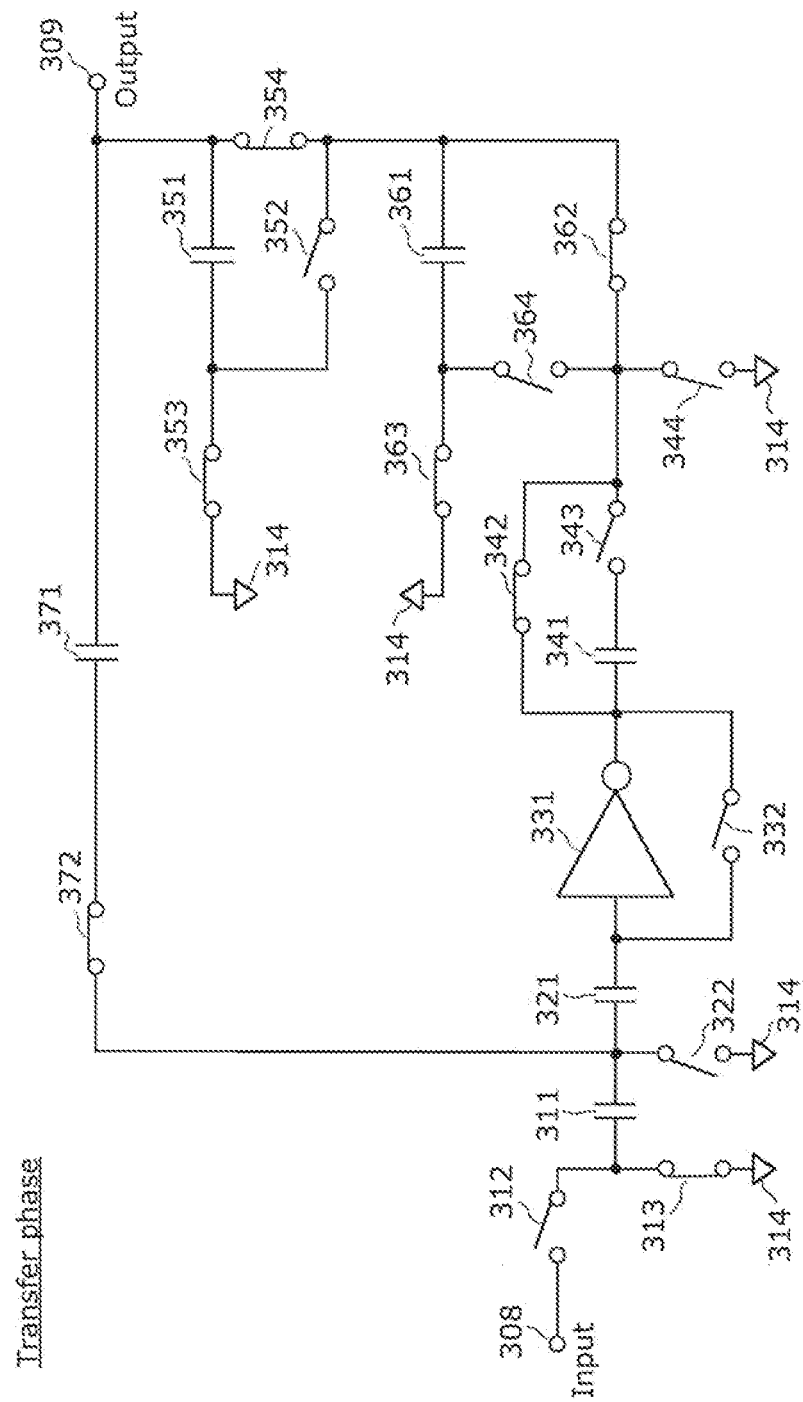
FIG. 13B is a circuit diagram illustrating connection in the switched capacitor circuit according to Embodiment 3 in a transfer phase.
Figure 13D:
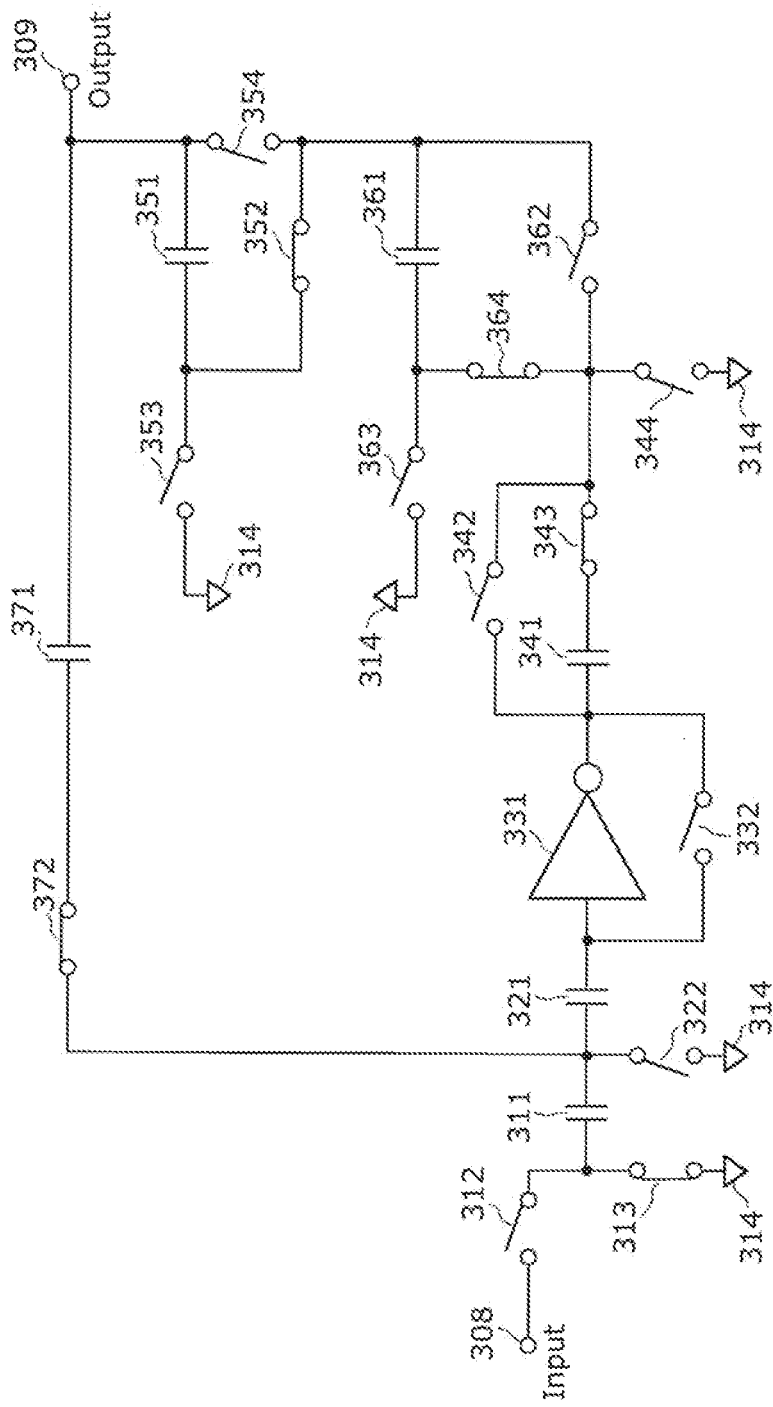
FIG. 13D is a circuit diagram illustrating connection in the switched capacitor circuit according to Embodiment 3 in a second CLS phase.

In the transfer phase following the sampling phase, the switches 312, 322, 332, 343, 344, 352, and 264 are open, and the switches 313, 342, 353, 354, 362, 363, and 372 are closed as illustrated in FIG. 13B.

When the voltage of the reference voltage source 314 is 0 [V] with this connection, transfer of the charge stored in the capacitor 311, which is equivalent to CsVin [C], to the capacitor 371 by the inverting amplifier 331 starts. At this time, the input port voltage of the inverting amplifier 331 is −ΔV/A, where. A denotes the gain of the inverting amplifier 331 and ΔV denotes the difference of the output voltage of the inverting amplifier 331 from the virtual ground voltage. Thus, the potential difference across the capacitor 371 is ΔV+ΔV/A with the second electrode (right one in FIG. 13B) being positive, and the potential difference across each of the capacitor 351 and the capacitor 361 is ΔV with the second electrode (right one in FIG. 13B) being positive.

In the first CLS phase following the transfer phase, the switches 312, 322, 342, 344, 353, 354, and 364 are open, and the switches 313, 343, 352, 362, 363, and 372 are closed as illustrated in FIG. 13C.

With this connection, the capacitor 351 is connected between the output port of the inverting amplifier 331 and the output terminal 309. The voltage across of the capacitor 351 is held at ΔV, which produces the "level-raising" effect (level-shifting effect) and thereby the voltage at the output port of the inverting amplifier 331 changes from ΔV to a level substantially equal to the voltage across the capacitor 361 ΔVp ΔV). With this, floating of the voltage at the input port of the inverting amplifier 331 (equal to the virtual ground voltage of the system) is reduced. The accuracy of CLS of the switched capacitor circuit 300 is comparable to that of the switched capacitor circuit in the above-described comparative example.

In the second CLS phase following the first CLS phase, the switches 312, 322, 332, 342, 344, 353, 354, 362, and 363 are open, and the switches 313, 343, 352, 364, and 372 are closed.

With this connection, the capacitor 361 is connected between the first electrode of the capacitor 351 and the output port of the inverting amplifier 331. This is a change in the connection from the connection in the first CLS phase. The voltage across of the capacitor 361 is held at ΔVp, which produces the "level-raising" effect (level-shifting effect) and thereby the voltage at the output port of the inverting amplifier 331 changes from ΔVp to a further lower level of ΔVpp (<<ΔVp). At this time, the voltage at the input port of the inverting amplifier 331 is −ΔVpp/A, which is substantially low compared to −Vp/A. With this, the switched capacitor circuit 300 operates more accurately than when the CLS technique is used in the above-described comparative example. Accordingly, floating of the voltage at the input port of the inverting amplifier 331 (equal to the virtual ground voltage of the system) is reduced.

Furthermore, the switched capacitor circuit performs iterations of the operation cycle from the sampling phase through the second CLS phase, and thereby performs integration operation accurately despite the low gain of the operational amplifier included in the switched capacitor circuit.

In the above-described configuration, the switched capacitor circuit includes not a differential operational amplifier but a single-ended inverting amplifier instead, and this is capable of faster operation and is of high accuracy.

The CLS technique can achieve higher accuracy when a switched capacitor circuit includes more cascaded capacitors each having a circuit configuration as with the capacitors 351 and 361 and operates in an operation cycle which further includes a third CLS phase and a fourth CLS phase subsequent to the second CLS phase.

Embodiment 4

Embodiment 4 is different from Embodiment 3 in that a switched capacitor circuit according to Embodiment 4 further includes a third clamping capacitor unit in addition to the units of the switched capacitor circuit 300 according to Embodiment 3. With this, the problem with the conventional technique is overcome with a high degree of accuracy 4 compared to Embodiment 3.

Figure 14:
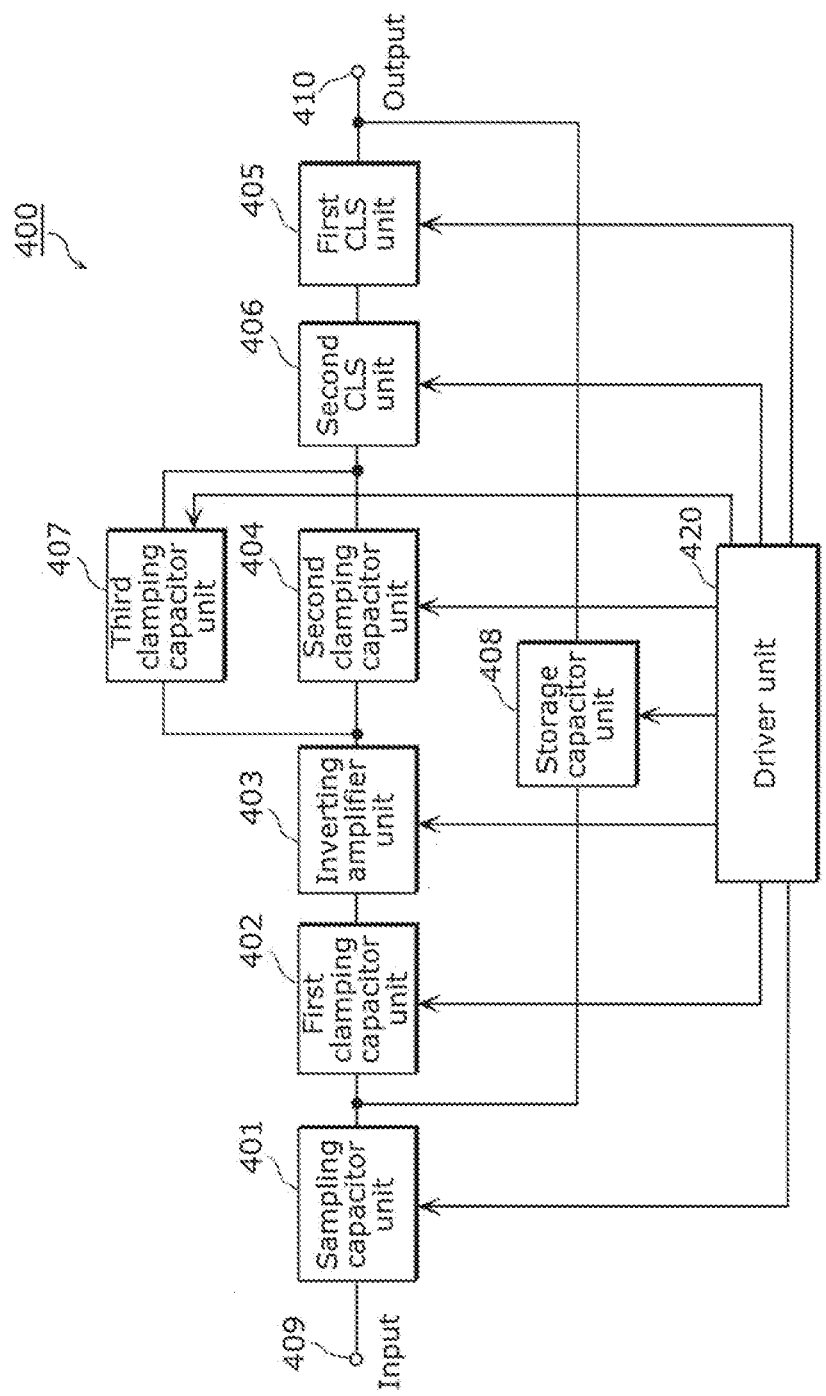
FIG. 14 is a functional block diagram of a switched capacitor circuit according to Embodiment 4.

FIG. 14 is a functional block diagram of a switched capacitor circuit according to Embodiment 4. A switched capacitor circuit 400 illustrated in FIG. 14 includes a sampling capacitor unit 401, a first clamping capacitor unit 402, an inverting amplifier unit 403, a second clamping capacitor unit 404, a first CLS unit 405, a second CLS unit 406, a third clamping capacitor unit 407, a storage capacitor unit 408, an input terminal 409, an output terminal 410, and a driver unit 420. The driver unit 420 controls these units so that the switched capacitor circuit 400 in operation transits from a sampling phase to a transfer phase to a first CLS phase to a second CLS phase in this order. These phases of the switched capacitor circuit 400 never overlap each other at any time.

The sampling capacitor 401, the first clamping capacitor unit 402, the inverting amplifier unit 403, the second clamping capacitor unit 404, the first CLS unit 405, the second CLS unit 406, and the storage capacitor unit 408 are configured in the same manner as the sampling capacitor 301, the first clamping capacitor unit 302, the inverting amplifier unit 303, the second clamping capacitor unit 304, the first CLS unit 305, the second CLS unit 306, and the storage capacitor unit 307 according to Embodiment 3, respectively.

In the sampling phase, the third clamping capacitor unit 407 samples a potential difference between a voltage at the output port of the inverting amplifier unit 403 and a first reference voltage. In the transfer phase, the third clamping capacitor unit 407 holds the potential difference. In the first CLS phase, the third clamping capacitor unit 407 holds the potential difference. In the second CLS phase, the third clamping capacitor unit 407 is connected in series between the output port of the inverting amplifier unit 403 and the input port of the second CLS unit 406.

The driver unit 420 controls connection and disconnection between the terminals and connection and disconnection of the capacitors with the other elements of the switched capacitor circuit 400.

Figure 15:
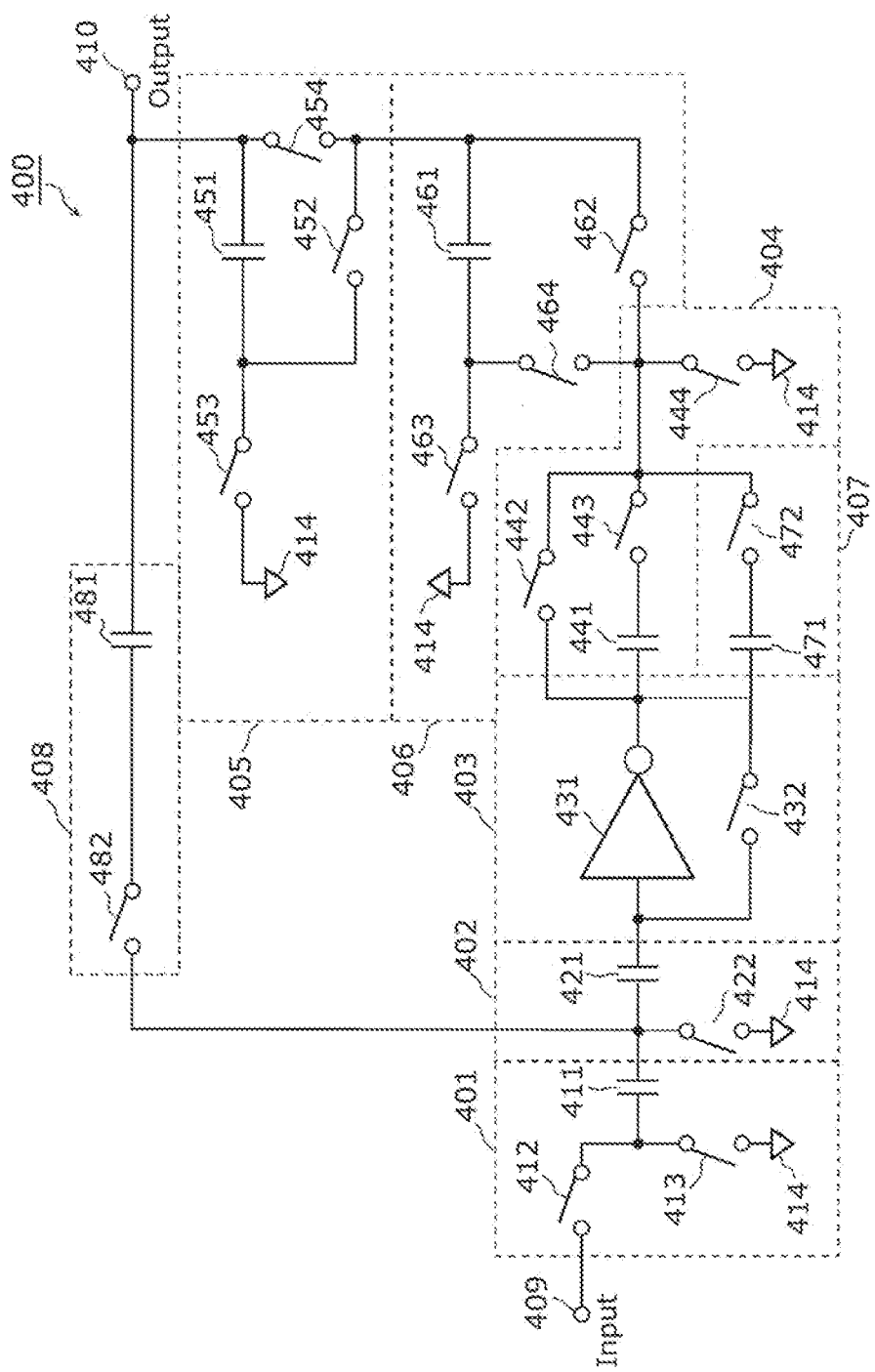
FIG. 15 is a circuit configuration diagram of the switched capacitor circuit according to Embodiment 4.

FIG. 15 is a circuit configuration diagram of the switched capacitor circuit according to Embodiment 4. The circuit configuration of the switched capacitor circuit 400 illustrated in FIG. 15 is an example of the units (except the driver unit 420) of the switched capacitor circuit 400 illustrated in FIG. 14. The input terminal 409 is a first input terminal, and the output terminal 410 is a first output terminal.

The circuit configuration of the sampling capacitor 401, the first clamping capacitor unit 402, the inverting amplifier unit 403, the second clamping capacitor unit 404, the first CLS unit 405, the second CLS unit 406, and the storage capacitor unit 408 is not specifically described herein.

The third clamping capacitor unit 407 includes a capacitor 471 and a switch 472 which connects and disconnects a second electrode of the capacitor 471 and the input port of the second CLS unit 406. The third clamping capacitor unit 407 includes a thirteenth terminal and a fourteenth terminal. The thirteenth terminal is connected to the second output terminal. The fourteenth terminal is switchable between being short-circuited with and being disconnected from the sixth terminal and the tenth terminal. The capacitor 471 samples a potential difference between the short-circuit voltage of the inverting amplifier 431 and the reference voltage when the capacitor 431 is short-circuited with the second input terminal and the second output terminal being connected.

The driver unit 420 in FIG. 14, not shown in the circuit configuration illustrated in FIG. 15, controls operation of the switches 412, 413, 422, 432, 442 to 444, 452 to 454, 462 to 464, 472 and 482 in the other units included in the switched capacitor circuit 400.

The switched capacitor circuit 400 in operation transits from a sampling phase to a transfer phase to a first CLS phase to a second CLS phase in this order according to ON-OFF control of the switches. The following describes operation of the switched capacitor circuit 400 in each of the phases.

FIG. 16A, FIG. 16B, FIG. 16C, and FIG. 16D are circuit diagrams illustrating connection in the switched capacitor circuit according to Embodiment 4 in the sampling phase, transfer phase, first CLS phase, and second CLS phase, respectively.

Figure 16A:
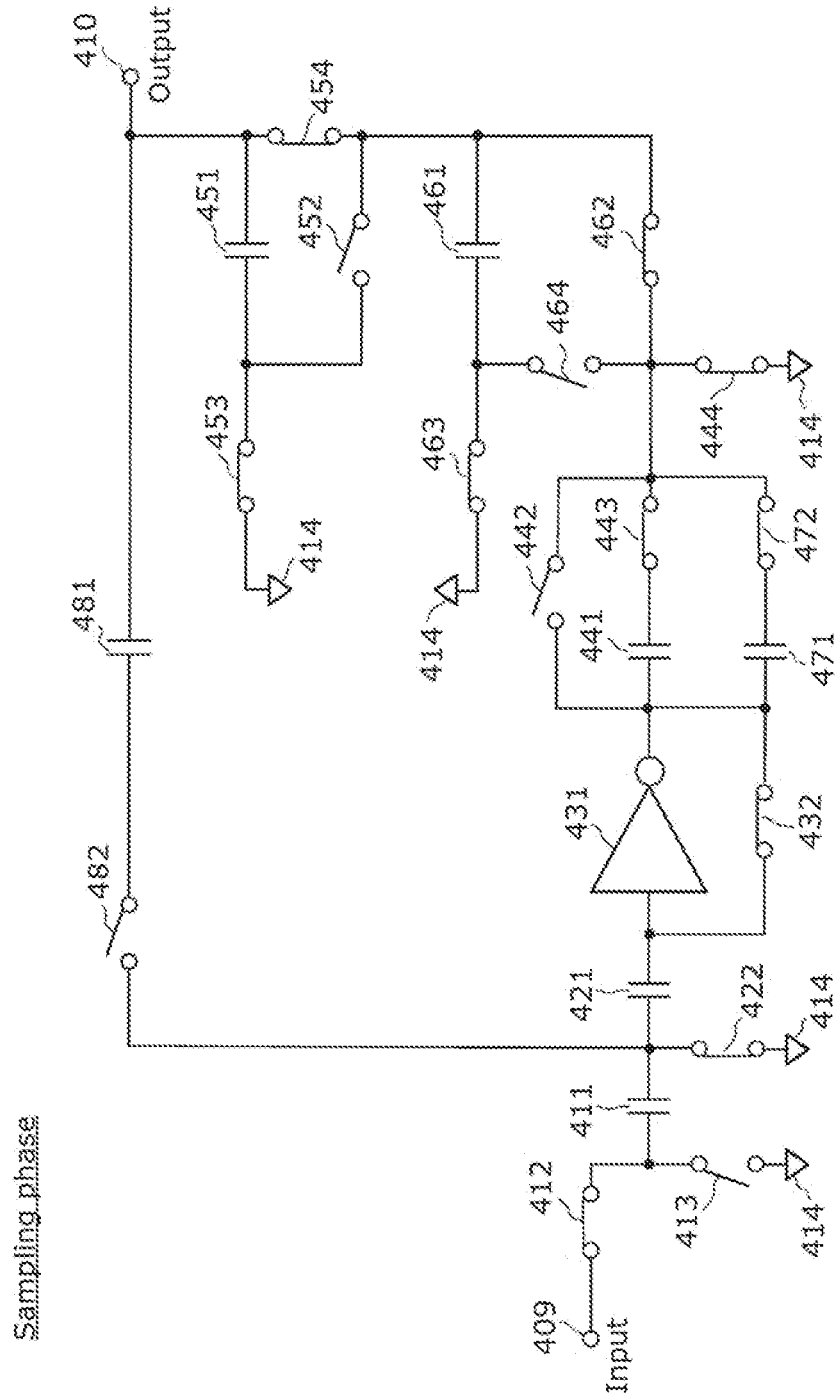
FIG. 16A is a circuit diagram illustrating connection in the switched capacitor circuit according to Embodiment 4 in a sampling phase.

First, in the sampling phase, the switches 412, 422, 432, 443, 453, 454, 462, 463, and 472 are closed and the switches 413, 442, 452, 464, and 482 are open as illustrated in FIG. 16A.

At this time, the input port and output port of the inverting amplifier 431 are short-circuited, and the short-circuit voltage of the inverting amplifier 431 is equal to the virtual ground voltage Vx [V]. Thus, when the voltage of the reference voltage source 414 is 0 [V], the voltage across the capacitor 421 with an electrode on the right side in FIG. 16A being positive is Vx [V]. At the same time, the voltage across the capacitor 441 with an electrode on the left side in FIG. 16A being positive is Vx [V]. The capacitor 411 stores a charge of Cs(Vin−Vx) [C] with an electrode on the left side in FIG. 16A being positive, where the voltage at the input terminal 409 is Vin [V]. Cs denotes capacitance of the capacitor 411. Meanwhile, the charge stored in the capacitor 481 remains unchanged. The initial charge of the capacitor 481 is assumed to be 0 [C] for ease of explanation. In this case, the switches 453, 454, 462, and 463 may be closed or open, but are preferably closed for the purpose of securing initialization of the capacitors 451 and 461.

Figure 16B:
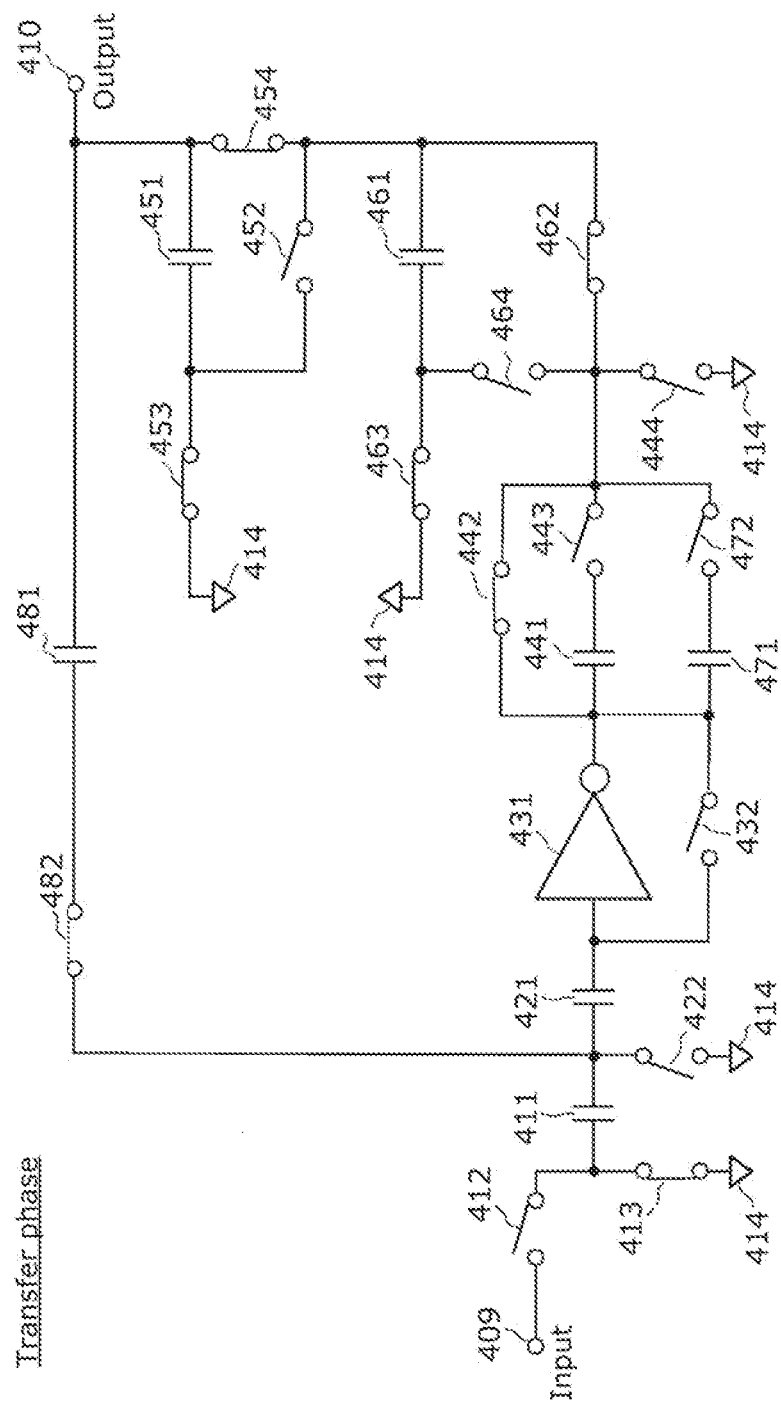
FIG. 16B is a circuit diagram illustrating connection in the switched capacitor circuit according to Embodiment 4 in a transfer phase.

In the transfer phase following the sampling phase, the switches 412, 422, 432, 443, 444, 452, 464, and 472 are open, and the switches 413, 442, 453, 454, 462, 463, and 482 are closed as illustrated in FIG. 16B.

When the voltage of the reference voltage source 414 is 0 [V] with this connection, transfer of the charge stored in the capacitor 411, which is equivalent to CsVin [C], to the capacitor 481 by the inverting amplifier 431 starts. At this time, the input port voltage of the inverting amplifier 431 is $-\Delta V/A$, where A denotes the gain of the inverting amplifier 331 and $\Delta V$ denotes the difference of the output voltage of the inverting amplifier 431 from the virtual ground voltage. Thus, the potential difference across the capacitor 481 is $\Delta V + \Delta V/A$ with the second electrode (right one in FIG. 16B) being positive, and the potential difference across each of the capacitor 451 and the capacitor 461 is $\Delta V$ with the second electrode (right one in FIG. 16B) being positive.

Figure 16C:
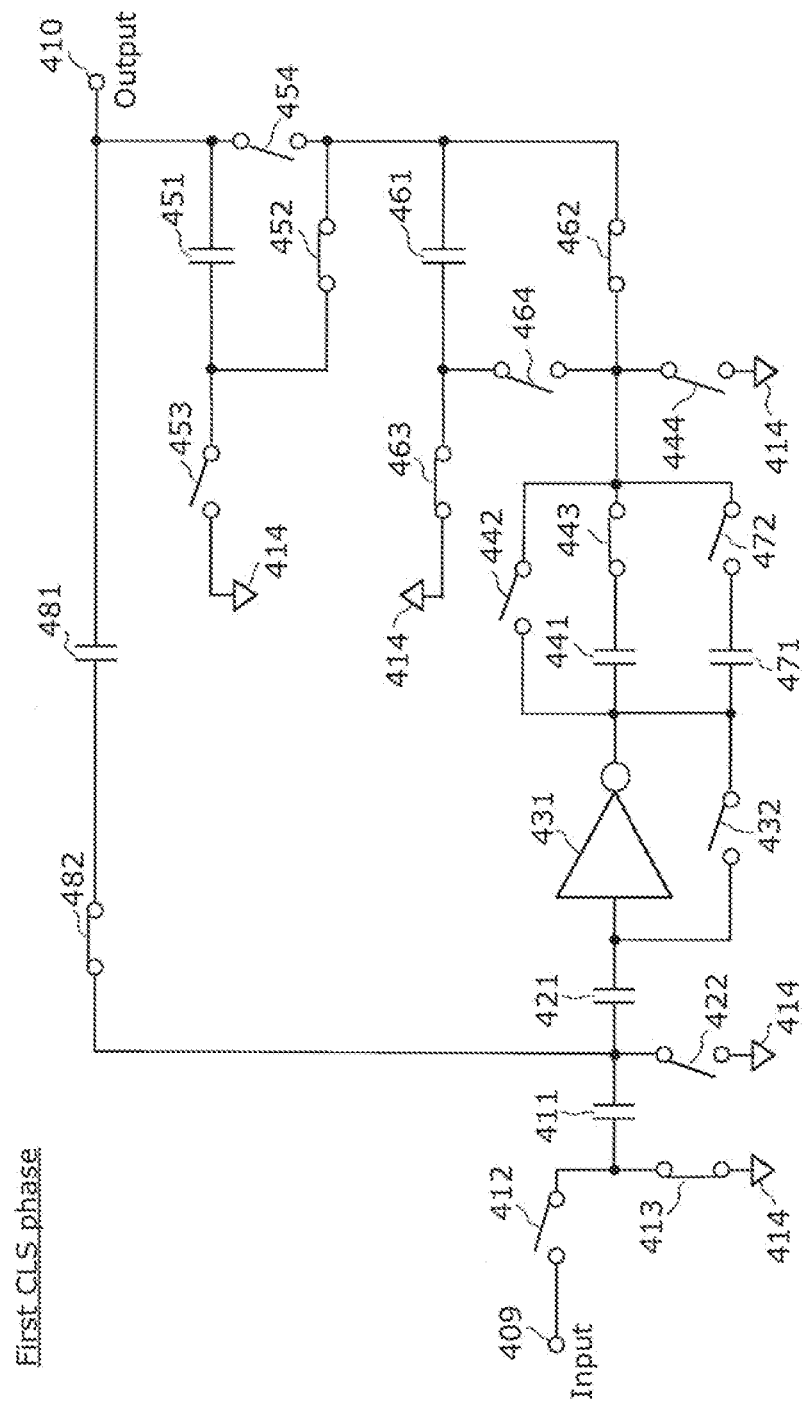
FIG. 16C is a circuit diagram illustrating connection in the switched capacitor circuit according to Embodiment 4 in a first CLS phase.

In the first CLS phase following the transfer phase, the switches 412, 422, 442, 444, 453, 454, 464, and 472 are open, and the switches 413, 443, 452, 462, 463, and 482 are closed as illustrated in FIG. 16C.

With this connection, the capacitor 431 is connected between the output port of the inverting amplifier 431 and the output terminal 410. The voltage across of the capacitor 451 is held at $\Delta V$, which produces the "level-raising" effect (level-shifting effect) and thereby the voltage at the output port of the inverting amplifier 431 changes from $\Delta V$ to a level substantially equal to the voltage across the capacitor 461 $\Delta Vp$ ($\ll \Delta V$). With this, floating of the voltage at the input port of the inverting amplifier 431 (equal to the virtual ground voltage of the system) is reduced. The accuracy of CLS of the switched capacitor circuit 400 is comparable to that of the switched capacitor circuit in the above-described comparative example.

In the second CLS phase following the first CLS phase, the switches 412, 422, 432, 442, 444, 453, 454, 462, and 463 are open, and the switches 413, 443, 452, 464, 472, and 482 are closed as illustrated in FIG. 16D.

In the first CLS phase, the charge stored in the capacitor 441 of the second clamping capacitor unit 404 changes, corresponding to the change of the virtual ground voltage from $\Delta V$ to $\Delta Vp$. Thus, in the second CLS phase, clamping of the output voltage of the inverting amplifier 431 is performed by the capacitor 471 of the third clamping capacitor unit 407 having an unchanged charge instead of the capacitor 441 of the second clamping capacitor 404. In the second CLS phase, the capacitor 461 is connected between the first electrode of the capacitor 451 and the output port of the inverting amplifier 431. This is a change in the connection from the connection in the first CLS phase. The voltage across of the capacitor 461 is held at $\Delta Vp$, which produces the "level-raising" effect (level-shifting effect) and thereby the voltage at the output port of the inverting amplifier 431 changes from $\Delta Vp$ to a further lower level of $\Delta Vppp$ ($\ll \Delta Vp$). At this time, the voltage at the input port of the inverting amplifier 431 is $-\Delta Vppp/A$, which is substantially low compared to $-Vp/A$. With this, the switched capacitor circuit 400 operates more accurately than when the CLS technique is used in the above-described comparative example. $\Delta Vppp$ is smaller than $\Delta Vpp$ due to the use of the third clamping capacitor unit 407 in the second CLS phase, so that higher accuracy is achieved than when the CLS technique is used according to Embodiment 3.

Accordingly, floating of the voltage at the input port of the inverting amplifier 431 (equal to the virtual ground voltage of the system) is reduced.

Furthermore, the switched capacitor circuit performs iterations of the operation cycle from the sampling phase through the second CLS phase, and thereby performs integration operation accurately despite the low gain of the operational amplifier included in the switched capacitor circuit.

In the above-described configuration, the switched capacitor circuit includes not a differential operational amplifier but a single-ended inverting amplifier instead, and thus is capable of faster operation and is of high accuracy.

The CLS technique can achieve higher accuracy when a switched capacitor circuit with more cascaded capacitors each having a circuit configuration as with the capacitors 451 and 461 includes a fourth clamping capacitor unit for a third CLS phase and a fifth clamping capacitor unit for a fourth CLS phase subsequent to the second CLS phase.

Embodiment 5

In Embodiment 5, an inverting amplifier unit has a configuration for lower power consumption and faster operation. The following describes such a configuration. The inverting amplifier according to any of Embodiments 1 to 4 may include an inverter circuit, for example. Examples of the inverter circuit in the inverting amplifier include a switched-current bias circuit.

Figure 17:
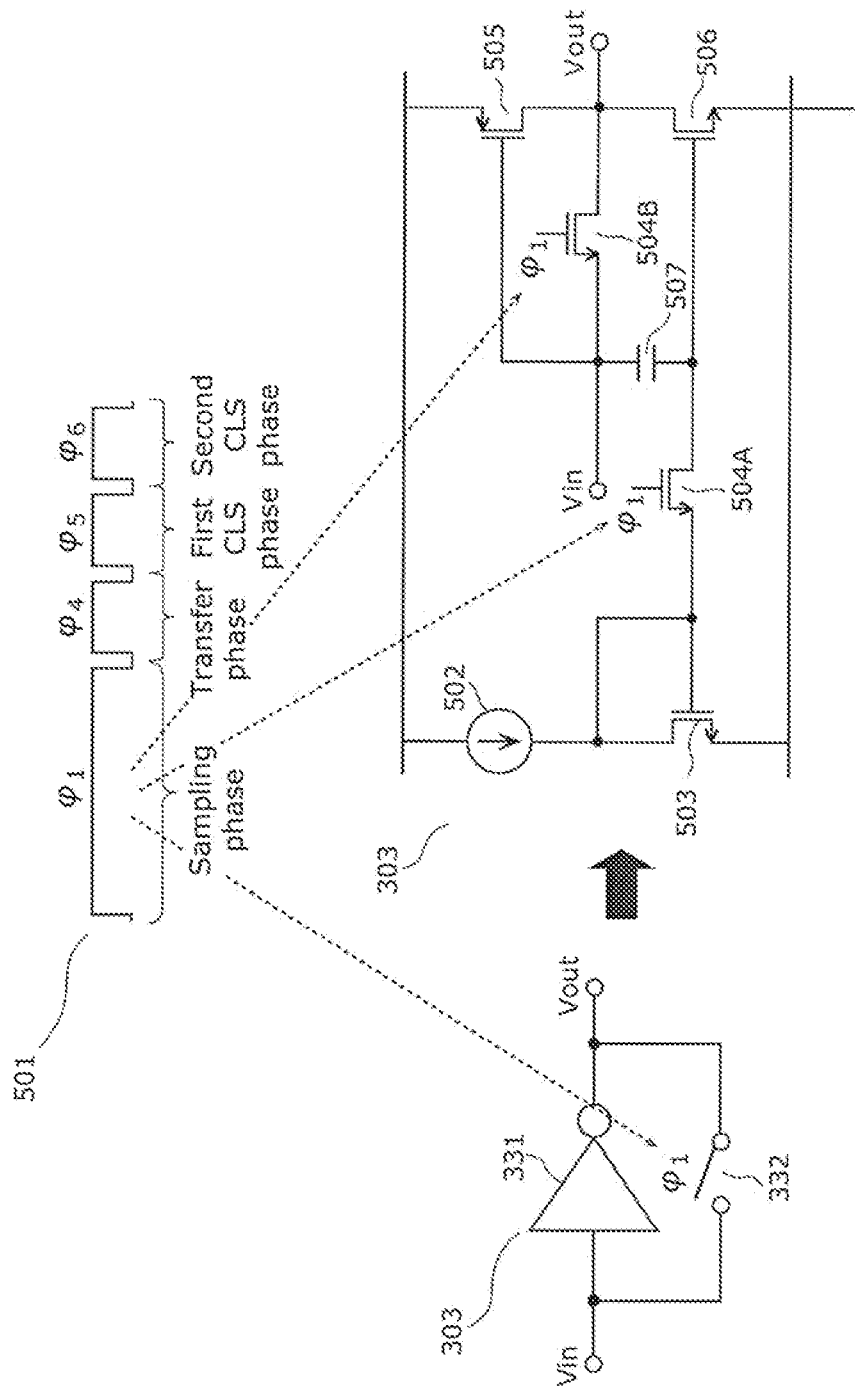
FIG. 17 is a configuration diagram of inverting amplifier unit according to Embodiment 5.

FIG. 17 is a circuit configuration diagram of an inverting amplifier unit according to Embodiment 5. The following describes the circuit configuration using the inverting amplifier unit 303 according to Embodiment 3 as an example. The inverting amplifier unit 303 includes the inverting amplifier 331 and the switch 332.

The inverting amplifier unit 303 includes a constant current source 502, NMOS transistors 503, 504A, 504B, and 506, a PMOS transistor 505, and a capacitor 507. The NMOS transistors 504A and 504B included in the switch 332 are controlled using a control signal 501 so that the NMOS transistors 504A and 504B are ON only in a sampling phase φ1 and OFF in the other phases. In the sampling phase φ1, the NMOS transistors 503 and 506 form a current mirror so that a current equal to a current from the constant, current source 502 passes the PMOS transistor 505, which is a diode-connected transistor. Then, the gate voltage of the NMOS transistor 506 and the gate voltage of the PMOS transistor 505 at this time are stored as the voltage across the capacitor 507. The voltage across the capacitor 507 is equivalent to the short-circuit voltage Vx [V]. Accordingly, in the sampling phase, the current flowing through the PMOS transistor 505 and the NMOS transistor 506 is maintained constant by the current from the constant current source 502, so that the inverter circuit has stable properties, particularly stable consumption current, free from fluctuation in process, temperature, and power supply voltage. Thus, including a single-ended inverter circuit, the switched capacitor circuit operates fast with lower power consumption in a smaller circuit area.

In the phases other than the sampling phase φ1, the inverter circuit performs an inverter operation with the gate voltages of the PMOS transistor 505 and the NMOS transistor 506 biased by the capacitor 507.

The above-described switched-current bias circuit advantageously achieves both lower power consumption and faster operation with a stabilized direct current from the constant current source 502 and the increased W/L ratio of the PMOS transistor 505 and the NMOS transistor 506.

Power consumption can be further reduced effectively by changing the amount of current flowing into the inverting amplifier from moment to moment. More specifically, a large current is provided only in the beginning of the sampling phase and the transfer phase in which a large current for the beginning of settling is necessary, and afterward the current is gradually reduced. This is an inverter operation using a dynamic current, so that power consumption can be reduced while settling speed is maintained.

Figure 18:
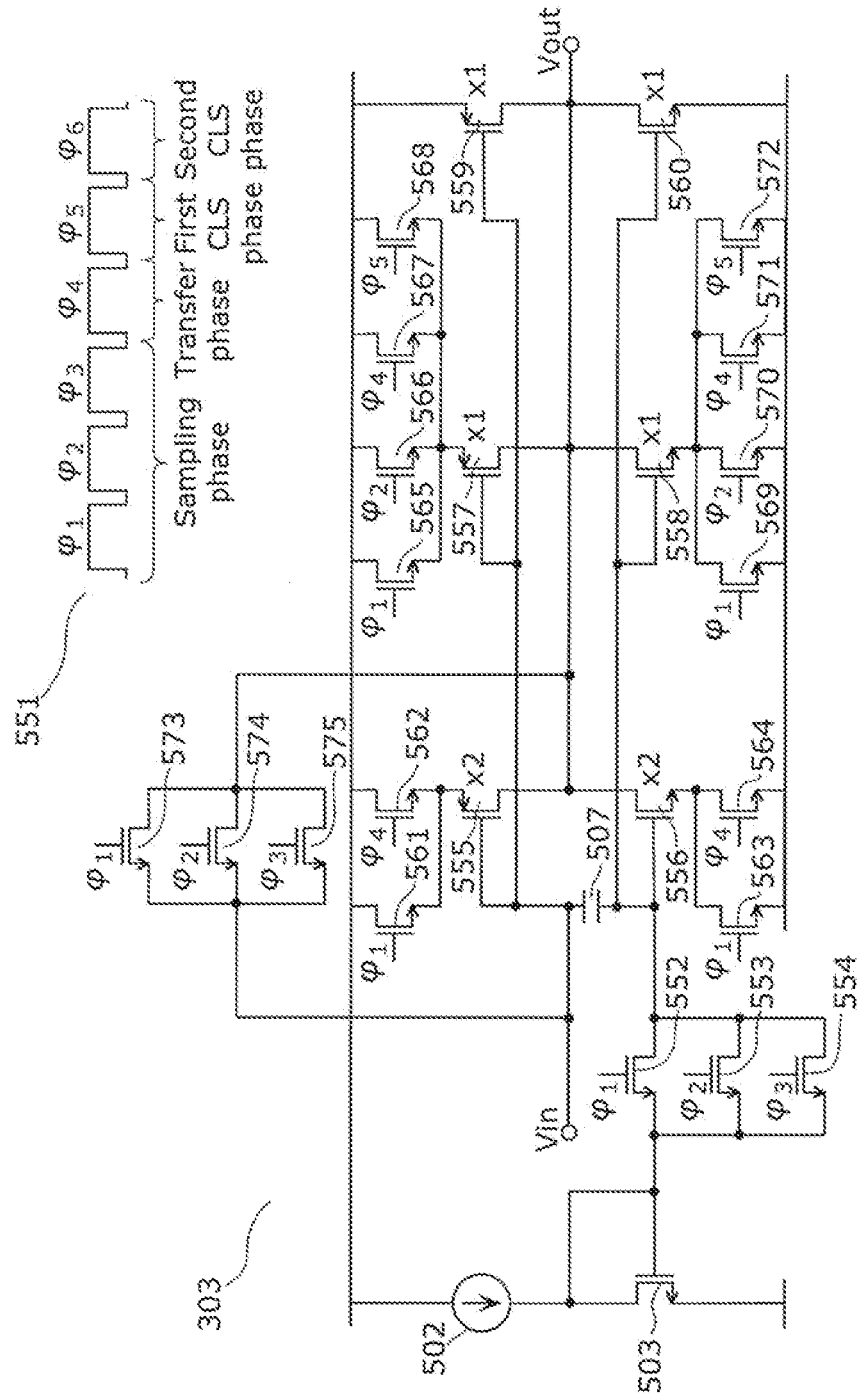
FIG. 18 is a configuration diagram of an inverting amplifier unit according to a variation of Embodiment 5.

FIG. 18 is a circuit configuration diagram of an inverting amplifier unit according to a variation of Embodiment 5. In FIG. 18, an inverting amplifier unit 303 includes a constant current source 502, NMOS transistors 503, 552 to 554, 556, 558, and 560 to 575, a PMOS transistor 555, 557, and 559, and a capacitor 507. The NMOS transistors 552 to 554 and 561 to 575 included in the switch 332 are controlled using a control signal 551 having a sampling phase divided into three of an equal duration. More specifically, the inverting amplifier unit is driven by four PMOS transistors and four NMOS transistors in the phases of φ1 and φ4, by two PMOS transistors and two NMOS transistors in the phases of φ2 and <φ5, and by one PMOS transistor and one NMOS transistor in the phases of φ3 and φ6. In Embodiment 5, the transistors which operate in the phase of φ3 and φ6 (the PMOS transistor 559 and the NMOS transistor 560 in the final stage of a cascade) need not be controlled using a switch because these transistors are driven through all the phases. Thus, FIG. 18 does not show a switch for controlling the transistors. However, the transistors may be controlled using a switch.

FIG. 18 illustrates the sampling phase divided into three subphases as an example. The number of subphases is not limited to the example. The sampling phase may be divided into two subphases or four or more subphases.

Embodiment 6

Figure 19A:
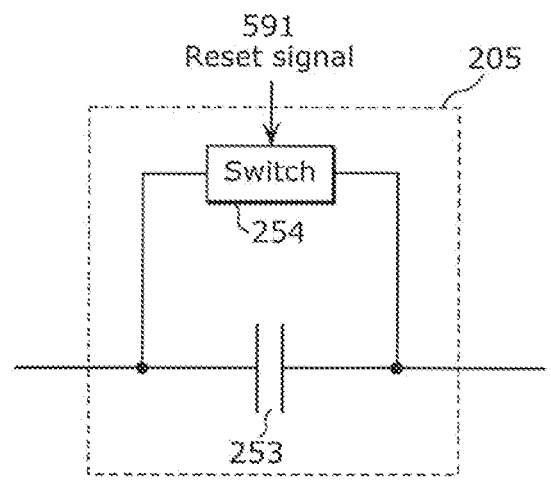
FIG. 19A is a configuration diagram of a storage capacitor unit according to Embodiments 6 and 7.

When the switched capacitor circuit according to any of Embodiments 1 to 4 is applied to an integrator, a storage capacitor unit may be configured as illustrated in FIG. 19A.

FIG. 19A is a configuration diagram of a storage capacitor unit according to Embodiment 6. The storage capacitor unit 205 illustrated in FIG. 19A includes a capacitor 253 and a switch 254 connected in parallel with the capacitor 253. The switch 254 is closed and opened according to a reset signal 591 from the driver unit 209.

Figure 20A:
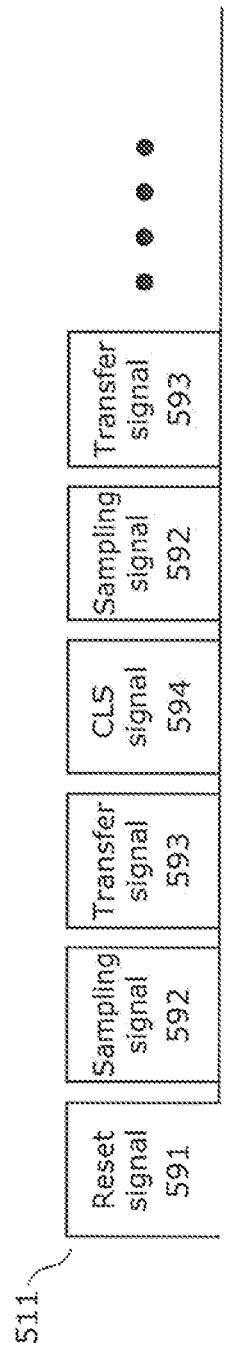
FIG. 20A is a first timing diagram of a control signal according to Embodiment 6.
Figure 21A:
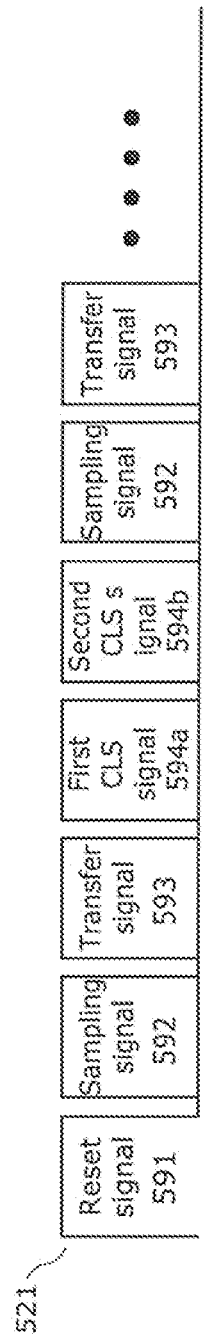
FIG. 21A is a second timing diagram of a control signal according to Embodiment 6.

When the switch 254 is closed while the reset signal 591 is high, and the switch 364 is open while the reset signal 591 is low, the reset signal 591 is activated with timing as illustrated by a timing diagram 511 in FIG. 20A or timing illustrated by a timing diagram 521 in FIG. 21A.

FIG. 20A is a first timing diagram of a control signal according to Embodiment 5. The first timing diagram illustrated in FIG. 20A is applicable to the case where the switched capacitor circuit 200 according to Embodiment 1 is applied to an integrator.

FIG. 21A is a second timing diagram of a control signal according to Embodiment 6. The first timing diagram illustrated in FIG. 21A is applicable to the case where any of the switched capacitor circuit 200 according to Embodiment 2, the switched capacitor circuit 300 according to Embodiment 3, and the switched capacitor circuit 400 according to Embodiment 4 is applied to an integrator.

As illustrated in FIG. 20A and FIG. 21A, the reset signal 591 is turned high only once before starting integration, and subsequently maintained low. The reset signal 591 at a high level initializes the charge of the capacitor 253 to be 0 [C] when the integrator is reset.

Figure 19B:
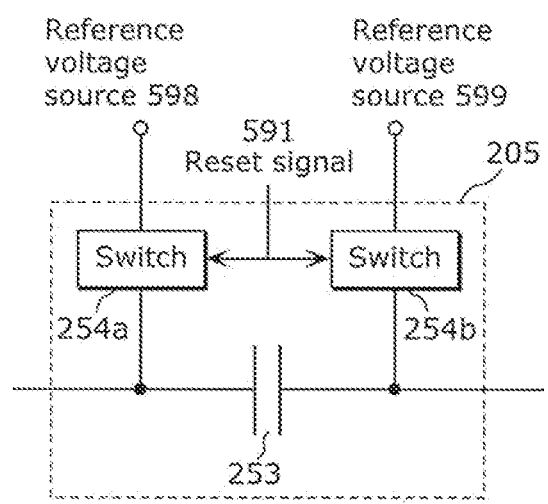
FIG. 19B is a configuration diagram of a storage capacitor unit according to a variation of Embodiment 6 and a variation of Embodiment 7.

When the switched capacitor circuit according to any one of Embodiments 1 to 4 is applied to an integrator, the storage capacitor unit may also be configured as illustrated in FIG. 19B.

FIG. 19B is a configuration diagram of a storage capacitor unit according to a variation of Embodiment 6. The storage capacitor unit 205 illustrated in FIG. 19B includes a capacitor 253, a switch 254a which connects one of the terminal of the capacitor 253 and the reference voltage source 598, a switch 254b which connects the other terminal of the capacitor 253 and a reference voltage source 599. The switches 254a and 254b are each dosed and opened according to the reset signal 591 from the driver unit 209. The reset signal 591 is activated with timing as illustrated by the timing diagram 511 in FIG. 20A or timing as illustrated by the timing diagram 521 in FIG. 21A. The storage capacitor unit 205 has the above-described configuration and the reset signal 591 is activated with the above-described activation timing, so that the voltage of the capacitor 253 is initialized to be a certain voltage determined by the reference voltage sources 598 and 599 when the integrator is reset.

Embodiment 7

When the switched capacitor circuit according to any of Embodiments 1 to 4 is applied to a sample-and-hold circuit, the storage capacitor unit may be configured as illustrated in FIG. 19A.

Figure 21B:
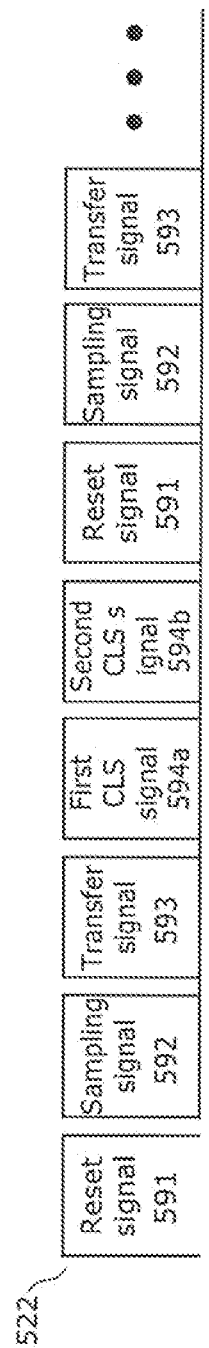
FIG. 21B is a second timing diagram of a control signal according to Embodiment 7.

When the switch 254 is closed while the reset signal 591 is high, and the switch 254 is open while the reset signal 591 is low, the reset signal 591 is activated with timing as illustrated by a timing diagram 512 in FIG. 20S or timing illustrated by a timing diagram 522 in FIG. 21B.

FIG. 20S is a timing diagram of a control signal according to Embodiment 7. The first timing diagram, illustrated in FIG. 20S is applicable to the case where the switched capacitor circuit 200 according to Embodiment 1 is applied to a sample-and-hold circuit.

FIG. 21B is a second timing diagram of a control signal according to Embodiment 7. The first timing diagram illustrated in FIG. 21B is applicable to the case where any of the switched capacitor circuit 200 according to Embodiment 2, the switched capacitor circuit 300 according to Embodiment 3, and the switched capacitor circuit 400 according to Embodiment 4 is applied to a sample-and-hold circuit.

As illustrated in FIGS. 20S and 21B, resetting phases are necessary at the initialization and between the CLS phase and the sampling phase.

When the switched capacitor circuit according to any one of Embodiments 1 to 4 is applied to a sample-and-hold circuit, the storage capacitor unit may also be configured as illustrated in FIG. 19B.

Figure 20B:
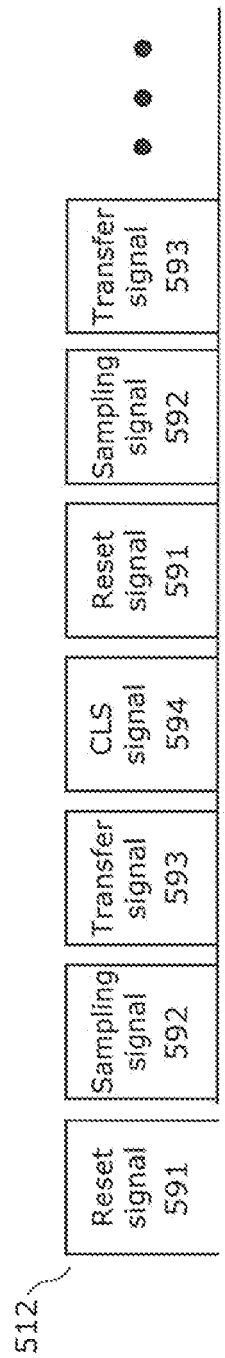
FIG. 20B is a first timing diagram of a control signal according to Embodiment 7.

The switches 254a and 254b are dosed and open according to the reset signal 591 from the driver unit 209. The reset signal 591 is activated with timing as illustrated by the timing diagram 512 in FIG. 20 or timing as illustrated by the timing diagram 522 in FIG. 21B. The storage capacitor unit 205 has the above-described configuration and the reset signal 591 is activated with the above-described activation timing, so that the voltage of the capacitor 253 is initialized to be a certain voltage determined by the reference voltage sources 598 and 599 when the integrator is reset.

Embodiment 8

The following describes a device according to Embodiment 8 which includes any one of the above-described switched capacitor circuit, integrator, and sample-and-hold circuit according to Embodiments 1 to 7.

Figure 22:
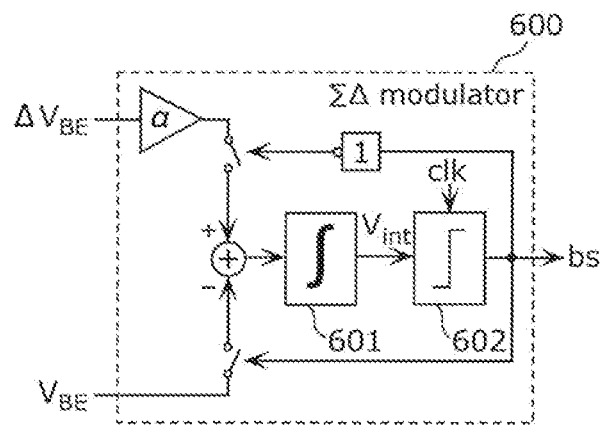
FIG. 22 is a block diagram illustrating a configuration of a $\Delta\Sigma$ modulator including the integrator in the present disclosure.

FIG. 22 is a block diagram showing a configuration of a ΔΣ modulator including the integrator in the present disclosure. The integrator according to Embodiment 6 or the variation thereof is applicable to a ΔΣ modulator 600 illustrated in FIG. 22. The configuration of the ΔΣ modulator disclosed in FIG. 22 is obtained by, for example, replacing an integrator of a ΔΣ modulator disclosed in NPL 3 (M. A. P. Pertijs, et al., "A CMOS Smart Temperature Sensor With a 3σ Inaccuracy of ±0.1° C. From −55° C. to 125° C.," IEEE Journal of Solid-State Circuits, vol. 40, no. 12, pp. 2805 to 2815, December 2005) with the integrator according to the present disclosure. The ΔΣ modulator 600 includes an integrator 601 according to the present disclosure and a clock synchronous comparator 602. The integrator 601 according to the present disclosure operates fast and accurately with a current consumption as low as ever, so that the ΔΣ modulator 600 operates accurately as a whole.

Furthermore, a temperature sensor is provided using an analog-digital (AD) converter including the ΔΣ modulator 600 illustrated in FIG. 22.

Figure 23:
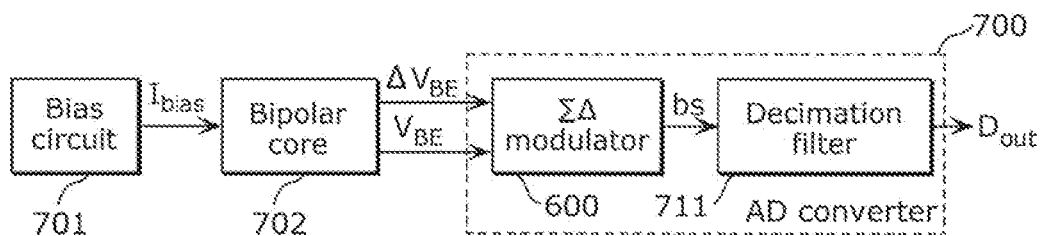
FIG. 23 is a block diagram illustrating a configuration of a sensor circuit including the $\Delta\Sigma$ modulator in the present disclosure.

FIG. 23 is a block diagram showing a configuration of a sensor circuit including a ΔΣ modulator in the present disclosure. The temperature sensor circuit disclosed in FIG. 23 is obtained by replacing the AD converter of the temperature sensor circuit proposed in NPL 3 with an AD converter 700 in the present disclosure. The temperature sensor circuit in FIG. 23 includes an AD converter 700, a bias circuit 701, and a bipolar core 702. The AD converter 700 includes the ΔΣ modulator 600 in the present disclosure and a decimation filter 711. The accuracy of the whole system of the temperature sensor circuit configured as described above depends on the AD converter 700. The temperature sensor circuit to which the AD converter 700 with the integrator 601 including the switched capacitor circuit in the present disclosure is applied operates fast and accurately with a current consumption as low as ever.

Embodiment 9

The following describes an imaging device and a digital camera according to Embodiment 9 including the AD converter according to above-described Embodiment 8. The AD converter 700 illustrated in FIG. 23 is applicable to an imaging device.

Figure 24:
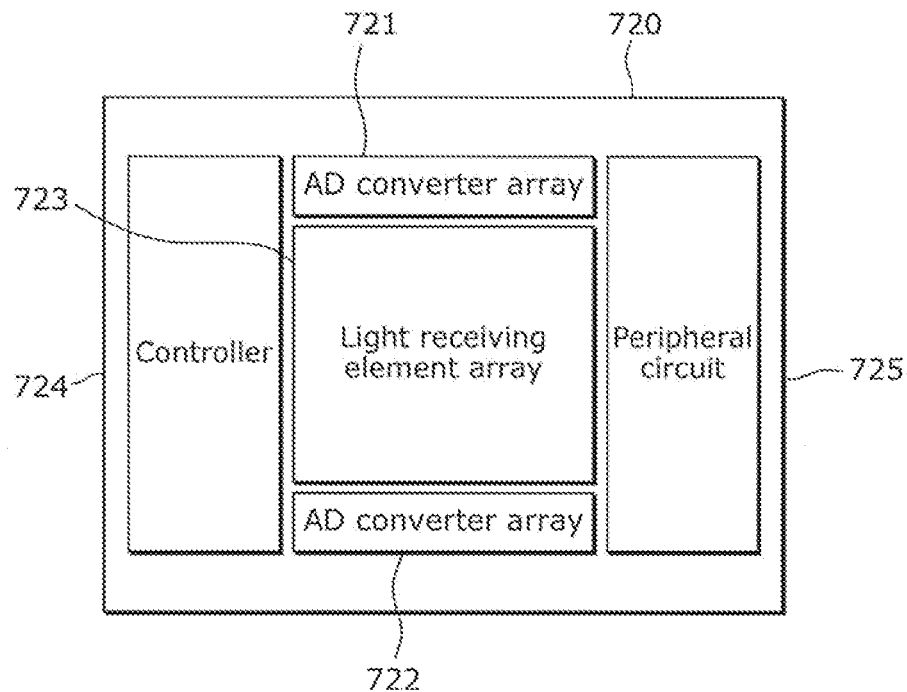
FIG. 24 is a block diagram illustrating a configuration of an imaging device including the AD converter in the present disclosure.

FIG. 24 is a block diagram illustrating a configuration of an imaging device including the AD converter in the present disclosure. FIG. 24 shows an imaging device 720 including AD converter arrays 721 and 722, a light receiving element array 723 in which light-receiving elements are arranged in rows and columns, a controller 724, and a peripheral circuit 725.

Generally, the number of pixels of an imaging device included in a CMOS image sensor depends on sensitivity of light-receiving elements. However, power consumption of the AD converter is also an important factor determining the number of the pixels. A general column-parallel AD converter includes the AD converters arrays 721 and 722 at the top and the bottom of the light receiving element array 723, respectively. Each of the AD converter array 721 and 722 includes AD converters on the order of several thousand units. Thus, the AD converters consume a large amount of power, and heat and battery life are difficulty in increasing of the pixel count.

However, the above-described AD converter 700 reduces current consumption to a level as small as possible. The AD converter 700 thus allows for increase in pixel count, decrease of heat generation, and extension of battery life. The AD converter 700 also contributes to reduction of circuit area. The imaging device to which the AD converter 700 with the integrator including the switched capacitor circuit in the present disclosure is applied operates fast and accurately with a current consumption as low as ever.

Figure 25A:
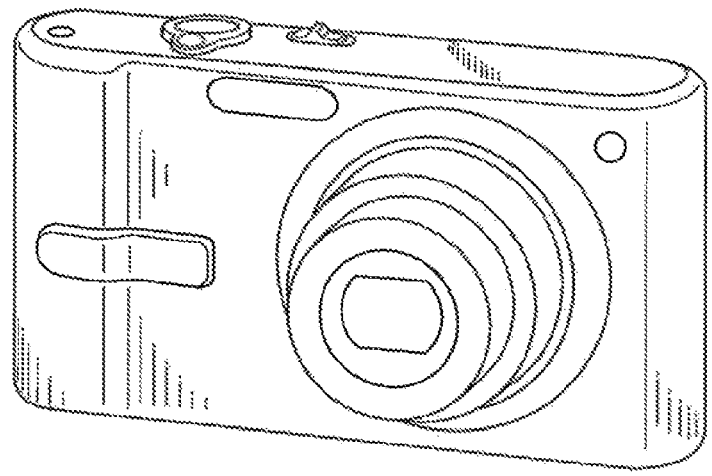
FIG. 25A illustrates an external view of an example of a digital still camera.

Furthermore, the present disclosure may also be implemented as a mobile phone or a digital camera, such as a digital still camera or a digital camcorder, including the imaging device 720. The imaging device 720 is preferably usable as an imaging device of a digital still camera illustrated in FIG. 25A and an imaging device of a camera module for mobile devices such as mobile phones.

Figure 25B:
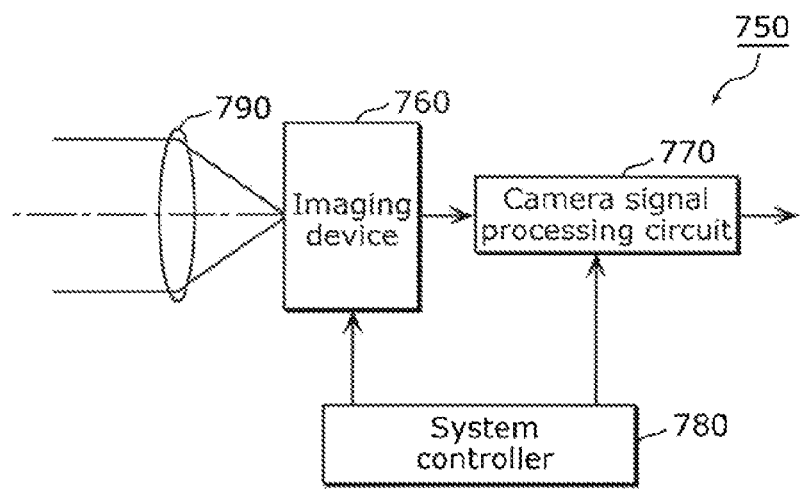
FIG. 25B is a block diagram showing a configuration of a digital camera including the imaging device in the present disclosure.
Figure 26:
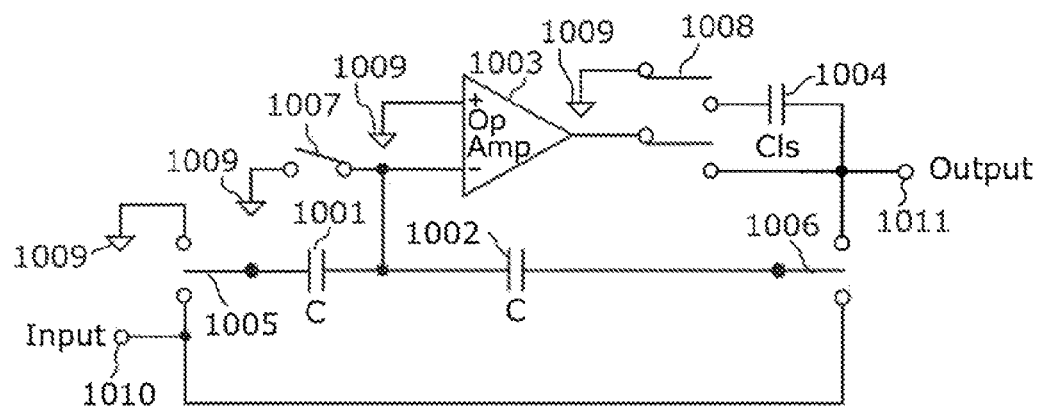
FIG. 26 illustrates a configuration of a conventional switched capacitor circuit disclosed in NPL 2.
Figure 27A:
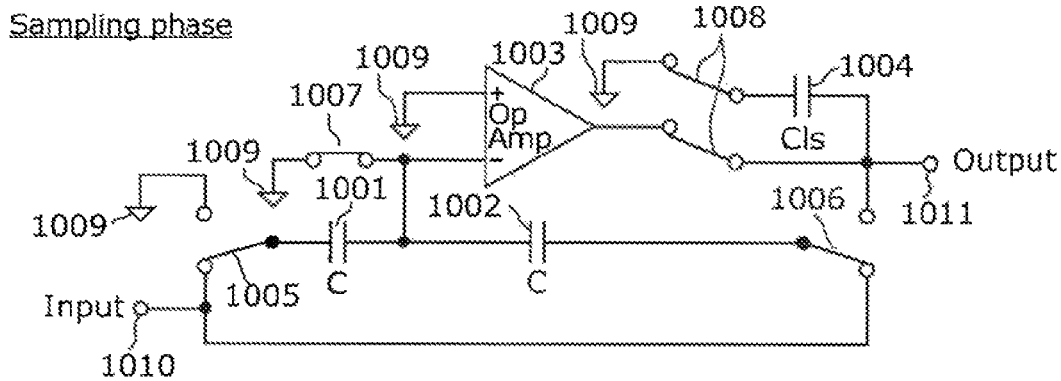
FIG. 27A illustrates connection in the conventional switched capacitor circuit disclosed in NPL 2 in a sampling phase.
Figure 27B:
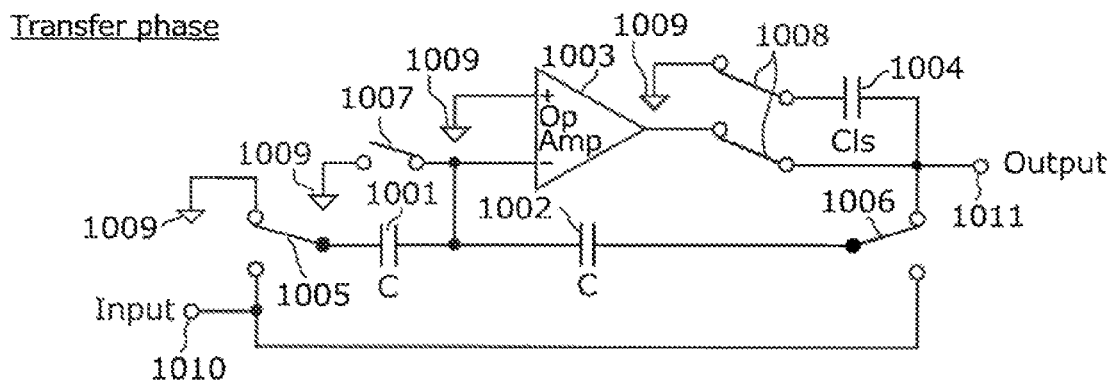
FIG. 27B illustrates connection in the conventional switched capacitor circuit disclosed in NPL 2 in a transfer phase.
Figure 27C:
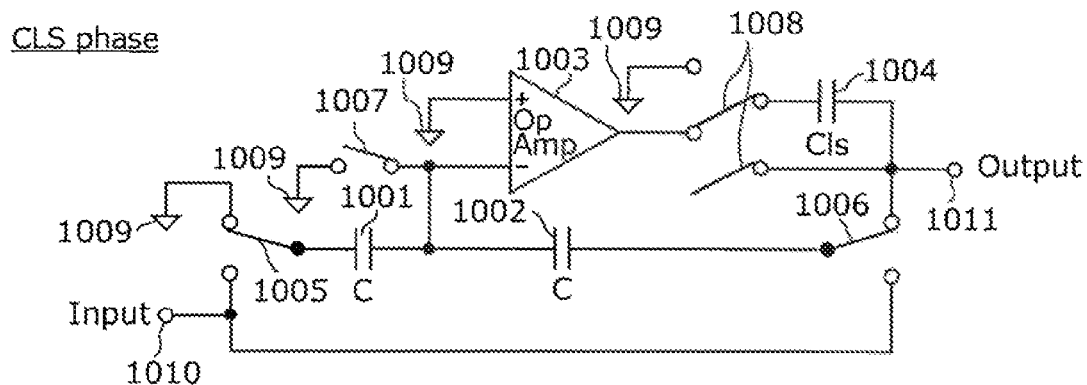
FIG. 27C illustrates connection in the conventional switched capacitor circuit disclosed in NPL 2 in a CLS phase.

FIG. 25B is a block diagram showing a configuration of a digital camera including the imaging device in the present disclosure. FIG. 25B illustrates a digital camera 750 according to Embodiment 9 including an optical system with a lens 790, an imaging device 760, a camera signal processing circuit 770, and a system controller 860. The lens 790 forms an image on the imaging area of the imaging device 760 from image light from an object. The imaging device 760 outputs an image signal obtained by converting light image formed on the imaging area by the lens 790 into electric signals on a per-pixel basis. The imaging device 720 according to Embodiment 9 is used as the imaging device 760.

The camera signal processing circuit 770 performs a variety of processing on the image signals output from the imaging device 760. The system controller 780 controls the imaging device 760 and the camera signal processing circuit 770.

The digital camera 750 in this configuration operates for a longer time with a battery owing to the low current consumption, and operates accurately.

The switched capacitor circuit and the method of driving the switched capacitor circuit, and devices including the switched capacitor circuits have been described according to Embodiments 1 to 9. These embodiments each show a general or specific example, and therefore do not limit the scope of the appended claims and their equivalents.

The AD converter and each processing units included in the imaging device according to the above-described embodiments are typically implemented as one or more system LSIs, which are integrated circuits. These integrated circuits may be separate chips, and some or all of the integrated circuits may be integrated into a single chip.

The method of forming integrated circuits is not limited to use of such LSIs. A dedicated circuit or a general-purpose processor may be used instead. Also applicable is a field programmable gate array (FPGA), which allows post-manufacture programming, or a reconfigurable processor LSI, which allows post-manufacture reconfiguration of connection and setting of circuit cells therein.

All or part of the configuration or function of the switched capacitor circuits, AD converters, and variations thereof according to above-described Embodiments 1 to 9 may be used in combination.

The numerical values shown in the above-described exemplary embodiments are mere examples, and therefore do not limit the scope of the appended claims and their equivalents. The switching states described using high and low are mere examples, and therefore do not limit the scope of the appended claims and their equivalents. A similar result may be obtained by using the switching states in different combinations. The types (such as n-type and p-type) of transistors and others are mere examples, and therefore do not limit the scope of the appended claims and their equivalents. An result equivalent to the above-described ones may be obtained by using transistors and others of the other type. The above-described connection between the constituent elements are mere examples, and therefore do not limit the scope of the appended claims and their equivalents.

The functional blocks in the block diagrams illustrates a mere exemplary division of functions. Two or more of the functional blocks may be implements as a single functional block, and a single functional block may be divided into two or more functional blocks. Part of a function depicted as a single block may be incorporated into another functional block. Optionally, similar functions depicted as plural functional blocks may be performed by a single piece of hardware or software in parallel or by time-sharing.

The MOS transistor used in the above-description as an example may be replaced with a transistor of a different type.

The circuit configurations illustrated in the circuit diagrams are mere examples, and therefore do not limit the scope of the appended claims and their equivalents. Thus, not only the above-described circuit configurations but also any circuit capable of providing the functions characteristic to the present invention is also within the scope of the appended claims and their equivalents. For example, a circuit in a configuration where elements such as a switching element (transistor), a resistor, and capacitors connected in parallel or series with an element is also within the scope of the appended claims and their equivalents to the extent that the circuit provides the functions analogous to the functions of the circuit in the above-described configuration. Specifically, the "connection" in the above-described embodiments refers to not only direct connection of two terminals (nodes) but also connection of the two terminals (nodes) via another element to the extent that the connection allows a circuit to provide functions analogous to the functions of the circuit in the above-described configuration.

The herein disclosed subject matter is to be considered descriptive and illustrative only, and the appended claims are of a scope intended to cover and encompass not only the particular embodiments disclosed, but also equivalent structures, methods, and/or uses.

INDUSTRIAL APPLICABILITY

One or more exemplary embodiments disclosed herein is applicable to AD converters, temperature sensors, imaging devices, digital cameras, batteries, and the like which are required to operate accurately with low power consumption.

The invention claimed is:
1. A switched capacitor circuit comprising:
a first input terminal to which an input voltage is input;
a first output terminal from which an output voltage is output;
a sampling capacitor including a first terminal to which the input voltage is applied and a second terminal;
an inverting amplifier including a second input terminal and a second output terminal, the second input terminal being connected to the second terminal;
a first level-shifting capacitor including a fifth terminal which is a capacitor electrode, a fourth terminal which is another capacitor electrode, and a third terminal which is switchable between being connected to the fifth terminal and being connected to the fourth terminal, the fifth terminal being connected to the first output terminal;
a second level-shifting capacitor including an eighth terminal which is a capacitor electrode, a seventh terminal which is another capacitor electrode, and a sixth terminal which is switchable between being connected to the eighth terminal and being connected to the seventh terminal, the eighth terminal being connected to the third terminal, the sixth terminal being connected to the second output terminal;
a storage capacitor including a ninth terminal and a tenth terminal, the ninth terminal being connected to the second terminal, the tenth terminal being connected to the first output terminal; and an offset compensation circuit including an eleventh terminal which is switchable between being short-circuited with and disconnected from the fourth terminal and the seventh terminal, and outputs an offset voltage from the eleventh terminal, the offset voltage having the same value as a short-circuit voltage of the inverting amplifier with the second input terminal and the second output terminal being short-circuited.

2. The switched capacitor circuit according to claim 1, wherein in a sampling phase:

the inverting amplifier with the second input terminal and the second output terminal being short-circuited generates the short-circuit voltage; and the sampling capacitor samples a potential difference between the input voltage and the short-circuit voltage, and in a transfer phase in which a charge stored in the sampling capacitor is transferred:

disconnection between the second input terminal and the second output terminal causes the charge to be transferred to the storage capacitor; and the first level-shifting capacitor with the third terminal and the fifth terminal being short-circuited and the second level-shifting capacitor with the sixth terminal and the eighth terminal being short-circuited each sample a potential difference between the eleventh terminal and the first output terminal.

3. The switched capacitor circuit according to claim 1 or claim 2, wherein in the level-shifting phase in which a voltage level of the second output terminal shifts, disconnection between the third terminal and the fifth terminal, disconnection between the sixth terminal and the eighth terminal, in-series electrical connection of the first level-shifting capacitor, the third terminal, the fourth terminal, and the fifth terminal, and in-series electrical connection of the second level-shifting capacitor, the sixth terminal, the seventh terminal, and the eighth terminal cause the first level-shifting capacitor and the second level-shifting capacitor to form a series capacitor between the first output terminal and the second output terminal, the first level-shifting capacitor being connected between the fourth terminal and the fifth terminal, the second level-shifting capacitor being connected between the seventh terminal and the eighth terminal.

4. The switched capacitor circuit according to claim 1 or claim 2, wherein the level-shifting phase in which a voltage level of the second output terminal shifts includes a first level-shifting phase and a second level-shifting phase, in the first level-shifting phase, the third terminal and the fifth terminal are disconnected, and the first level-shifting capacitor is electrically connected in series with the third terminal, the fourth terminal, and the fifth terminal, the first level-shifting capacitor being connected between the fourth terminal and the fifth terminal, and in the second level-shifting phase, the sixth terminal and the eighth terminal are disconnected, and the second level-shifting capacitor is electrically connected in series with the sixth terminal, the seventh terminal, and the eighth terminal, the second level-shifting capacitor being connected between the seventh terminal and the eighth terminal.

5. An integrator comprising:

the switched capacitor circuit according to claim 4; and an initialization mechanism which causes a charge stored in the storage capacitor to be released, wherein iterations of an operation cycle from a sampling phase to a transfer phase to a first level-shifting phase to a second level-shifting phase are performed, the transfer phase being a phase in which voltage sampled in the sampling phase is transferred, the first level-shifting phase and the second level-shifting phase each being a phase in which a voltage level of the second output terminal shifts, and the initialization mechanism operates only before an initial one of the iterations is started.

6. A sensor circuit comprising the sample-and-hold circuit according to claim 5.

7. A sample-and-hold circuit comprising:

the switched capacitor circuit according to claim 4; and an initialization mechanism which causes a charge stored in the storage capacitor to be released, wherein iterations of an operation cycle from a sampling phase to a transfer phase to a first level-shifting phase to a second level-shifting phase are performed, the transfer phase being a phase in which voltage sampled in the sampling phase is transferred, the first level-shifting phase and the second level-shifting phase each being a phase in which a voltage level of the second output terminal shifts, and the initialization mechanism operates between the iterations.

8. A sensor circuit comprising the sample-and-hold circuit according to claim 7.

9. An analog-digital converter comprising the sample-and-hold circuit according to claim 5.

10. An imaging device comprising the analog-digital converter according to claim 9.

11. A digital camera comprising the imaging device according to claim 10.

12. An analog-digital converter comprising the sample-and-hold circuit according to claim 7.

13. An imaging device comprising the analog-digital converter according to claim 12.

14. A digital camera comprising the imaging device according to claim 13.

15. A switched capacitor circuit comprising:

a first input terminal to which an input voltage is input;

a first output terminal from which an output voltage is output;

a sampling capacitor including a first terminal to which the input voltage is applied and a second terminal;

a first clamping capacitor including a third terminal and a fourth terminal, the third terminal being connected to the second terminal;

an inverting amplifier including a second input terminal and a second output terminal, the second input terminal being connected to the fourth terminal;

a second clamping capacitor including a fifth terminal and a sixth terminal, the fifth terminal being connected to the second output terminal;

a first level-shifting capacitor including a seventh terminal which is a capacitor electrode and an eighth terminal which is switchable between being connected to the seventh terminal and being connected to another capacitor electrode of the first level-shifting capacitor, the seventh terminal being connected to the first output terminal;

a second level-shifting capacitor including a ninth terminal which is a capacitor electrode and a tenth terminal which is switchable between being connected to the ninth terminal and being connected to another capacitor electrode of the second level-shifting capacitor, the ninth terminal being connected to the eighth terminal, the tenth terminal being switchable between being short-circuited with and being disconnected from the sixth terminal; and a storage capacitor including an eleventh terminal and a twelfth terminal, the eleventh terminal being connected to the second terminal, the twelfth terminal being connected to the first output terminal.

16. The switched capacitor circuit according to claim 15, wherein in a sampling phase:

the inverting amplifier with the second input terminal and the second output terminal being short-circuited generates a short-circuit voltage; and the first clamping capacitor and the second clamping capacitor sample a potential difference between the short-circuit voltage and a reference voltage, in a transfer phase in which a charge stored in the sampling capacitor is transferred:

disconnection between the second input terminal and the second output terminal causes the charge to be transferred to the storage capacitor; and in-series electrical connection of the first clamping capacitor, the second terminal, and the second input terminal, the first clamping capacitor being connected between the second terminal and the second input terminal, an open state of one of the fifth terminal and the sixth terminal of the second clamping capacitor, short-circuit of the seventh terminal and the eighth terminal, and short-circuit of the ninth terminal and the tenth terminal cause the first level-shifting capacitor to sample a potential difference between the reference voltage and a voltage at the first output terminal, in a first level-shifting phase in which a voltage level of the second output terminal shifts:

the second clamping capacitor is electrically connected in series between the second output terminal and the tenth terminal; and the second level-shifting capacitor samples a potential difference between a voltage at the ninth terminal and the reference voltage at a moment when the seventh terminal and the eighth terminal are disconnected and the first level-shifting capacitor is electrically connected in series between the eighth terminal and the first output terminal, and in a second level-shifting phase in which the voltage level of the second output terminal shifts, the ninth terminal and the tenth terminal are disconnected, and the second level-shifting capacitor is electrically connected in series between the ninth terminal and the sixth terminal.

17. The switched capacitor circuit according to claim 15, further comprising a third clamping capacitor including a thirteenth terminal and a fourteenth terminal, the thirteenth terminal being connected to the second output terminal, the fourteenth terminal being switchable between being short-circuited with and being disconnected from the sixth terminal and the tenth terminal.

18. The switched capacitor circuit according to claim 17, wherein in the sampling phase:

the inverting amplifier with the second input terminal and the second output terminal being short-circuited generates the short-circuit voltage; and the first clamping capacitor, the second clamping capacitor, and the third clamping capacitor sample the potential difference between the short-circuit voltage and a reference voltage, in the transfer phase in which the charge stored in the sampling capacitor is transferred:

disconnection between the second input terminal and the second output terminal causes the charge to be transferred to the storage capacitor; and in-series electrical connection of the first clamping capacitor, the second terminal, and the second input terminal, the first clamping capacitor being connected between the second terminal and the second input terminal, an open state of one of the fifth terminal and the sixth terminal of the second clamping capacitor, an open state of one of the thirteenth terminal and the fourteenth terminal of the third clamping capacitor, short-circuit of the seventh terminal and the eighth terminal, and short-circuit of the ninth terminal and the tenth terminal cause the first level-shifting capacitor to sample the potential difference between the reference voltage and the voltage at the first output terminal, in the first level-shifting phase in which the voltage level of the second output terminal shifts:

the second clamping capacitor is electrically connected in series between the second output terminal and the tenth terminal; and the second level-shifting capacitor samples the potential difference between the voltage at the ninth terminal and the reference voltage at a moment when the seventh terminal and the eighth terminal are disconnected and the first level-shifting capacitor is electrically connected in series between the eighth terminal and the first output terminal, and in the second level-shifting phase in which the voltage level of the second output terminal shifts:

one of the fifth terminal and the sixth terminal of the second clamping capacitor is open;

the third clamping capacitor is electrically connected in series between the second output terminal and the tenth terminal; and the seventh terminal and the eighth terminal are disconnected, and the second level-shifting capacitor is electrically connected in series between the ninth terminal and the sixth terminal.

19. The switched capacitor circuit according to claim 1 or claim 15, wherein the inverting amplifier includes an inverter circuit.

20. The switched capacitor circuit according to claim 19, wherein the inverter circuit includes a switched-current bias circuit.

21. The switched capacitor circuit according to claim 19, wherein the inverter circuit is a circuit which operates with a dynamic current.

22. An integrator comprising:

the switched capacitor circuit according to claim 1 or claim 2; and an initialization mechanism which causes a charge stored in the storage capacitor to be released, wherein iterations of an operation cycle from a sampling phase to a transfer phase to a level-shifting phase are performed, the transfer phase being a phase in which voltage sampled in the sampling phase is transferred, the level-shifting phase being a phase in which a voltage level of the second output terminal shifts, and the initialization mechanism operates only before an initial one of the iterations is started.

23. A sensor circuit comprising
the sample-and-hold circuit according to claim 22.

24. An analog-digital converter comprising
the sample-and-hold circuit according to claim 22.

25. An imaging device comprising
the analog-digital converter according to claim 24.

26. A digital camera comprising
the imaging device according to claim 25.

27. An integrator comprising:
the switched capacitor circuit according to claim 15; and
an initialization mechanism which causes a charge stored in the storage capacitor to be released,
wherein iterations of an operation cycle from a sampling phase to a transfer phase to a first level-shifting phase to a second level-shifting phase are performed, the transfer phase being a phase in which voltage sampled in the sampling phase is transferred, the first level-shifting phase and the second level-shifting phase each being a phase in which a voltage level of the second output terminal shifts, and
the initialization mechanism operates only before an initial one of the iterations is started.

28. A sensor circuit comprising
the sample-and-hold circuit according to claim 27.

29. An analog-digital converter comprising
the sample-and-hold circuit according to claim 27.

30. An imaging device comprising
the analog-digital converter according to claim 29.

31. A digital camera comprising
the imaging device according to claim 30.

32. A method of driving a switched capacitor circuit which converts a voltage level of an input voltage input through an input voltage terminal and outputs a voltage obtained by the converting of the voltage level through an output voltage terminal, the method comprising:

when an electrical path including a storage capacitor provided between a sampling capacitor to which the input voltage is applicable and the output voltage terminal is broken, sampling, using the sampling capacitor, a potential difference between the input voltage and a short-circuit voltage of an inverting amplifier with an input terminal and an output terminal being short-circuited;

subsequently, (1) disconnecting the input terminal and the output terminal of the inverting amplifier and making the electrical path to transfer a charge in the sampling capacitor to the storage capacitor, and (2) connecting a first terminal of a first level-shifting capacitor and a first terminal of a second level-shifting capacitor to the output terminal of the inverting amplifier, and connecting a second terminal of the first level-shifting capacitor and a second terminal of the second level-shifting capacitor to an offset compensation circuit outputting the short-circuit voltage, to sample a potential difference between the output voltage terminal and the offset compensation circuit; and subsequently, without breaking the electrical path, (1) connecting the output voltage terminal and the first terminal of the second level-shifting capacitor, disconnecting the second terminal of the second level-shifting capacitor and the offset compensation circuit, and connecting the second terminal of the second level-shifting capacitor and the first terminal of the second level-shifting capacitor, and (2) disconnecting the second terminal of the second level-shifting capacitor and the offset compensation circuit, and connecting the second terminal of the second level-shifting capacitor and the output terminal of the inverting amplifier, to shift a level of a voltage at the output terminal of the inverting amplifier.

33. A method of driving a switched capacitor circuit which converts a voltage level of an input voltage input through an input voltage terminal and outputs a voltage obtained by the converting of the voltage level through an output voltage terminal, the method comprising:

when an electrical path including a storage capacitor provided between a sampling capacitor to which the input voltage is applicable and the output voltage terminal is broken, sampling, using the sampling capacitor, a potential difference between the input voltage and a short-circuit voltage of the inverting amplifier with an input terminal and an output terminal being short-circuited;

subsequently, (1) disconnecting the input terminal and the output terminal of the inverting amplifier and making the electrical path to transfer a charge in the sampling capacitor to the storage capacitor, and (2) connecting a first terminal of a first level-shifting capacitor and a first terminal of the second level-shifting capacitor to the output terminal of the inverting amplifier, and connecting a second terminal of the first level-shifting capacitor and a second terminal of the second level-shifting capacitor to an offset compensation circuit outputting the short-circuit voltage, to sample a potential difference between the output voltage terminal and the offset compensation circuit;

subsequently, without breaking the electrical path, disconnecting the second terminal of the first level-shifting capacitor and the offset compensation circuit, and electrically connecting the first level-shifting capacitor in series between the output voltage terminal and the output terminal of the inverting amplifier, to shift a level of a voltage at the output terminal of the inverting amplifier; and subsequently, without breaking the electrical path, disconnecting the second terminal of the second level-shifting capacitor and the offset compensation circuit, and electrically connecting the second level-shifting capacitor in series between the second terminal of the first level-shifting capacitor and the output terminal of the inverting amplifier, to shift the level of the voltage at the output terminal of the inverting amplifier.

34. A method of driving a switched capacitor circuit which converts a voltage level of an input voltage input through an input voltage terminal and outputs a voltage obtained by the converting of the voltage level through an output voltage terminal, the method comprising:

when (1) terminals of a first level-shifting capacitor for shifting a level of a voltage at an output terminal of an inverting amplifier and terminals of a second level-shifting capacitor for shifting the level of the voltage at the output terminal of the inverting amplifier are short-circuited, the first level-shifting capacitor being connected to the output voltage terminal, and (2) an electrical path between a sampling capacitor to which the input voltage is applicable and the output voltage terminal via a storage capacitor is broken, sampling a potential difference between the input voltage and a reference voltage using the sampling capacitor, and sampling, using a first clamping capacitor and a second clamping capacitor individually, a potential difference between the reference voltage and a short-circuit voltage of the inverting amplifier with an input terminal and the output terminal being short-circuited;

subsequently, setting a voltage at one of two terminals of the sampling capacitor to the reference voltage, electrically connecting the first clamping capacitor in series between the input terminal of the inverting amplifier and another of the two terminals of the sampling capacitor, and making the electrical path, to transfer a charge in the sampling capacitor to the storage capacitor and cause each of the first level-shifting capacitor and the second level-shifting capacitor to hold a potential difference between the reference voltage and the voltage at the output terminal of the inverting amplifier, the one of the two terminals of the sampling capacitor being a terminal to which the input voltage is applicable;

subsequently, disconnecting a second terminal of the first level-shifting capacitor and the reference voltage terminal, and electrically connecting the first level-shifting capacitor in series between the output voltage terminal and a terminal of the second clamping capacitor, to shift the level of the voltage at the output terminal of the inverting amplifier; and subsequently, disconnecting a second terminal of the second level-shifting capacitor and the reference voltage terminal, and electrically connecting the second level-shifting capacitor in series between the second terminal of the first level-shifting capacitor and the terminal of the second clamping capacitor, to shift the level of the voltage at the output terminal of the inverting amplifier.

35. A method of driving a switched capacitor circuit which converts a voltage level of an input voltage input through an input voltage terminal and outputs a voltage obtained by the converting of the voltage level through an output voltage terminal, the method comprising:

when (1) terminals of a first level-shifting capacitor for shifting a level of a voltage at an output terminal of an inverting amplifier and terminals of a second level-shifting capacitor for shifting the level of the voltage at the output terminal of the inverting amplifier are short-circuited, the first level-shifting capacitor being connected to the output voltage terminal, and (2) an electrical path between a sampling capacitor to which the input voltage is applicable and the output voltage terminal via a storage capacitor is broken, sampling a potential difference between the input voltage and a reference voltage using the sampling capacitor, and sampling, using a first clamping capacitor, a second clamping capacitor, and a third clamping capacitor individually, a potential difference between the reference voltage and a short-circuit voltage of the inverting amplifier with an input terminal and the output terminal being short-circuited;

subsequently, setting a voltage at one of two terminals of the sampling capacitor to the reference voltage, electrically connecting the first clamping capacitor in series between the input terminal of the inverting amplifier and another of the two terminals of the sampling capacitor, and making the electrical path, to transfer a charge in the sampling capacitor to the storage capacitor and cause each of the first level-shifting capacitor and the second level-shifting capacitor to hold a potential difference between the reference voltage and the voltage at the output terminal of the inverting amplifier, the one of the two terminals of the sampling capacitor being a terminal to which the input voltage is applicable;

subsequently, disconnecting a second terminal of the first level-shifting capacitor and the reference voltage terminal, and electrically connecting the first level-shifting capacitor in series between the output voltage terminal and a terminal of the second clamping capacitor, to shift the level of the voltage at the output terminal of the inverting amplifier; and subsequently, disconnecting a second terminal of the second level-shifting capacitor and the reference voltage terminal, and electrically connecting the second level-shifting capacitor in series between the second terminal of the first level-shifting capacitor and a terminal of the third clamping capacitor, to shift the level of the voltage at the output terminal of the inverting amplifier.

* * * * *